(12) United States Patent
Voogel et al.

(10) Patent No.: US 9,276,572 B2
(45) Date of Patent: *Mar. 1, 2016

(54) CONFIGURATION CONTEXT SWITCHER WITH A LATCH

(71) Applicant: Altera Corporation, San Jose, CA (US)

(72) Inventors: Martin Voogel, Los Altos, CA (US); Jason Redgrave, Mountain View, CA (US); Trevis Chandler, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/599,738

(22) Filed: Jan. 19, 2015

(65) Prior Publication Data

US 2015/0207504 A1    Jul. 23, 2015

Related U.S. Application Data

(63) Continuation of application No. 13/666,211, filed on Nov. 1, 2012, now Pat. No. 8,970,250, which is a continuation of application No. 13/089,265, filed on Apr. 18, 2011, now Pat. No. 8,324,931, which is a continuation of application No. 12/206,718, filed on Sep. 8, 2008, now Pat. No. 7,928,761.

(60) Provisional application No. 60/970,504, filed on Sep. 6, 2007.

(51) Int. Cl.
*H03K 19/00* (2006.01)
*H03K 3/037* (2006.01)
*H03K 19/177* (2006.01)
*G06F 15/78* (2006.01)
*G11C 7/10* (2006.01)

(52) U.S. Cl.
CPC ........ *H03K 19/0008* (2013.01); *G06F 15/7867* (2013.01); *G11C 7/1045* (2013.01); *H03K 3/0372* (2013.01); *H03K 19/17732* (2013.01); *H03K 19/17748* (2013.01); *H03K 19/17752* (2013.01); *H03K 19/17768* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01)

(58) Field of Classification Search
CPC ................. H03K 19/17736; H03K 19/17728; H03K 19/1776; H03K 19/1773; H03K 19/17796
USPC .......... 326/37–41, 47; 716/116; 327/564–566
See application file for complete search history.

(56) References Cited

U.S. PATENT DOCUMENTS

| | | | | |
|---|---|---|---|---|
| 5,760,602 A * | 6/1998 | Tan | ................................ | 326/38 |
| 6,150,838 A * | 11/2000 | Wittig et al. | .................... | 326/39 |
| 6,292,019 B1 * | 9/2001 | New et al. | ........................ | 326/41 |
| 7,825,685 B2 * | 11/2010 | Chandler et al. | ................ | 326/38 |
| 7,928,761 B2 * | 4/2011 | Voogel et al. | ................... | 326/38 |
| 8,324,931 B2 * | 12/2012 | Voogel et al. | ................... | 326/38 |

* cited by examiner

*Primary Examiner* — Dylan White

(57) ABSTRACT

Some embodiments provide an IC with configuration context switchers. The IC includes several configurable circuits, each of which configurably performs one of several operations at any given time, based on the configuration data set that it receives at that time. The IC includes several storage circuits for storing several configuration data sets for each of the configurable circuits. The IC also includes a context switching interconnect circuit for switchably connecting the configurable circuit to different sets of storage circuits to receive different sets of configuration data sets. The context switcher includes one or more stages for re-timing the data coming from the configuration storage elements. The stages can include interconnect circuitry or storage circuitry. Some embodiments build one of the stages in the configuration data storage elements. Some embodiments encode the configuration data bits and hence utilize a decoder in the context switcher to decode the encoded configuration data.

19 Claims, 69 Drawing Sheets

CONFIGURATION CONTEXT SWITCHER WITH A LATCH

CLAIM OF BENEFIT TO PRIOR APPLICATIONS

This Application is a continuation application of U.S. patent application Ser. No. 13/666,211, filed Nov. 1, 2012, now published as U.S. Publication 2013/0162291. U.S. patent application Ser. No. 13/666,211 is a continuation application of U.S. patent application Ser. No. 13/089,265, filed Apr. 18, 2011, now issued as U.S. Pat. No. 8,324,931. U.S. patent application Ser. No. 13/089,265 is a continuation application of Ser. No. 12/206,718, filed Sep. 8, 2008, now issued as U.S. Pat. No. 7,928,761. U.S. patent application Ser. No. 12/206,718 claims the benefit of U.S. Provisional Patent Application 60/970,504, filed Sep. 6, 2007. U.S. patent application Ser. No. 13/666,211, now published as U.S. Publication 2013/0162291, U.S. Pat. No. 8,324,931, U.S. Pat. No. 7,928,761, and U.S. Provisional Patent Application 60/970,504 are incorporated herein by reference.

FIELD OF THE INVENTION

The invention relates to configurable integrated circuits (ICs). More particularly, this invention relates to a configuration cycle data decoder and synchronization circuit.

BACKGROUND

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit (IC) that has configurable circuits. A configurable circuit receives a configuration data set that specifies the operation that the configurable circuit has to perform within the set of operations it is capable of performing. In some embodiments, the IC is a reconfigurable IC, meaning that the reconfigurable IC may receive and react to configuration data on a sub-cycle basis. In some embodiments, configuration data is generated outside of the configurable IC. In these embodiments, a set of software tools typically converts a high-level IC design (e.g., a hardware description language design) into a set of configuration data bits that can configure the configurable IC (or more accurately, the configurable IC's configurable circuits) to implement the IC design.

Configurable integrated circuits (ICs) require a method by which configuration data stored within random access memory (RAM) is retrieved from the RAM and supplied to the proper configurable circuits of the IC. In some embodiments, the RAM is static random access memory (SRAM). Usually, one set of configuration data is used for each configurable circuit. Run-time reconfigurable circuits are configurable circuits that can cycle through multiple configuration data sets during run-time. For such reconfigurable circuits, it's beneficial to be able to efficiently retrieve, decode and synchronize configuration data.

Typically, configurable ICs utilize a dual ported RAM that allows for reads and writes to occur through separate ports of the RAM. Alternatively, the dual ported RAM can be used to provide configuration data at odd cycles of a clock on one port and alternatively provide configuration data at even cycles on a different port. Such use of the dual ported RAM introduces additional circuit complexity, such as multiplexers and configuration values to control the multiplexer in alternatively switching between the odd and even cycles.

Furthermore, typical configurable ICs include sense amplifiers and latches in conjunction with the dual ported RAM to capture the read data and stabilize the data from the RAM before supplying the configuration data to the proper configurable circuits. However, to do so, the sense amplifiers require some type of clock signal or timing signal to coincide with the capturing of the read data from the RAM. A register coupled to the sense amplifier captures the data allowing the next read to occur while new data is output from the RAM.

Attempts to reduce the size of such configuration data supplying circuitry include tradeoffs that ultimately have yielded minimal performance gain in either configuration setup time or resources used. As an example, the size of the RAM cell itself may be reduced to allow greater density of RAM cells on the configurable IC.

Therefore, a need exists to simplify the overall circuit complexity for reading, decoding, synchronizing, and storing configuration data. Such a circuit should optimally store configuration data and optimally supply such data to the configurable logic of the IC, while leaving a minimal footprint on the overall IC design and using minimal power.

SUMMARY OF THE INVENTION

Some embodiments of the invention provide an integrated circuit ("IC") with configuration context switchers. The IC includes several configurable circuits, each of which configurably performs one of a plurality of operations at any given time, based on the configuration data set that it receives at that time. The IC includes several storage circuits for storing a plurality of configuration data sets for each of the configurable circuits. The IC also includes a context switching interconnect circuit (also referred to below as a context switcher) for switchably connecting the configurable circuit to different sets of storage circuits to receive different sets of configuration data sets.

Different embodiments of the invention provide different context switchers for retrieving configuration data from configuration data storage elements (e.g., SRAM cells) and supplying the retrieved data to a configurable circuit (e.g., configurable interconnect circuit or configurable logic circuit) of an IC. The context switcher of some embodiments includes one or more stages for re-timing the data coming from the configuration storage elements. These stages are different in different embodiments. They can simply include interconnect circuitry (e.g., multiplexing circuitry), or they can include storage circuitry (e.g., latches or registers). Some embodiments build one of the stages in the configuration data storage elements. Also, some embodiments encode the configuration data bits and hence utilize a decoder in the context switcher to decode the encoded configuration data that is retrieved from the configuration storage elements. As further described below, different embodiments place the decoder in different places of a multi-stage context switcher.

More specifically, the context switcher of some embodiments includes a set of clocked storage circuits that (1) receives different configuration data sets from different sets of configuration storage circuits at different instances in time and (2) temporarily stores each received configuration data set before providing the received configuration data set to the configurable circuit. The context switcher of other embodiments includes a set of transparent latches that behave similarly. Specifically, the set of latches (1) receives different configuration data sets from different sets of configuration storage circuits at different instances in time and (2) temporarily stores each received configuration data set before providing the received configuration data set to the configurable circuit.

A context switcher that can switchably connect to different sets of configuration storage circuits can provide different sets of configuration data sets to the configurable circuit, in order to allow the configurable circuit to reconfigure while the IC is operating. In some embodiments, the context switcher can "loop" through several (e.g., four, six, eight, etc.) configuration data sets (i.e., by changing its connections to the configuration storage circuits based on a particular looping pattern) at a particular rate, so that the configurable circuit can potentially reconfigure its operation at that rate.

In some embodiments, the set of latches or the set of clocked storage circuits are organized into a master circuit set and a slave circuit set. The master circuit set receives different configuration data sets from different sets of configuration storage circuits at different instances in time, and temporarily stores each received particular configuration data set before providing the received particular configuration data set to the slave circuit set. The slave circuit set then receives different configuration data sets from the master set at different instances in time, and provides each received particular configuration data set to the configurable circuit. In this manner, the master circuit set captures the data and the slave circuit set re-times and synchronizes the data.

The clocked storage circuit of some embodiments includes a storage cell that stores configuration data. In some embodiments, the clocked storage circuit receives a clock signal that in a first state enables the storage cell to receive configuration data that the storage circuit receives, and in a second state causes the storage cell to maintain and store the configuration data that the storage cell received while the clock was in the first state. The storage cell can maintain the stored configuration data for a period of time even when the input to the storage circuit changes. In some embodiments, the clock signal enables at least one transistor that connects the storage cell to a power state (e.g., ground). Instead of using a clock signal, some embodiments employ a pulse signal, which may be derived from a clock signal.

The set of latches of some embodiments include latches that are not clocked latches, but rather are controlled by enable signals. In some embodiments, the enable signals are stored as configuration data (e.g., are data defined and loaded as part of the configuration bit stream) and hence retrieved from configuration storage elements. In other embodiments, the enable signals are derived from configuration data retrieved from configuration storage elements, or from other data. In yet other embodiments, the set of latches includes at least one latch that is controlled by clock signals. In still other embodiments, the set of latches includes a set of data toggled circuits that toggle the latches storage operation based on the configuration data that the context switcher routes through the set of latches to the configurable circuit. The set of toggle circuits of some embodiments are active only on one changing edge of the configuration data.

Different embodiments of the invention read and supply the configuration data differently from the configuration storage elements. For instance, from the configuration data storage element, some embodiments read each logical configuration data bit as a single physical bit, while other embodiments read each logical configuration data bit as a pair of complementary physical bits. The context switcher of some embodiments might route and store each logical configuration data bit as a single physical bit or as a pair of complementary physical bit.

Some embodiments of the invention read the configuration data directly from the storage node of a configuration storage circuit. To do this, these embodiments have a direct connection that directly connects the context switcher with one or more of the internal storage nodes of the configuration storage circuit. For instance, the direct connection in some embodiments is implemented as a single physical connection that connects the context switcher to just one of two storage nodes of an SRAM storage cell (e.g., an output node of one of two cross-coupled inverters), while the direct connection in other embodiments is implemented as a pair of physical connections that connect the context switcher to both storage nodes of the SRAM cell (e.g., to both output nodes of the cross-coupled pair of inverters). In either of these cases, the direct connection is a connection that does not traverse any other controllable interconnect circuit. In some embodiments, the direct connection can only include conductive interconnect segments and/or vias. In other embodiments, the direct connection can also include buffer circuits (e.g., inverters).

In some embodiments, the direct connection is received by a single input line of an interconnect circuit of the context switcher. This input line may be implemented as a single physical bit line or a differential pair of bit lines. The interconnect circuit has one or more other inputs that also directly connect to the internal storage nodes of one or more other storage circuits. The interconnect circuit then can controllably switch between different inputs to provide the configuration data values appearing on these inputs along the interconnect circuit's output, which again can be implemented as a single physical bit line or a pair of differential bit lines. In some embodiments, the interconnect circuit switches between different inputs at a particular rate, so that the context switcher can provide different configuration data sets to the configurable circuit at the particular periodic rate.

Some embodiments of the invention store configuration data in the configuration storage circuits in an encoded manner. Storing encoded configuration data reduces the number of storage elements (e.g., SRAM cells) need to store the configuration data for a configurable circuit. To generate the encoded configuration data, some embodiments use several design automation processes (such as synthesis, placement, routing, etc.) to first define an unencoded configuration bit stream, and then encode the configuration bit stream using standard encode techniques (e.g., NAND or NOR encoding). Other embodiments, however, might encode the configuration data while the configuration bit stream is being defined for different parts of the design. For example, some embodiments encode the configuration bit stream by performing an encoding operation after defining each configuration data set for each configurable circuit (e.g., after defining each configuration data set for each configurable logic circuit or routing circuit in a placement or routing operation). Other embodiments perform the encoding operation after each design automation operation is performed (e.g., encode the bit stream once after placement, once after routing, etc.). Yet other embodiments specify encoded configuration values (e.g., encoded 2 bit values instead of non-encoded 4 bit values) from the start as part of identifying configuration data, without first generating unencoded configuration data values.

Once the encoded configuration bit stream is generated, some embodiments store the encoded configuration bit stream in a data storage. This configuration bit stream can then be stored in a memory that is within the same IC, on the same board as the IC, or in the same device as the IC. In some embodiments, the memory is a non-volatile memory (e.g., flash memory) from which the configuration data is later on loaded at power up within the configuration storage elements of the configurable circuits of the IC.

The context switcher of some embodiments includes a decoder to decode the encoded configuration data that it retrieves for a configurable circuit from a set of configuration storage circuits. Different embodiments position the decoder in different locations of the context switcher. Specifically, the decoder can come after multiple storage and/or interconnect stages of the context switcher, or it can be inserted somewhere in between these stages or in some cases (e.g., when master/slave storage elements are used) it can be inserted above the two stages. For instance, in some embodiments, the context switcher includes at least one set of storage circuits that (1) receives a configuration data set and (2) temporarily stores the received configuration data set. The context switcher's storage circuit set receives the configuration data set from the configuration storage circuit and provides the received encoded configuration data set to the decoder in some embodiments. In other embodiments, the context switcher's storage circuit set receives decoded configuration data from the decoder and supplies this decoded configuration data to another stage or to the configurable circuit.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., master latches) referred to below. In other instances, well-known structures and devices are shown in block diagram form in order not to obscure the description of the invention with unnecessary detail.

I. Overview

Different embodiments of the invention provide different context switchers for retrieving configuration data from configuration data storage elements (e.g., SRAM cells) and supplying the retrieved data to a configurable circuit (e.g., configurable interconnect circuit or configurable logic circuit) of an IC. In some embodiments, the context switching circuitry re-times the data coming from the configuration storage elements.

Figure 1:
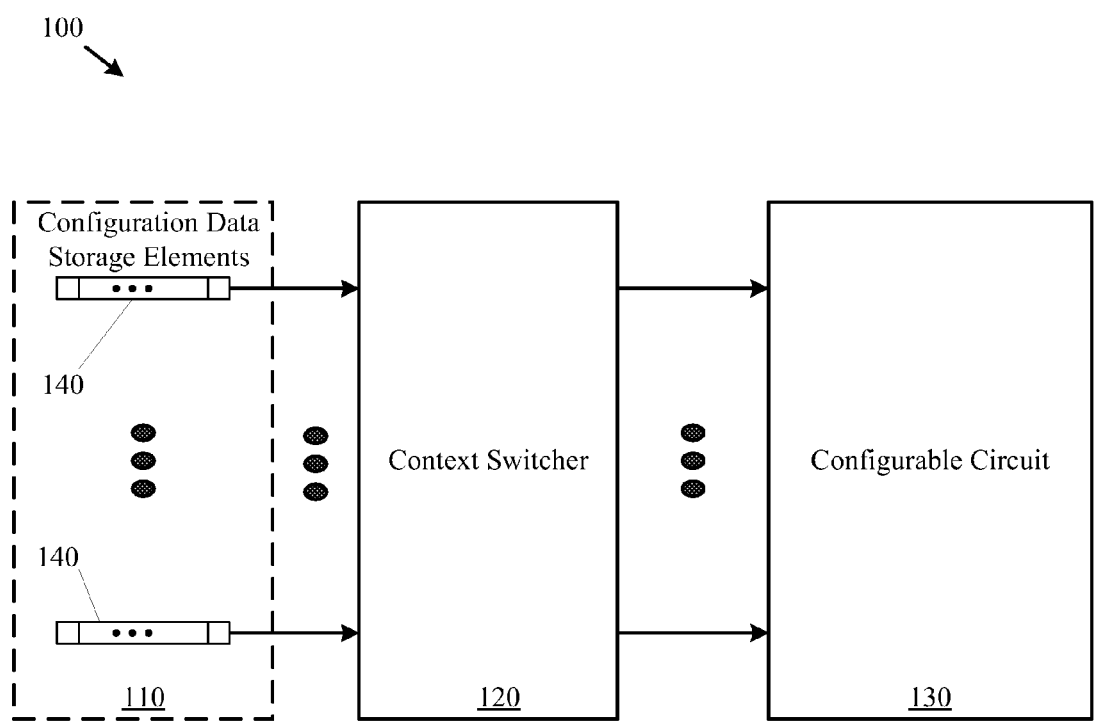
FIG. 1 illustrates a context switcher that is operating within the context of an integrated circuit (IC) of some embodiments.

FIG. 1 illustrates an example of an IC 100 with a context switcher 120. As shown, the IC includes a set 110 of configuration data storage elements 140, a context switcher 120, and a runtime reconfigurable circuit 130. The configuration data storage elements 140 store several configuration data sets for the reconfigurable circuit 130, which may be a reconfigurable logic circuit (e.g., a LUT) or a reconfigurable interconnect circuit (e.g., a routing multiplexer or input-select multiplexer for the logic circuit). The context switcher 120 switchably connects to different configuration data storage sets 140. Whenever desired (e.g., at a periodic rate), the context switcher 120 switches to a new set of configuration data storage elements, retrieves the configuration data stored in this set, and provides the retrieved configuration data set to the reconfigurable circuit. When the provided configuration data set is different than the configuration data set that the context switcher was previously providing to the reconfigurable circuit, the new configuration data set can "reconfigure" the reconfigurable circuit to perform a new operation from the set of operations that it can configurably perform.

The context switcher of some embodiments includes one or more stages. These stages are different in different embodiments. They can simply include interconnect circuitry (e.g., multiplexing circuitry), or they can include storage circuitry (e.g., latches or registers). Some embodiments build one of the stages in the configuration data storage elements. Also, some embodiments encode the configuration data bits and hence utilize a decoder in the context switcher to decode the encoded configuration data that is retrieved from the configuration storage elements. As further described below, different embodiments place the decoder in different places of a multi-stage context switcher.

Several more detailed embodiments of the invention are described in the sections below. Section II describes several different examples of configuration data storage elements that are used in several different embodiments of the invention. This discussion is followed by the discussion in Section III of several different components that can be used to form a single-stage or a two-stage context switcher. Section III.A presents different embodiments of a first stage of the context switcher. Section III.B describes different embodiments of a second stage of the context switcher. That discussion is followed by Section III.C, which describes circuit combinations which implement the first two stages of the context switcher. Next, Section III.D describes the decoder used in some embodiments of the context switcher. This discussion is followed by the discussion in Section III.E of the various different arrangements and embodiments of the decoder and the second stage of a context switcher. Section III.F details a number of exemplary circuits combining appropriate storage elements with different embodiments of the context switcher. Section IV describes the architecture of some embodiments of a configurable IC. Section V describes the encoding of the configuration data used to configure the configurable IC.

However, before describing these more detailed embodiments, several definitions and an overview will now be provided.

Several figures below illustrate direct connections between circuits in a configurable circuit arrangement. A direct connection between two circuits in an arrangement can be implemented differently in different embodiments. A direct connection in some embodiments is an electrical connection between the two circuits that is achieved only by (1) a set of wire segments that traverse through a set of the wiring layers of the IC, (2) a set of vias when two or more wiring layers are involved. In addition to sets of wire segments and vias, a direct connection in other embodiments can also include a set of intervening buffer circuits (e.g., inverters) but no other intervening circuits (such as intervening controllable interconnect circuits or pass transistors). As used in this document, a set of elements can include only one element or more than one element.

The context switchers of some embodiments are used in ICs with runtime reconfigurable circuits. In some such embodiments, the context switcher can retrieve different configuration data sets from different sets of configuration storage elements in different reconfiguration cycles and supply each retrieved configuration data set in a different reconfiguration cycle to a configurable circuit (e.g., to a configurable routing interconnect circuit or to a configurable logic circuit). The reconfiguration cycles of some embodiments are sub-cycles associated with a user design. Several examples of ICs with sub-cycle reconfigurable circuits are described in U.S. patent application Ser. No. 11/081,859, now issued U.S. Pat. No. 7,342,415, entitled "Configurable IC with Interconnect Circuits that also Perform Storage Operations," filed on Mar. 15, 2005 and in U.S. patent application Ser. No. 11/082,193, now issued U.S. Pat. No. 7,295,037, entitled "Configurable IC with Routing Circuits with Offset Connections," filed on Mar. 15, 2005. U.S. patent application Ser. Nos. 11/081,859 and 11/082,193 are incorporated in the present application by reference.

Some embodiments described below utilize storage elements in their context registers. Examples of such storage elements are latches and registers. A latch is a storage element that can operate transparently (i.e., can pass its signal through). Specifically, based on an enable signal, a latch either holds its output constant (i.e., is closed) or passes its input to its output (i.e., is open). For instance, a latch (1) might pass a signal on its input terminal to its output terminal when the enable signal is not active (e.g., when the signal on the enable terminal is logic low) and (2) might store a value and hold its output constant at this value when the enable signal is active (e.g., when the signal is logic high). Such a latch typically stores the value that it was receiving when the enable signal transitions from its inactive state (e.g., low) to its active state (e.g., high). Some latches do not include a separate enable signal, instead the input signal (or combination of input signals) to the latch acts as an enable signal.

A register is a storage element that cannot operate transparently. For instance, some registers operate based on a control signal (e.g., a clock) received on the control terminal. Based on this signal, the register either holds its output constant or passes its input to its output. For instance, when the control signal makes a transition (e.g., goes from logic low to logic high), the register samples its input. Next, when the control signal is constant or makes the other transition, the register provides at its output the value that it most recently sampled at its input. In a register, the input data typically must be present a particular time interval before and after the active clock transition. A register is often operated by a clock signal that causes the register to pass a value every clock cycle, while a latch is often controlled by a control signal However, this does not have to be the case always.

Figure 2:
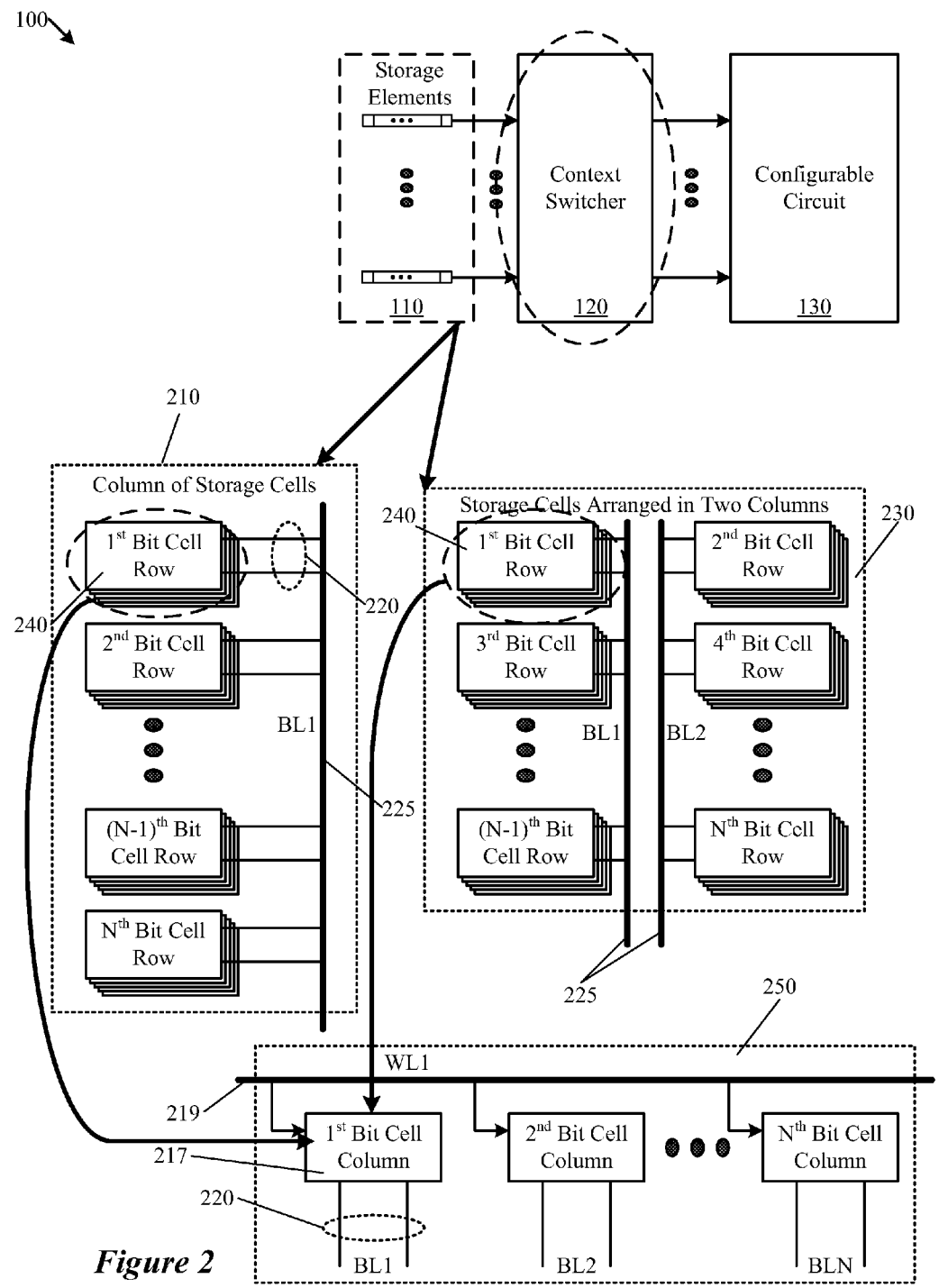
FIG. 2 illustrates several embodiments of the storage cells which store the configuration data of some embodiments.

A configuration data storage element is a storage circuit that stores configuration data. FIG. 2 illustrates several examples of configuration data storage elements 110. In some embodiments, configuration data storage elements are arranged in a single column 210 including multiple bit cell rows, where each bit cell row within a bit cell column is shown in breakout section 250. For instance, memory cells may be arranged in a memory array of 64 columns by nine rows. As shown in breakout section 250, each bit cell row within a bit cell column includes a number of single bit cells 217. Some bit cells store configuration data and other bit cells are used for redundancy, repair, or other operations. Each bit cell 217 in a bit cell row 240 is controlled by a single word line control input 219 that is shared with every other bit cell 217 in the bit cell row 250. Each bit cell in a particular column has a pair of complementary inputs/outputs 220, which share a pair of bit lines 225 with the other bit cells 217 in the column.

In other embodiments, configuration data storage elements are arranged in multiple columns, with each column including multiple bit cells 230. Each of columns of the multiple column arrangement may include some bit cells that store configuration data while other bit cells are used for redundancy, repair, or other operations. In some of these embodiments, a bit cell from each column 210 is activated when the word line is activated. In some embodiments, the storage cell 217 is a RAM cell. In other embodiments, the configuration data storage elements may be made up of other types of memory (e.g. Flash, ROM, etc.).

Some embodiments of the bit storage cell 217 operate using the same nominal voltage supply used elsewhere on the IC. In other embodiments, the storage cell operates with a reduced voltage supply. Examples of storage cells with a reduced voltage supply are described in U.S. patent application Ser. No. 11/081,874, now issued U.S. Pat. No. 7,272,031, entitled "Method and Apparatus for Reduced Power Cell," filed on Mar. 15, 2005. U.S. patent application Ser. No. 11/081,874 is incorporated in the present application by reference. Other embodiments write data to the storage cell at a reduced voltage supply while performing other operations of the storage cell (e.g., storage and/or read) at the nominal voltage supply. In some embodiments, the bit lines used to read the data from the storage cell must be pre-charged (e.g. to the supply voltage), to prevent corruption of the stored data during a read operation. Other embodiments do not need to pre-charge the bit lines used to read the data from the storage cell. In other embodiments the bit lines of the storage cells are equalized (i.e. pre-charged to a reference or intermediate voltage rather than the supply voltage).

In some embodiments, the storage cell includes dual, differential ports where one differential port is dedicated to supplying data to the context switcher, while the other port is available for writing configuration data to the storage cell. In other embodiments, both differential ports may be supplied to the context switcher. In order to reduce the size (i.e. by using fewer transistors) of the storage cell, the storage cell of other embodiments includes a single differential port, which is supplied to the context switcher. In some embodiments, the storage cell provides only one of the differential signals to the context switcher (i.e. single-ended read), while the other differential signal may be used elsewhere (e.g. for a differential write operation), or not used at all in order to save power. In some embodiments, the storage cell is tapped directly and its differential outputs are available for other operations.

In some embodiments, the storage cell includes data that is encoded to save space by reducing the number of storage cells. In some of these embodiments, the context switcher includes a decoder placed before or after one or more of the interconnect and/or storage stages. In other embodiments, the storage cell data is not encoded such that no decoder needs to be used when reading the configuration data from the storage cell. A more detailed description of the various storage cells 110 is provided with reference to FIGS. 6A-10B, below.

As mentioned above, some embodiments of the context switcher operate with a single re-timing stage. Other embodiments use two re-timing stages to perform a fetch/pre-fetch operation. For instance, the two retiming stages of some embodiments includes a two-stage multiplexer structure, where the first stage captures the data from the storage element, and the second stage re-times and synchronizes the data before passing it to the configurable circuits. In some of these embodiments, the first tier of the multiplexer is placed within the storage element. These storage elements are described in U.S. patent application Ser. No. 11/082,203, now issued U.S. Pat. No. 7,330,050, entitled "Storage Elements for a Configurable IC and Method and Apparatus for Accessing Data Stored in the Storage Elements," filed on Mar. 15, 2005. U.S. patent application Ser. No. 11/082,203 is incorporated in the present application by reference. In other embodiments, the two tiers are implemented by using a master and slave storage element (e.g., latch) arrangement. In this arrangement, the master storage element (e.g., master latch or register) captures the data and the slave storage element (e.g., slave latch or register) re-times and synchronizes the data.

Figure 3:
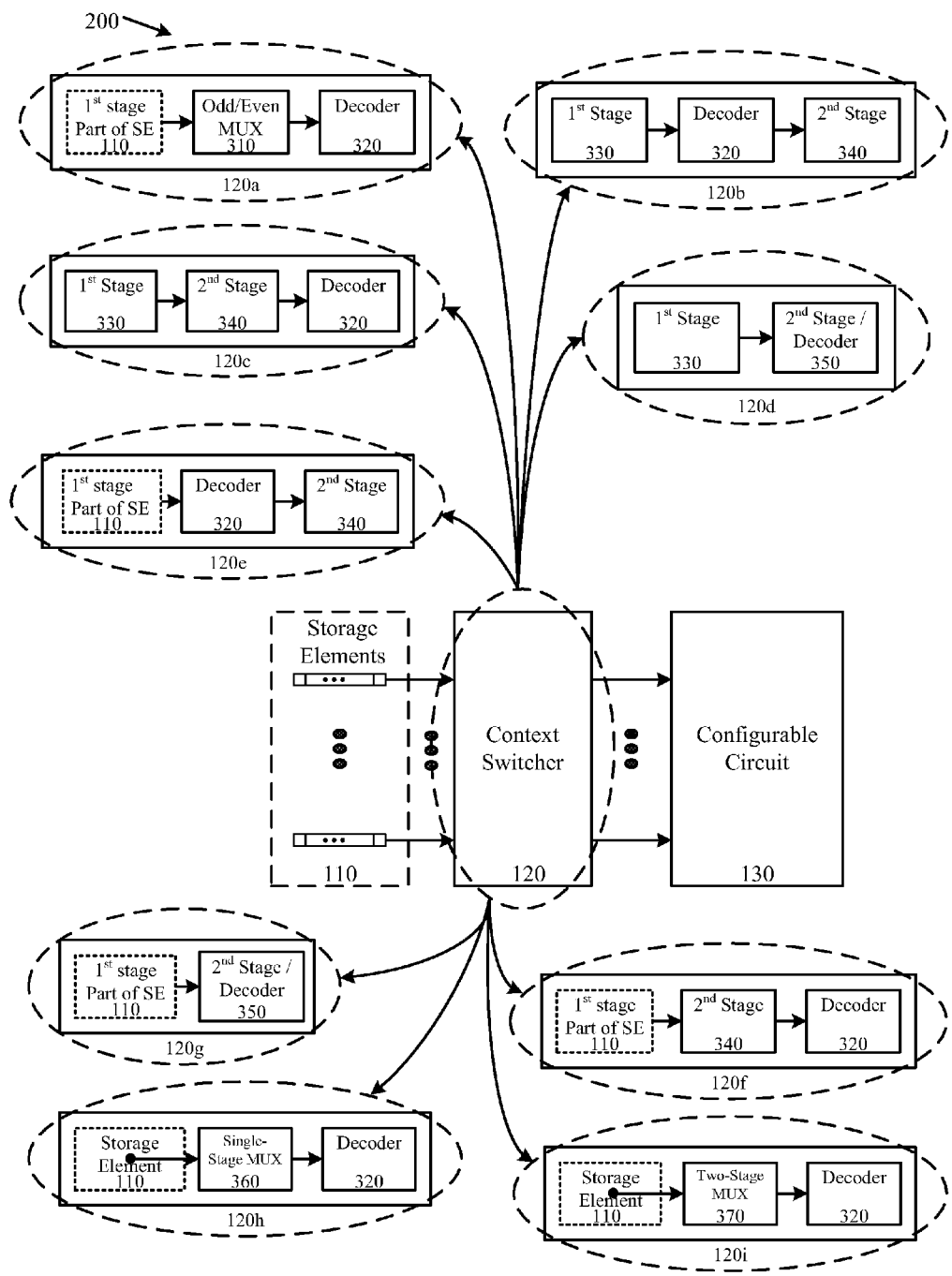
FIG. 3 demonstrates the components of a context switcher of some embodiments.

FIG. 3 illustrates several embodiments 120a-120i of the context switcher 120. The context switcher 120 includes components to capture the data from the configuration storage elements 110; and to synchronize and re-time the data before it is passed to the configurable circuits 130. Three components that exist in some embodiments of the context switcher that will be discussed below are a first stage, a second stage, and a decoder. Generally, the first stage is used to capture the data from the configuration data storage cells. In some embodiments, the data is encoded, and thus must be decoded by the decoder. In general, the second stage is used to re-time and synchronize the data before it is passed to the configuration circuits. Some embodiments of the context switcher 120 include all three components, while other embodiments include a subset of these three components, while other embodiments include these elements and other components.

FIG. 3 further illustrates some specific embodiments of the context switcher 120. For instance, some embodiments such as 120a use the RAM cell 110 as the first stage, while the re-timing and synchronization is performed by a two-to-one multiplexer 310 before being passed to the decoder 320. In other embodiments such as 120b, the context switcher 120 includes a first stage 330 that is separate from the configuration data storage elements. The context switcher 120b routes the output of the first stage 330 to a decoder 320 and a second stage 340.

FIG. 3 further illustrates other specific embodiments of the context switcher 120. In some embodiments such as 120c, the order of the second stage 340 and decoder 320 are reversed from that in the embodiment of 120b. Some of these embodiments reduce the number of second stages 340 necessary because for instance the decoder may generate 4 bits (instead of 2 bits) of data, and thus require two second stages 340 if the second stages follow the decoder 320 versus one second stage 340 if the decoder follows the second stages 340, as in 120c.

In other embodiments 120d, the decoder and second stage are combined into one element 350.

In other embodiments 120e illustrated in FIG. 3, the decoder 320 takes its input directly from the storage element 110 with no intervening first stage. The output of the decoder 220 is then passed to the second stage 340 for re-timing and synchronization. In other embodiments 120f, the order of the second stage 240 and decoder 320 is reversed, with the second stage preceding the decoder. In this embodiment 120f, the second stage 340 takes its input directly from the storage element 110 with no intervening first stage. In other embodiments 120g, the second stage and decoder are combined into one element 350 which takes its input directly from the storage element 110 with no intervening first stage.

Finally, as illustrated in FIG. 3, some embodiments 120h route the output of the storage element 110 to a single-stage multiplexer 360 and then to a decoder 320. In some of these embodiments, the single stage multiplexer takes its input directly from the Q node (i.e., internal storage node) of the storage cell 110, effectively creating an additional port. In other embodiments, the multiplexer may take complementary inputs from the Q node and its complementary node of the storage cell. In other embodiments 120i, the output of a dual port storage element 110 is fed directly into a two-stage multiplexer 370 where the first stage performs the data capture function, and the second stage performs the retiming and synchronization functions. In some of these embodiments, the output of the two-stage multiplexer is passed to a decoder (e.g. when the configuration data has been previously encoded).

To provide an example of the interplay of these various components described above, one example of a context switcher will now be explained by reference to FIG. 4. This figure illustrates the components of a context switcher 400 of some embodiments, as described above in reference to element 120b of FIG. 3. The context switcher 400 includes two first stage storage elements 410, a configuration decoder 420, and four second stage storage elements 430. However, it should be apparent to one of ordinary skill in the art that the context switcher 400 of some embodiments may include more or fewer first 410 and second 430 stage elements and a decoder 420 with a sufficient number of inputs and outputs for the number of first and second stage elements 410 and 430.

The storage elements of the first and second stages are latches in some embodiments. Each of the two first stage storage elements 410 is coupled to a single-ported storage element 405 (i.e., RAM) and receives a differential bit line (i.e., the bit line, BL, and its complement) from the coupled storage element. In FIG. 4, the first stage storage elements 410 each receive a single bit of an encoded two bit configuration data. The bit value is provided as the reset input of the first stage and the complement of the bit value is provided as the set input of the first stage.

The outputs of the first stage storage elements 410 are provided to the configuration decoder 420. The configuration decoder 420 receives the two encoded bits of configuration data and the complements of the configuration data. The configuration decoder of some embodiments performs a decoding operation. In this example, this decoding operation is 2:4 (i.e. two input bits are decoded into four output bits). In other embodiments, the decoding is 2:3 or 1:1. In other embodiments, the decoding may be done with some other ratio of input bits to output bits. In other embodiments, the decoding may be done with multiple decoding schemes (i.e. configuration data for certain types of configurable circuits may be decoded with one ratio, while configuration data for other types of configurable circuits may be decoded with another ratio). The decoding operations of the configuration decoder 420 are described in further detail with reference to FIGS. 25A-25C, below.

Some embodiments of the context switcher 400 then pass the decoded output lines from the configuration decoder 420 to the pair of second stage storage elements 430. The second stage storage elements 430 also receive a clock signal. Functionally, the pair of second stage storage elements 430 maintain and hold the decoded configuration data constant, thereby allowing the configuration data to propagate to the proper configuration circuits. As the second stage storage elements 430 hold the decoded configuration data constant, the first stage storage elements 410 pre-fetch the next encoded configuration data bits from the storage element and the configuration decoder 420 decodes the read encoded configuration data. In this manner, the context switcher 400 permits configurable circuits of the IC to configure while decoding of the next set of configuration data occurs within a different section of the same circuit 400.

Figure 4:
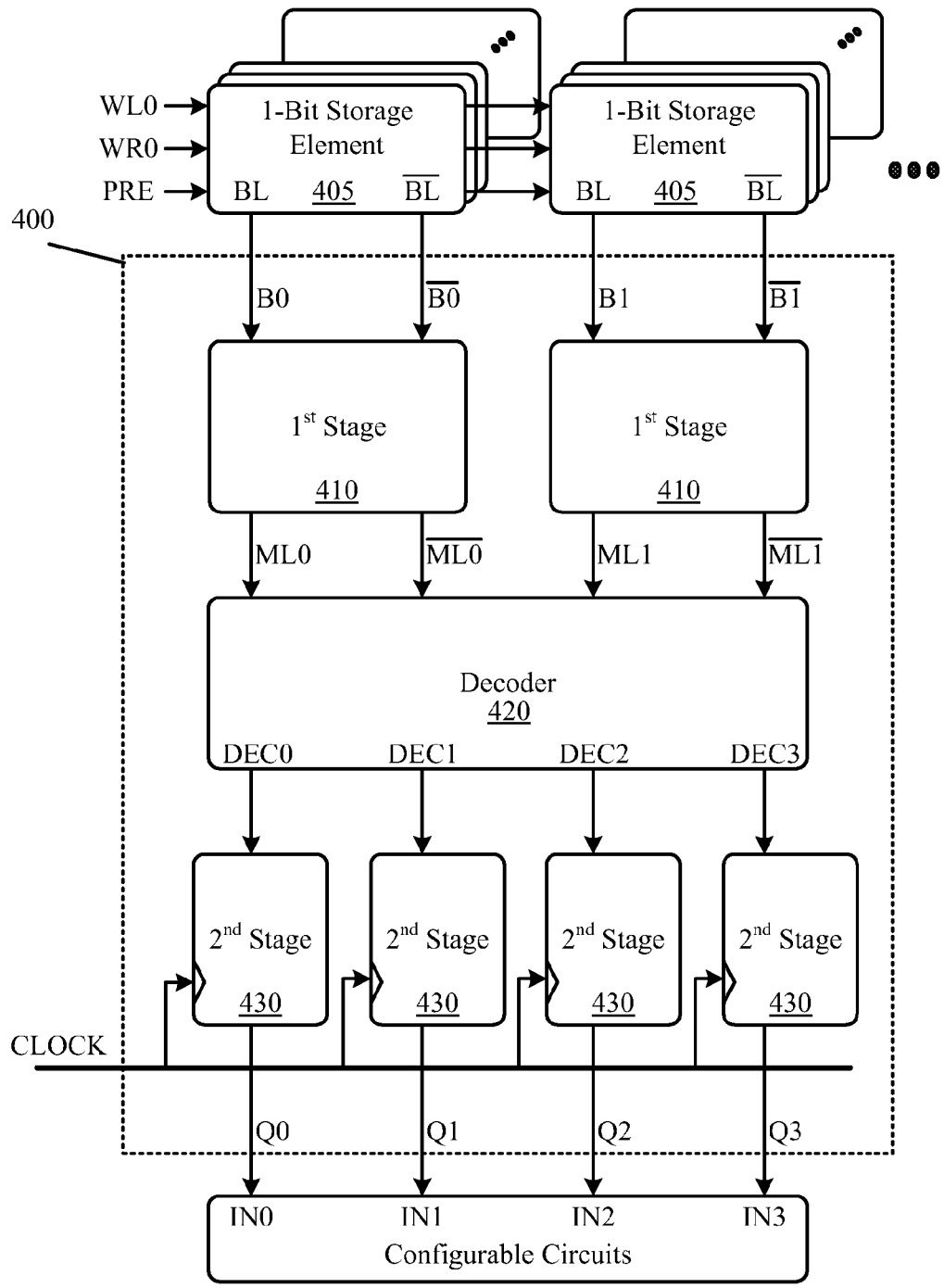
FIG. 4 illustrates an example embodiment of the context switcher of some embodiments.
Figure 5:
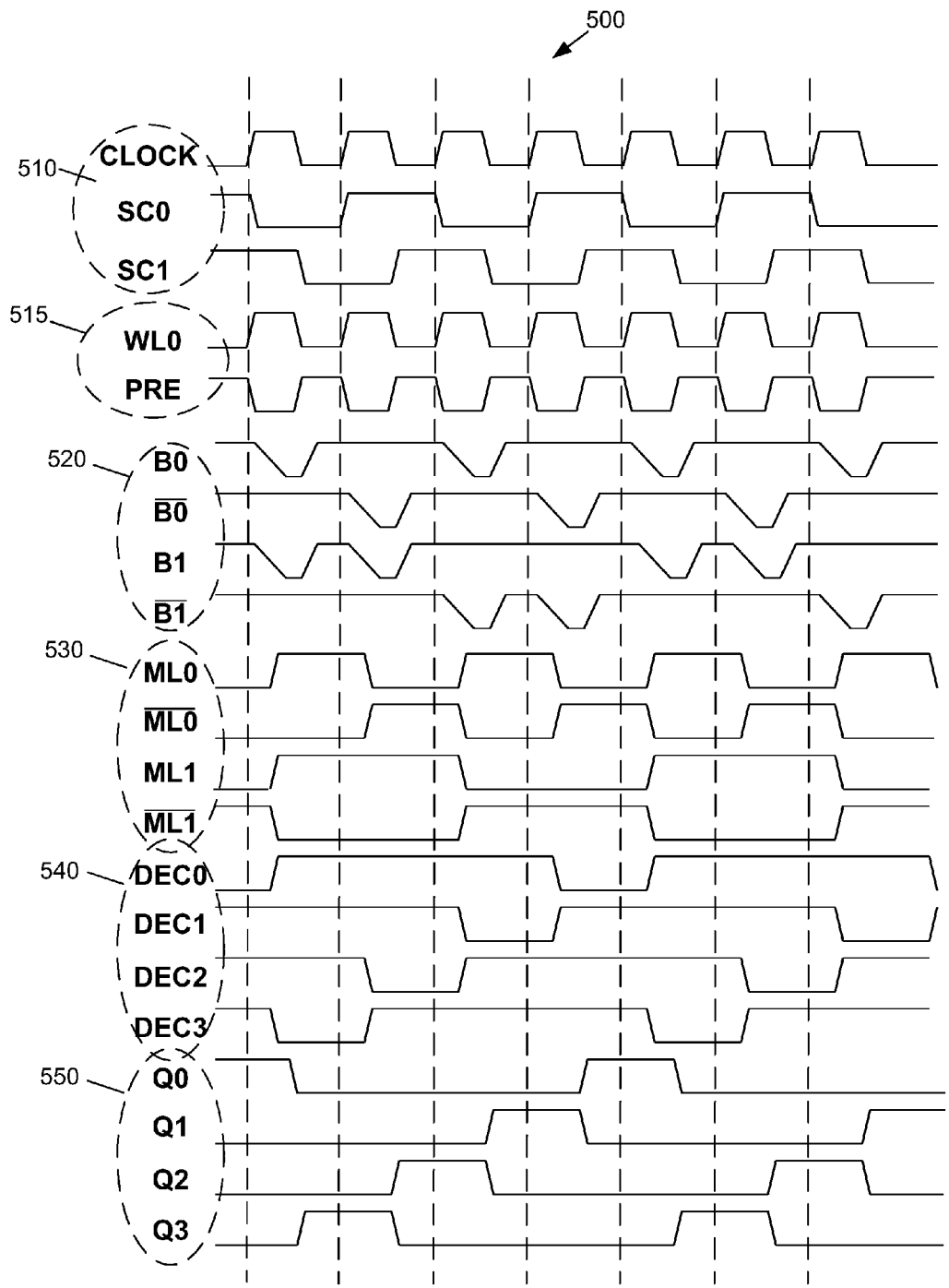
FIG. 5 illustrates the timing diagram of the circuit depicted in FIG. 4 of some embodiments.

FIG. 5 presents a timing diagram 500 that demonstrates the operation of the various components (e.g., first stage storage elements, configuration decoder, and second stage storage elements) of the context switcher 400 of FIG. 4 in relation to a sub-cycle clock of a configurable IC. The timing diagram 500 illustrates the values of the clock signals 510, the pre-charge and word line control signals 515, the values 520 at the inputs of the first stage storage elements, inputs 530 of the configuration decoder, and inputs 540 of the second stage storage elements in relation to a clock signal 510 of a configurable IC.

The pre-charge and word line control signals 515 control the pre-charge and read operations every clock cycle. When WL0 is logic high, a read of the storage elements 405 is enabled. When PRE is at a logic high, the bit lines of the storage elements are pre-charged to a logic high value.

The inputs of the first stage storage elements 520 receive the two bit lines and their complements from the configuration data RAM (i.e., storage elements 110). In some embodiments, the bit lines provide the encoded configuration data as they are read from the RAM. As described above, the first stage storage elements stabilize and hold the values appearing on the bit lines so that the values can be passed to the configuration decoder. Therefore, the inputs of the first stage storage elements 520 appear with a slight delay at the inputs of the configuration data 530. Using the pair of first stage output signals and the complements of the first stage output signals, the configuration decoder produces a set of decoded configuration signals illustrated in the timing diagram 500 as signals 540. For instance, the configuration decoder 420 in some embodiments determines the value for DEC0 (i.e., the first decoded output) as the Boolean NAND result of the complemented lines of the first stage storage elements 410 (i.e., inverse of the ML0 and ML1 lines). Similarly, to produce the second decoded output line, DEC1, the configuration decoder takes the Boolean NAND result from the complement output of the first first stage and the non-complement output of the second first stage. It should be apparent to one ordinary skill in the art that the decoder may be implemented in some embodiments via alternative decoding means.

Since the configuration decoder 420 includes only pass through logic, the outputs of the configuration decoder 540 (i.e., the decoded signals) are created as the inputs 530 to the configuration decoder 420 are provided. The decoded signals 540 are then passed to the second stage storage elements 430. The second stage storage elements 430 hold the decoded values for one sub-cycle before the complementary values of the inputs appear as the output signals 550. For instance, the complementary values for the inputs of the second stage storage elements 430 (DEC0, DEC1, DEC2, and DEC3) appear with a half sub-cycle delay as the outputs Q0, Q1, Q2, and Q3. Holding the values in this manner allows the first stage storage elements 410 to pre-fetch the next set of configuration data and feed the values to the decoder for decoding. During the pre-fetching of the next set of configuration data on the next subcycle, the second stage storage elements will continue to hold and output the current decoded values on the output lines 550. This allows the desired configurable ICs sufficient time to receive the configuration data and configure accordingly. Once the next set of configuration data is decoded and made available on the input lines 540 of the second stage storage elements 430, the second stage storage elements 430 will release the values and store the newly decoded values. Therefore, in one subcycle an encoded configuration data set is decoded while an already decoded set of configuration data is output from the context switcher into the configurable tile logic of the IC.

II. Configuration Data Storage Elements

The configuration data storage elements hold the configuration data for the configurable circuits of the IC. In some embodiments, the storage elements act as the first stage of the context switcher. In other embodiments, the storage elements pass the data to the first stage of the context switcher. In the subsections below, several variations of the storage cell and columns of storage cells are described.

A. Dual Port SRAM without Bit Line Pre-Charge

Figure 6A:
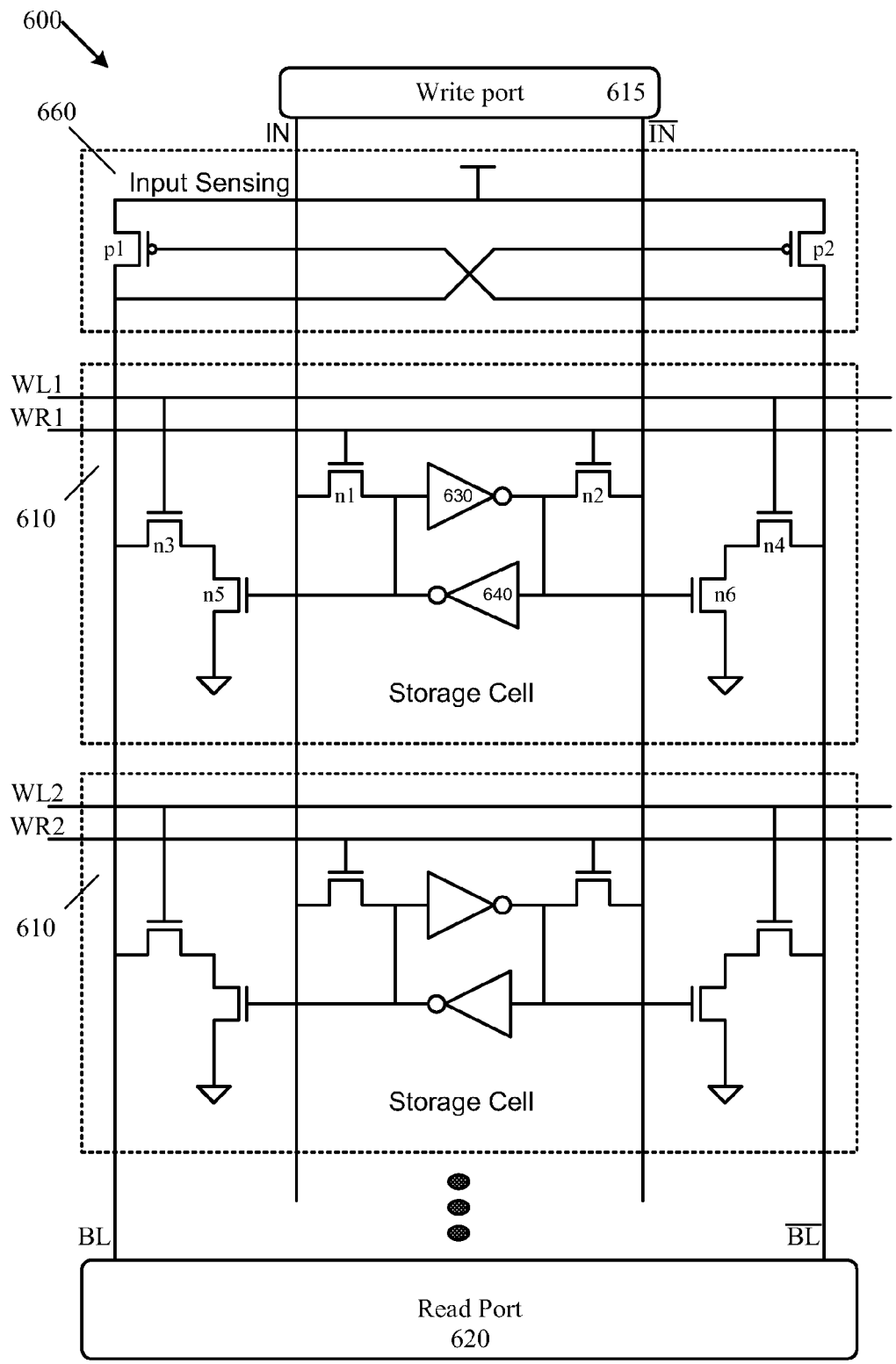
FIG. 6A illustrates a ten transistor, dual port, no pre-charge storage cell of some embodiments.

FIG. 6A illustrates a column 600 of 10-transistor (10-T), dual port SRAM storage cells 610 with no bit line pre-charge. As shown, the column 600 includes multiple 10-T storage cells 610, a write port 615, a read port 620, two cross-coupled pmos transistors p1 and p2, and a pair of complementary bit line outputs (BL and its complement). As shown, each 10-T storage cell includes two cross-coupled inverters 630 and 640, four controllable pass transistors n1, n2, n3 and n4, two pull-down transistors n5 and n6, a word line control input (e.g. WL1), and a write control input (e.g. WR1). Some embodiments store a column of configuration data for part of the configuration circuitry of some embodiments. Specifically, one column 600 of storage cells 610 may be arranged so that the column shares a write port 615, a read port 620, and input sensing circuit 660. FIG. 6A shows two storage cells 610 within the column, but other embodiments may use more or fewer storage cells.

This embodiment of SRAM uses more area than some of the embodiments that follow. However, it eliminates the need to pre-charge the bit lines, which saves large amounts of power since one or the other bit line is being pre-charged every read cycle. The write port 615 of the memory cell, which is typically used to initially load the configuration data of the user design, may be connected to some alternative access point than the read port 620. During a write operation, the write port is accessed when the WR line is held at logic high, turning transistors n1 and n2 on, and the inputs of the cross-coupled inverters 630 and 640 are connected to the write port 615.

During storage, both WR and WL are held at logic low, thus turning off transistors n1, n2, n3, and n4. When these transistors are in the off state, inverters 630 and 640 hold whatever value has been written to them. Because there is no connection to either inverter's input except the output of the other inverter, the inverters constantly drive the other inverter to output the opposite value, providing positive feedback at its own input.

During a read operation, WL is held at logic high, and transistors n3 and n4 are turned on. When n3 and n4 are turned on, the drains of transistors n5 and n6 are shorted to BL and its complement. If a logic high is held at the output of the inverter 640, for instance, n5 is turned on, and BL is shorted to ground through n3 and n5. Once BL is pulled below p2's gate threshold, p2 is turned on, and BL's complement is driven to a logic high. No pre-charge is needed before a read operation because the inputs of the inverters 630 and 640 are not connected directly to the bit lines. But connecting the inputs and outputs of the inverters 630 and 640 to the gates of nmos transistors n5 and n6, the storage nodes are isolated from the bit lines and cannot be corrupted.

The column 600 arrangement and storage cell 610 may be used with any of the variations of the context switcher described below. In addition, one of ordinary skill in the art will recognize that the column of storage cells 600 may be implemented using different embodiments. For example, the storage cell 610 could be made single port by eliminating transistors n3, n4, n5 and n6.

Figure 6B:
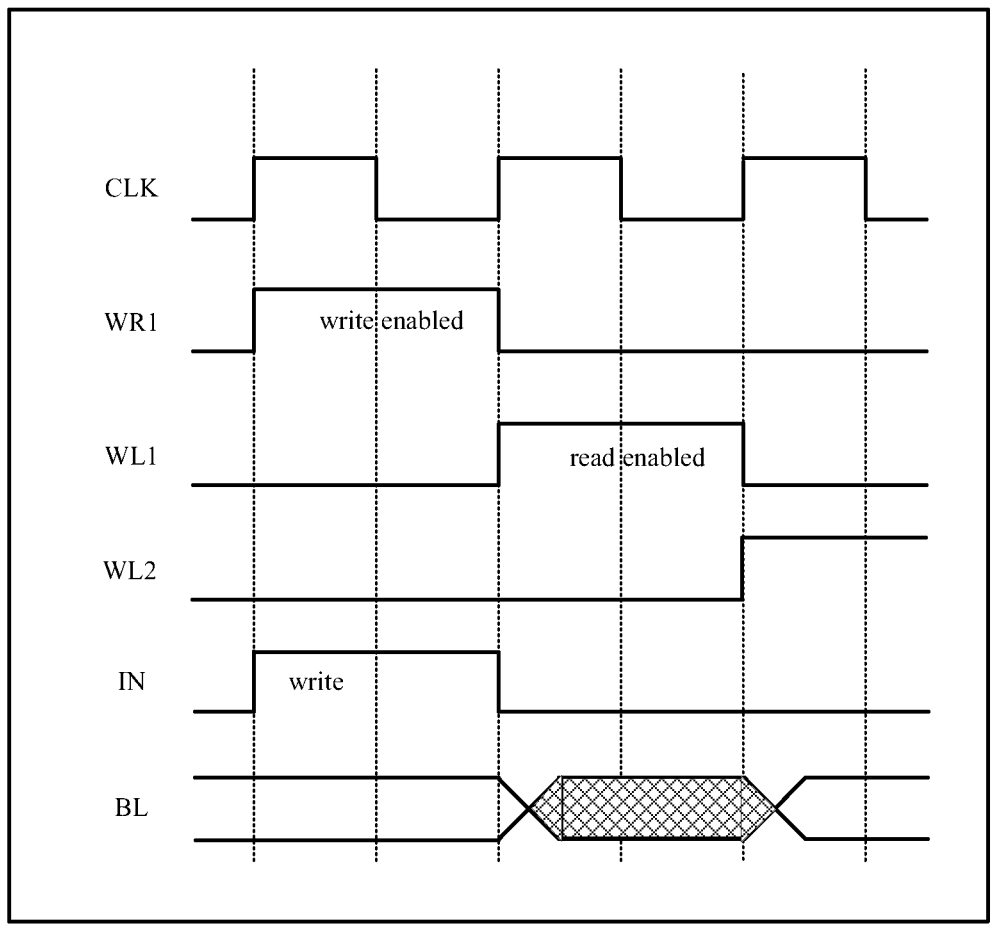
FIG. 6B illustrates the timing diagram of the circuit depicted in FIG. 6A of some embodiments.

FIG. 6B illustrates the timing diagram for the column 600 of storage cells described in reference to FIG. 6A above. As shown, the timing diagram includes the signals CLK, WR1, WL1, IN and BL. When WR1 is brought to a logic high, the cell is enabled to perform a write operation as described above in reference to FIG. 6A. When a write operation is performed, the value on IN is stored in the cross coupled inverters 630 and 640 of the storage cell 610. When WL1 is brought to a logic high, the cell is enabled to perform a read operation as described above in reference to FIG. 6A. When a read operation is performed, the value stored by the cross-coupled inverters 630 and 640 is provided at the outputs (BL and its complement). Other storage cells 610 in the column 600 are read from or written to by activating other write enables (e.g. WR2 for the second cell in the column, etc.) or other word lines (e.g. WL2 for the second cell in the column, etc.).

B. Six Transistor Single Port SRAM with Bit Line Pre-Charge

Figure 7A:
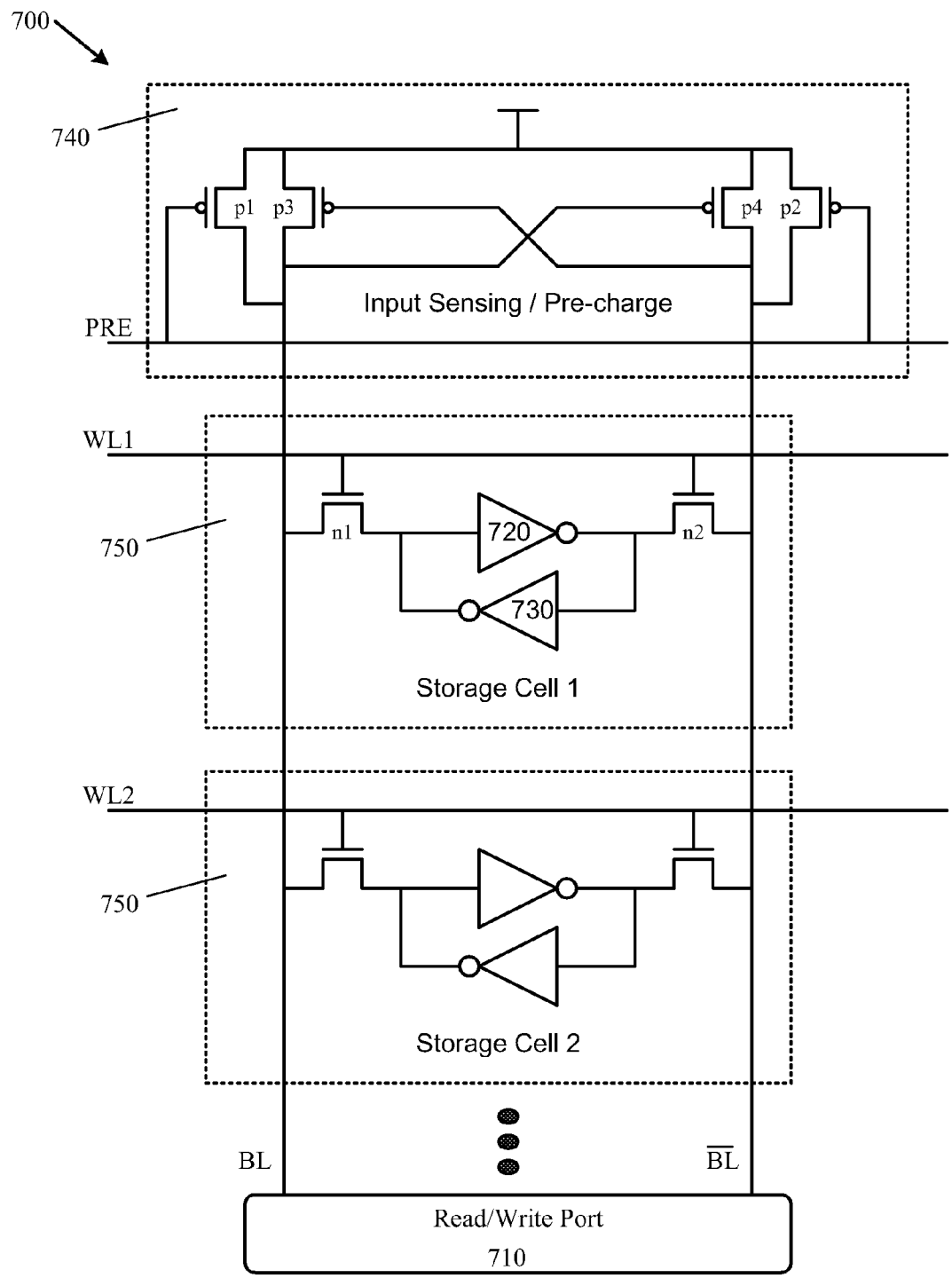
FIG. 7A illustrates a six transistor, single port, pre-charged storage cell of some embodiments.

FIG. 7A illustrates a column 700 of six transistor (6-T) single port SRAM storage cells 750 of some embodiments which pre-charges the bit lines. As shown, the column 700 includes a read/write port 710, two controllable pull-up transistors p1 and p2, two cross-coupled sense transistors p3 and p4, a pre-charge control input (PRE), multiple storage cells 750, and a pair of complementary bit line inputs/outputs (BL and its complement). As shown, each 6-T storage element 750 within the column 700 includes two cross-coupled inverters 720 and 730, two controllable pass transistors n1 and n2, and a word line control input (e.g. WL1).

Some embodiments store a column 700 of configuration data for part of the configuration circuitry of some embodiments. Specifically, one column 700 of storage cells 750 may be arranged so that the column shares a read/write port 710, and input sensing and pre-charge circuitry 740. FIG. 7A shows two storage cells 750 within the column, but other embodiments may use more or fewer storage cells.

The 6-T storage cell 750 uses a smaller area than the 10-T embodiment 610, allowing greater density of storage cells. Because there is no second port, both read and write operations are performed through the same port 710. As shown in FIG. 7A, the bit lines are connected to the read/write port 710 which may be connected to a context switcher in some embodiments. The context switcher may use any one of the embodiments described above with reference to FIG. 3, or another embodiment of the context switcher.

In order to avoid corrupting the contents of the storage cell (or the contents of the cell driving the storage cell during a write operation) by pulling either inverter's input to a logic low, before a read or write operation the bit lines are pre-charged. Pre-charging is accomplished by holding PRE in a logic low state. This turns on transistors p1 and p2, pulling the bit lines toward a logic high value. When PRE is held at a logic high state, transistors p1 and p2 are turned off, leaving the bit lines in a pre-charged state until one is discharged.

During a write operation, the complementary value being written is placed on BL and its complement, while WL is held at a logic high state. By holding WL at logic high, both n1 and n2 are turned on, passing the values being driven at BL and its complement to the inputs of cross-coupled inverters 720 and 730. During storage, WL is held at logic low, thus turning off transistors n1 and n2, and inducing reinforcing feedback between inverters 720 and 730 as described above.

During a read operation, WL is held at logic high, and transistors n1 and n2 are turned on. When n1 and n2 are turned on, the values at the outputs of the inverters 720 and 730 are shorted to the BL and its complement. If a logic low is held at the output of the inverter 730, for instance, BL is driven to a logic low by inverter 730, while a logic high at the output of inverter 720 leaves BL's complement at its pre-charged logic high. In this example, when BL is driven to logic low, transistor p4 turns on and pulls-up BL's complement to reinforce its logic high.

The column 700 of storage cells 750 may be used with any of the latches described below. In addition, one of ordinary skill in the art will recognize that the column 700 of storage cells 750 may be implemented using different embodiments. For example, the column 700 could be implemented without pre-charge.

Figure 7B:
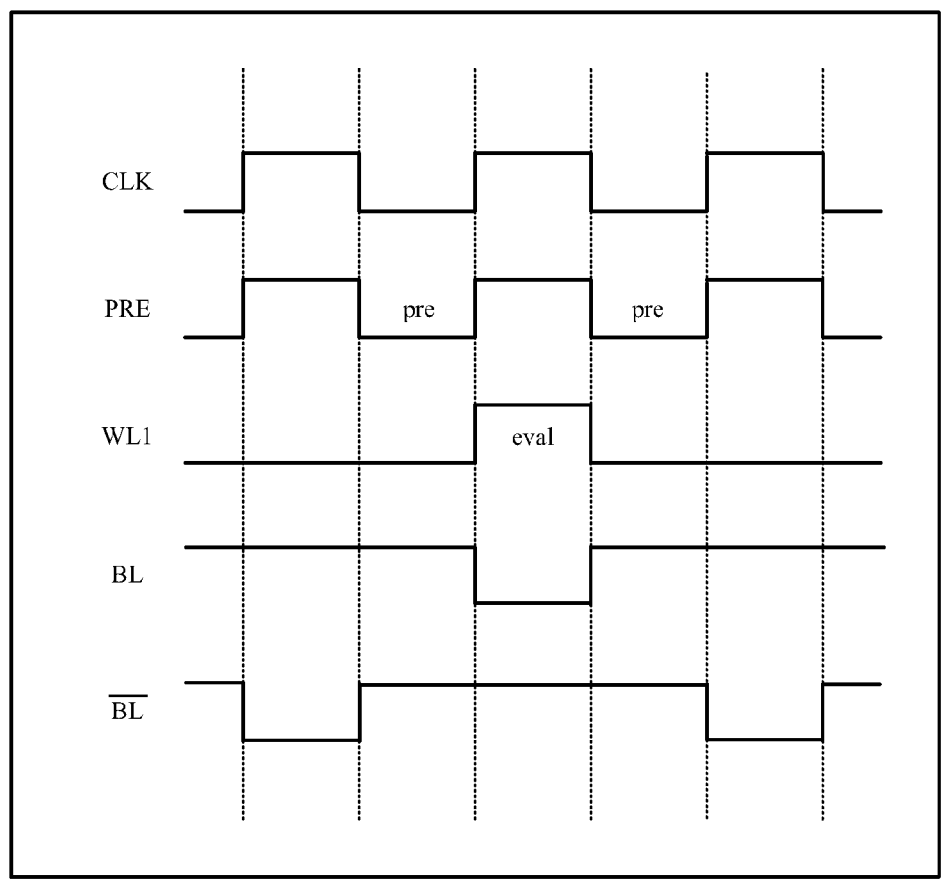
FIG. 7B illustrates the timing diagram of the circuit depicted in FIG. 7A of some embodiments.

FIG. 7B illustrates the timing diagram for the column 700 of storage cells described in reference to FIG. 7A above. As shown, the timing diagram includes the signals CLK, PRE, WL1, BL and BL's complement. The signal PRE follows the CLK signal. When PRE is brought to a logic low, the bit lines of the storage cell column 700 are pre-charged. When WL1 is brought to a logic high, the cell is enabled to perform a read or write operation as described above in reference to FIG. 7A. When a write operation is performed, the value on BL and its complement is stored in the cross coupled inverters 720 and 730 of the storage cell 750. When a read operation is performed, the value stored by the cross-coupled inverters 720 and 730 is provided at the outputs (BL and its complement). Other storage cells 750 in the column 700 are read from or written to by activating other word lines (e.g. WL2 for the second cell in the column, etc.).

C. Six Transistor SRAM with Bit Line Equalization

Figure 8A:
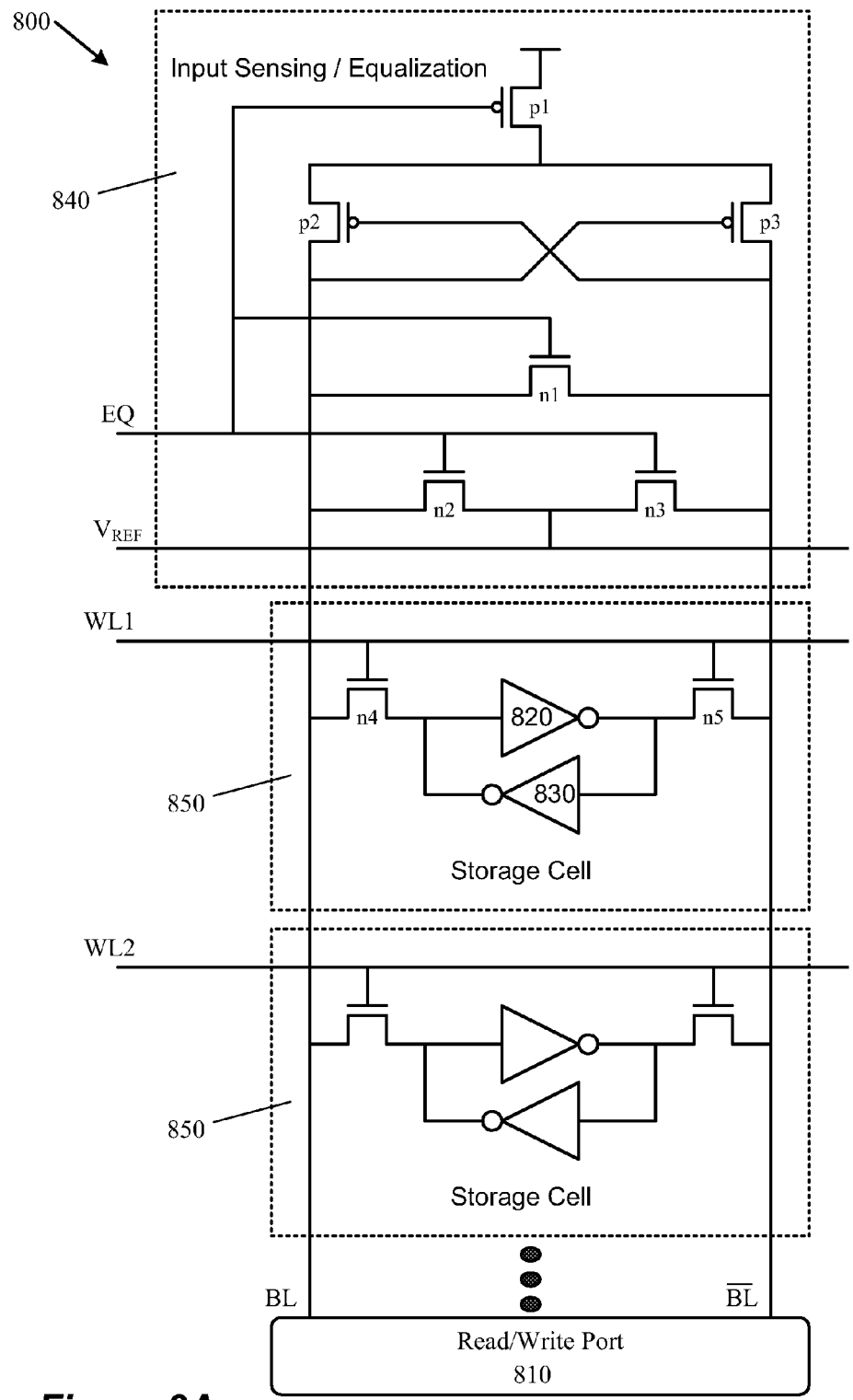
FIG. 8A illustrate a six transistor, single port, equalized storage cell of some embodiments.

FIG. 8A illustrates a column 800 of 6-T single port SRAM storage cells 850 using equalization of the bit lines. As shown, column 800 includes a read/write port 810, a controllable pull-up transistor p1, a pair of cross-coupled pull-up transistors p2 and p3, a charge sharing transistor n1, two pass transistors n2 and n3, an equalization control input (EQ), a reference voltage input ($V_{REF}$), multiple storage cells 850 and a pair of complementary bit line outputs (BL and its complement). As shown, the 6-T storage element 850 with equalization includes two cross-coupled inverters 820 and 830, two pass transistors n4 and n5, and a word line input (e.g. WL1).

Some embodiments store a column 800 of configuration data for part of the configuration circuitry of some embodiments. Specifically, one column 800 of storage cells 850 may be arranged so that the column shares a read/write port 810, and input sensing and equalization circuitry 840. FIG. 8A shows two storage cells 850 within the column, but other embodiments may use more or fewer storage cells.

Bit line equalization uses less power than pre-charging because dynamic power varies with the square of the voltage change, all else being equal. As shown in FIG. 8A, the bit lines are connected to a read/write port 810 which may be connected to a context switcher which will capture and re-time the data provided on the bit lines. This context switcher may use any one of the embodiments described above with reference to FIG. 3, or another embodiment of the context switcher.

In order to avoid corrupting the contents of the storage cell (or the contents of the cell driving the storage cell during a write operation) by pulling either inverter's input to a logic low, before a read or write operation the bit lines are equalized. Equalization is accomplished by holding EQ in a logic high state. This turns off transistor p1, which leaves the sources and drains of transistors p2 and p3 floating. Holding EQ at logic high also turns on transistors n1, n2, and n3. This shorts both bit lines to each other and $V_{REF}$. Because of the large load capacitance when driving the bit lines, to avoid placing a current load on $V_{REF}$ through either transistor n2 or n3, the size of transistor n1 is often made relatively larger than transistors n2 or n3. Because the bit lines are at complementary logic values before the equalization operation, one of the lines connected to n1 will always be logic high, while the other is logic low. Thus, the bit line at a logic high is able to source current through transistor n1 to the bit line at a logic low, while the bit line at logic low is able to sink current from the bit line at logic high. When EQ is switched to a logic low state, transistor p1 is turned on, driving the sources of transistors p2 and p3 to the voltage supply. In addition, when EQ is switched to logic low, n1, n2 and n3 are turned off, leaving the bit lines floating at some intermediate voltage, $V_{REF}$.

During a write operation, the complementary value being written is placed on BL and its complement, while the word line (e.g. WL1 to write to the first storage cell 850 in the column 800) is held at a logic high state. By holding the word line at logic high, both n4 and n5 are turned on, passing the values being driven at BL and its complement to the inputs of cross-coupled inverters 820 and 830. During storage, WL is held at logic low, thus turning off transistors n4 and n5, and inducing reinforcing feedback between inverters 820 and 830 as described above.

During a read operation, the word line (e.g. WL1 to read the first storage cell 850 in the column 800) is held at logic high, and transistors n4 and n5 are turned on. When n4 and n5 are turned on, the values at the outputs of the inverters 820 and 830 are passed to the bit lines (BL and its complement). If a logic low is held at the output of the inverter 830, for instance, BL is driven to a logic low by inverter 830, while a logic high at the output of inverter 820 drives BL's complement to a logic high.

The storage cell 850 may be used with any of the stages described below. In addition, one of ordinary skill in the art will recognize that the storage cell 850 may be implemented using different embodiments than described above. For example, the storage cell 850 could be implemented with different values of $V_{REF}$.

Figure 8B:
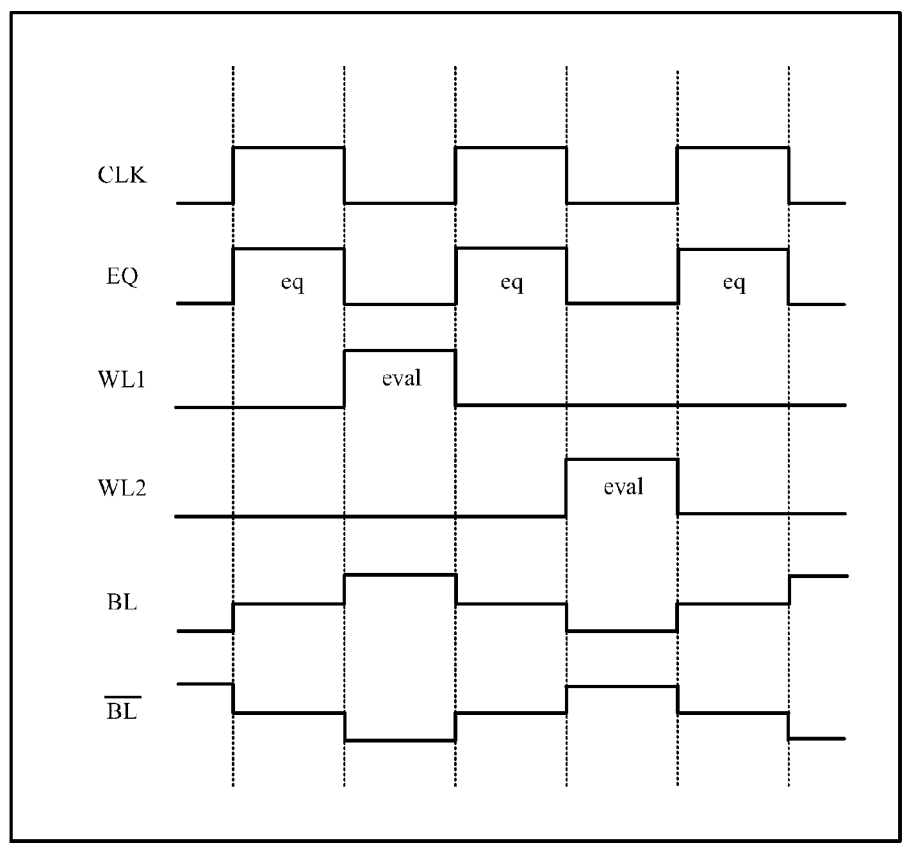
FIG. 8B illustrates the timing diagram of the circuit depicted in FIG. 8A of some embodiments.

FIG. 8B illustrates the timing diagram for the column 800 of storage cells described in reference to FIG. 8A above. As shown, the timing diagram includes the signals CLK, EQ, WL1, WL2, BL and BL's complement. Before a read or write operation, EQ is brought to a logic high to equalize the bit lines of the storage cell column 800. When WL1 is brought to a logic high, the cell is enabled to perform a read or write operation as described above in reference to FIG. 8A. When a write operation is performed, the value on BL and its complement is stored in the cross coupled inverters 820 and 830 of the storage cell 850. When a read operation is performed, the value stored by the cross-coupled inverters 820 and 830 is provided at the outputs (BL and its complement). Other storage cells 850 in the column 800 are read from or written to by activating other word lines (e.g. WL2 for the second cell in the column, etc.).

D. Six Transistor SRAM with Single-Ended Read and Pre-Charge

Figure 9A:
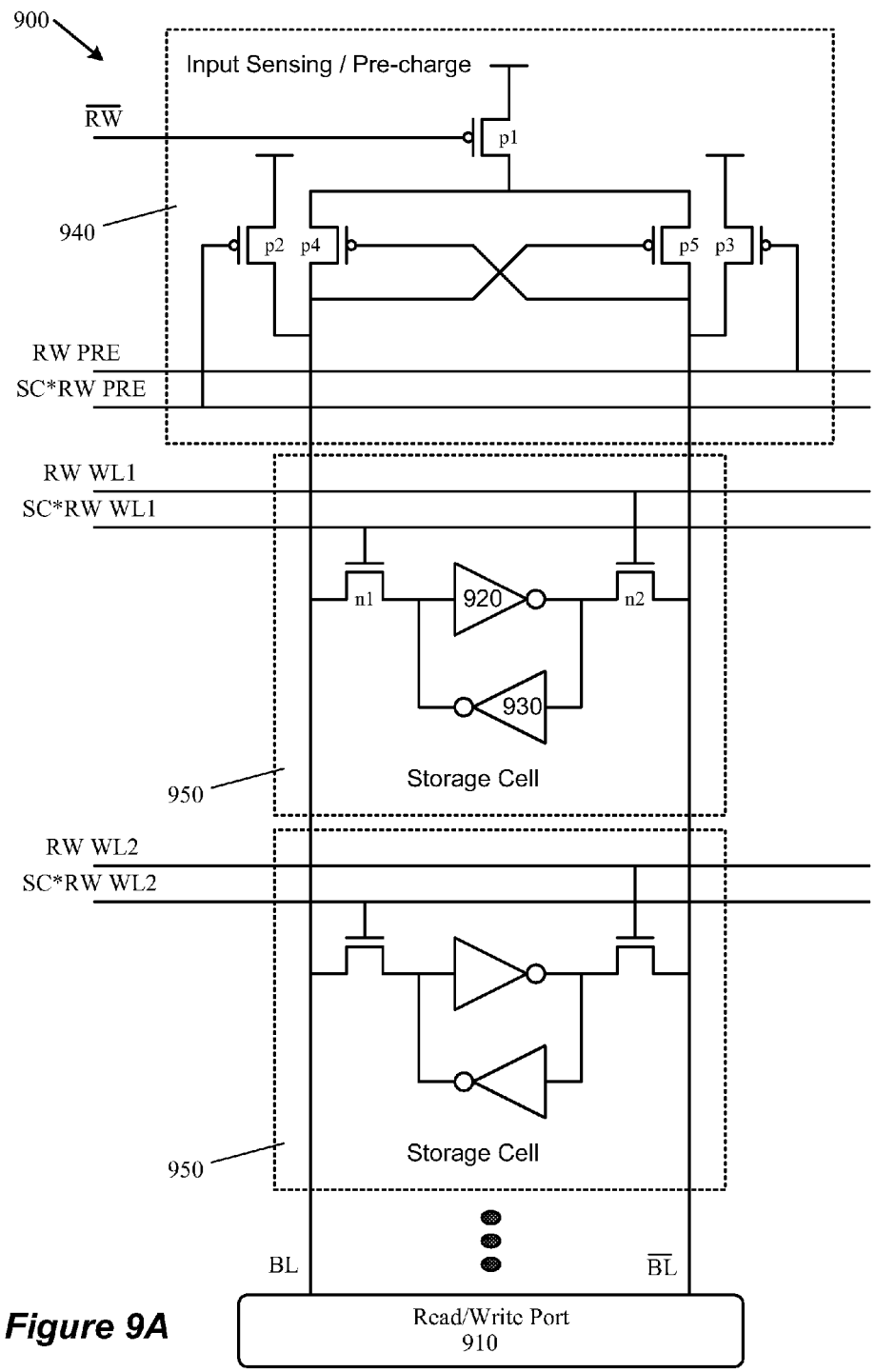
FIG. 9A illustrates a six transistor, single port, pre-charge, single-ended read storage cell of some embodiments.

FIG. 9A illustrates a column 900 of 6-T single port SRAM storage cells 950 using pre-charge of the bit lines and allowing a single-ended read operation. As shown, the column 900 includes multiple 6-T single port SRAM storage cells 950, a read/write port 910, three controllable pull-up transistor p1, p2, and p3, two cross-coupled pull-up transistors p4 and p5, a read/write pre-charge input (RW PRE), a sub-cycle read/write pre-charge input (SC*RW PRE), and a pair of complementary bit line outputs (BL and its complement). As shown, the 6-T single port SRAM storage cell using pre-charge includes, a pair of cross-coupled inverters 920 and 930, two controllable pass transistors n1 and n2, a read/write word line input (e.g. RW WL1), a sub-cycle read/write word line input (e.g. SC*RW WL1).

The single-ended read reduces the average dynamic power because only one bit line is switched instead of two complementary bit lines. The six transistor embodiment uses a smaller area than the ten transistor embodiment, allowing greater density of storage cells. Because there is no second port, both read and write operations are performed through the same port. In some instances, the bit line is connected through the read/write port 910 to a context switcher which will capture and re-time the data provided on the bit line. This context switcher may include a single-ended second stage connected to the read/write port 910, as will be described in reference to FIGS. 20A, and 20B below. In addition to a single-ended second stage, the context switcher 910 may include a decoder as described above in reference to FIG. 3, element 220.

In order to avoid corrupting the contents of the storage cell during a single-ended read operation, the bit line to be read is pre-charged to a logic high. The RW input controls the differential read and write operation while the SC input controls the single-ended read operation. Pre-charging of the bit line is accomplished by holding SC*RW PRE in a logic low state. This turns on pull-up transistor p2, thus bringing BL to a logic high. In order to avoid corrupting the contents of the storage cell during a differential read operation, both bit lines (BL and its complement) are pre-charged to a logic high. Pre-charging of BL's complement is accomplished by holding RW PRE at a logic low state. This turns on transistor p3, driving BL's complement to a logic high value. When RW is held at a logic low state, transistor p1 is turned on, connecting the sources of cross-coupled transistors p4 and p5 to the voltage supply.

During a write operation, both bit lines (BL and its complement) are accessed through the read/write port 910. When writing data to the cell 950, the complementary value being written is placed on BL and its complement, while RW WL and SC*RW WL are held at logic high states. By holding RW WL and SC*RW WL at logic high, both n1 and n2 are turned on, passing the values being driven at BL and its complement to the inputs of cross-coupled inverters 920 and 930. During storage, RW WL and SC*RW WL are held at logic low, thus turning off transistors n1 and n2, and inducing positive feedback between inverters 920 and 930 as described above. By holding RW's complement at a logic low, p1 is turned on, enabling the cross-coupled pull-up transistors p4 and p5.

During a single-ended read operation, only one of the bit lines is accessed through the read/write port 910, while the second bit line (BL's complement) is left floating and is not accessed through the read/write port 910. During a read operation, RW and SC*RW WL are held at logic high, while RW PRE and SC*RW PRE are held at logic high, thus turning on transistors n1 and turning off transistors p1 and p2. The bit line is driven by the output of the inverter 930 through transistor n1. If a logic low is held at the output of the inverter 930, for instance, BL is driven to a logic low by inverter 930.

The storage cell 950 may be used with any of the single-ended latches described below. In addition, one of ordinary skill in the art will recognize that the storage cell 950 may be implemented using different embodiments. For example, the storage cell 950 could be implemented without pre-charge.

Figure 9B:
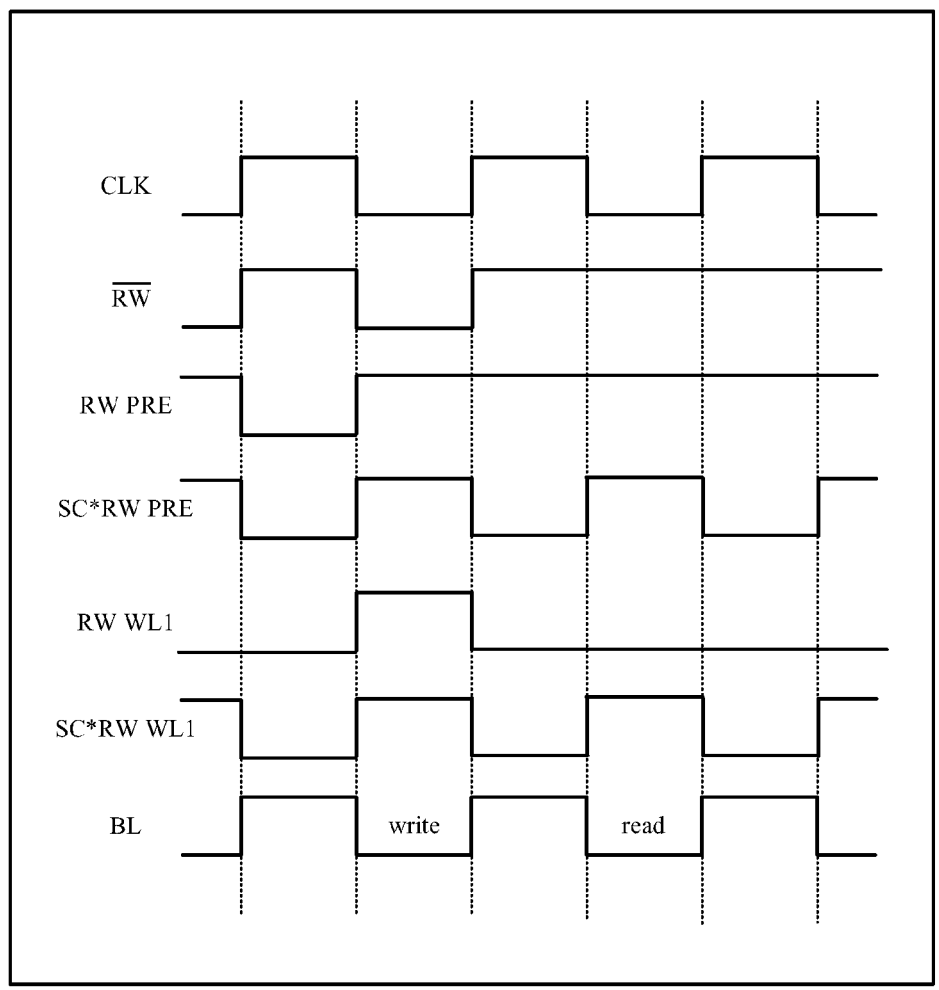
FIG. 9B illustrates the timing diagram of the circuit depicted in FIG. 9A of some embodiments.

FIG. 9B illustrates the timing diagram for the column 900 of storage cells described in reference to FIG. 9A above. As shown, the timing diagram includes the signals CLK, RW's complement, RW PRE, SC*RW PRE, RW WL1, SC*RW WL1, BL and BL's complement. Before a write operation, RW PRE and SC*RW PRE are brought to a logic low to pre-charge both bit lines of the storage cell column 900. When RW WL1 and SC*RW WL1 are brought to a logic high, the cell is enabled to perform a write operation as described above in reference to FIG. 9A. When a write operation is performed, the value on BL and its complement is stored in the cross coupled inverters 920 and 930 of the storage cell 950. Before a single-ended read operation, a single-ended pre-charge is performed by bringing SC*RW PRE to a logic low, while holding RW PRE at a logic high. This activates transistor p2, while transistor p3 is turned off. When SC*RW WL1 is brought to a logic high, the cell is enabled to perform a read operation as described above in reference to FIG. 9A. When a read operation is performed, the value stored by the cross-coupled inverters 920 and 930 is provided at the outputs (BL and its complement). Other storage cells 950 in the column 900 are read from or written to by activating other word lines (e.g. WL2 for the second cell in the column, etc.).

E. Six Transistor SRAM Single-Ended Read without Pre-Charge

Figure 10A:
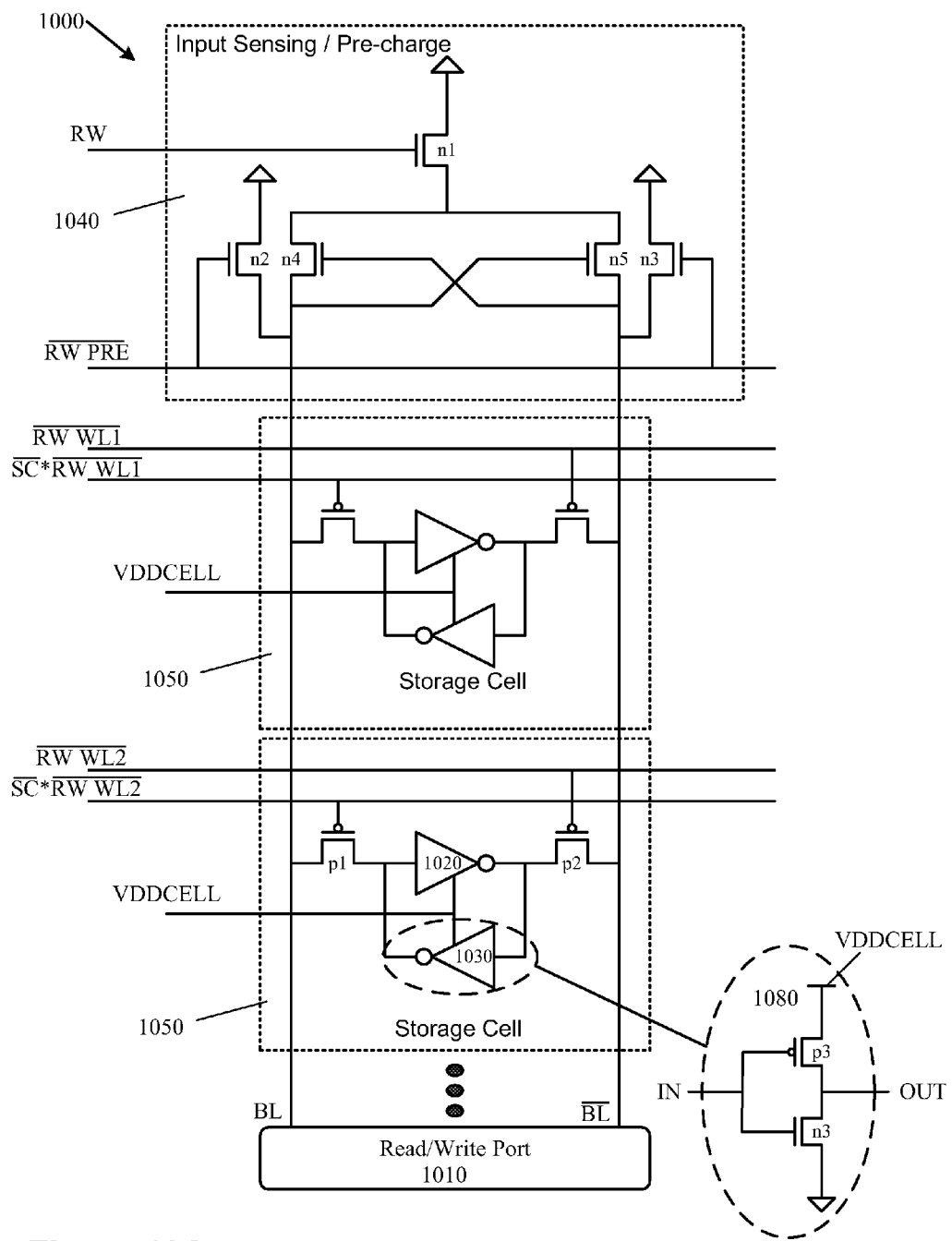
FIG. 10A illustrates a six transistor, single port, pre-charge write, no pre-charge read, single-ended read storage cell of some embodiments.

FIG. 10A illustrates a column 1000 of 6-T single port SRAM storage cells 1050 using pre-charge of the bit lines (BL and its complement) for a write operation, while allowing a single-ended read operation without pre-charging the bit lines. As shown in FIG. 10A, the storage element 1050 includes a read/write port 1010, two cross-coupled inverters 1020 and 1030, three controllable pull-down transistors n1, n2 and n3, two cross-coupled pull-down transistors n4 and n5, two controllable pass transistors, p1 and p2, a read/write input (RW), a read/write pre-charge input (complement of RW PRE), a read/write word line input (complement of RW WL), a sub-cycle read/write word line input (complement of SC*complement of RW WL), and a pair of complementary bit line outputs (BL and its complement).

The single-ended read saves power because only one bit line (instead of two) is switched. The six transistor embodiment uses a smaller area than the ten transistor embodiment, allowing greater density of storage cells. Because there is no second port, both read and write operations are performed through the same port. As shown in FIG. 10A, the bit lines are connected to a read/write port 1010 which may be connected to a context switcher that will capture and re-time the data provided on the bit line. During a write operation, both bit lines (BL and its complement) are accessed through the read/write port 1010. During a read operation, only one bit line is accessed through the read/write port 1010. The read/write port 1010 may include a single-ended second stage as will be described in reference to FIGS. 20A and 20B below. In addition to a single-ended second stage, read/write port 1010 may connect to a context switcher which may include a decoder as described above in reference to FIG. 3, element 220.

In order to avoid fighting between the contents of the cell and the cross-coupled transistors n4 and n5, before a configuration write operation the bit lines are discharged. Discharging of the bit lines is accomplished by holding the complement of RW PRE in a logic high state, while holding RW in a logic low state. This turns on transistors n2 and n3, pulling the bit lines to logic low values, while turning off transistor n1, disabling cross-coupled transistors n4 and n5. When RW is held at a logic high state and the complement of RW PRE is held at a logic low state, transistor n1 is turned on, while transistors n2 and n3 are turned off, thus leaving the bit lines at the discharge voltage.

During a write operation, the complementary value being written is placed on BL and its complement, while the complements of RW WL and SC*RW WL are held at logic low states and RW is held at a logic high state. By holding the complements of RW WL and SC*RW WL at logic low, both p1 and p2 are turned on, passing the values being driven at BL and its complement to the inputs of cross-coupled inverters 1020 and 1030. Turning on transistor n1 enables the cross-coupled pull-down transistors n4 and n5. During storage, RW WL and SC*RW WL are held at logic high, thus turning off transistors p1 and p2, and inducing reinforcing feedback between inverters 1020 and 1030 as described above.

The inverters 1020 and 1030 are connected a variable voltage supply (VDDCELL) in some embodiments. In some embodiments, the storage cells 1050 of the column 1010 are written at a lower supply voltage (VDDCELL) than is used on the rest of the circuit 1000, while the read operations are performed at the same supply voltage used in the rest of the circuit. In some embodiments, the reduced voltage write (or "assisted write") is used because the non pre-charged single-ended read circuit includes pmos pass transistors, and the assisted write increases the stability of the circuit. In other embodiments, the storage cell is always operated a lower supply voltage than is used on the rest of the IC.

During a single-ended read operation, RW is held at logic high and the complement of SC*RW WL is held at logic low, while the complement of RW PRE is held at logic low, thus turning on transistors p1 and n1, while turning off transistors n2 and n3. The bit line is driven only by the output of the inverter 1030 through transistor p1. If a logic low is held at the output of the inverter 1030, for instance, BL is driven to a logic low by inverter 1030.

The storage cell 1050 may be used with any of the single-ended latches described below. In addition, one of ordinary skill in the art will recognize that the storage cell 1050 may be implemented using different embodiments. For example, the storage cell 1050 could be implemented using a differential read.

Figure 10B:
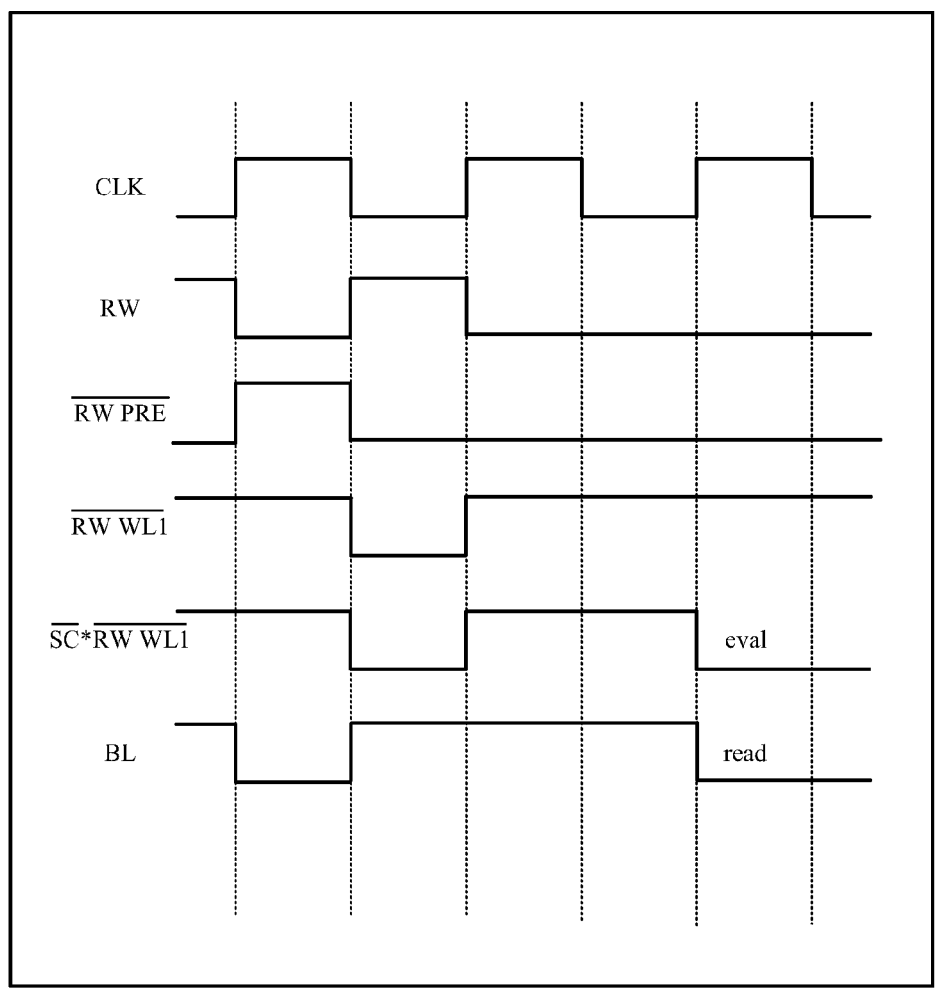
FIG. 10B illustrates the timing diagram of the circuit depicted in FIG. 10A of some embodiments.

FIG. 10B illustrates the timing diagram for the column 1000 of storage cells described in reference to FIG. 10A above. As shown, the timing diagram includes the signals CLK, RW, RW PRE's complement, RW WL1's complement, SC*RW WL1's complement, and BL. Before a write operation, RW PRE' complement is brought to a logic low to pre-charge both bit lines of the storage cell column 1000. When RW WL1's complement and SC*RW WL1's complement are brought to a logic low, the cell is enabled to perform a write operation as described above in reference to FIG. 10A. When a write operation is performed, the value on BL and its complement is stored in the cross coupled inverters 1020 and 1030 of the storage cell 1050. When SC*RW WL1's complement is brought to a logic low, the cell is enabled to perform a read operation as described above in reference to FIG. 10A. When a read operation is performed, the value stored by the cross-coupled inverters 1020 and 1030 is provided at the outputs (BL and its complement). Other storage cells 1050 in the column 1000 are read from or written to by activating other word lines (e.g. WL2 for the second cell in the column, etc.).

III. Context Switcher

The context switcher receives the data from the configuration data storage elements and provides data to the configurable circuits of the IC. Subsection A below describes several embodiments of the first stage of the context switcher. Next, subsection B describes several embodiments of the second stage of the context switcher. Subsection C follows that discussion with single stages or combined first and second stages. In subsection D, the decoder is described. Subsection E follows that discussion with a description of the various signal paths between the second stage and decoder. Finally, in subsection F a number of exemplary embodiments of the complete context switcher are described.

A. First Stage of Context Switcher

The first stage of the context switcher captures the data from the storage elements and provides its output data to the second stage of the context switcher or decoder, if applicable. The first stage may take differential or single-ended signals as its inputs. The first stage may be clocked or unclocked. In some cases, the storage elements described above are used at the first stage of the context switcher. Several embodiments of the first stage are described below.

1. SR Latch

Figure 11:
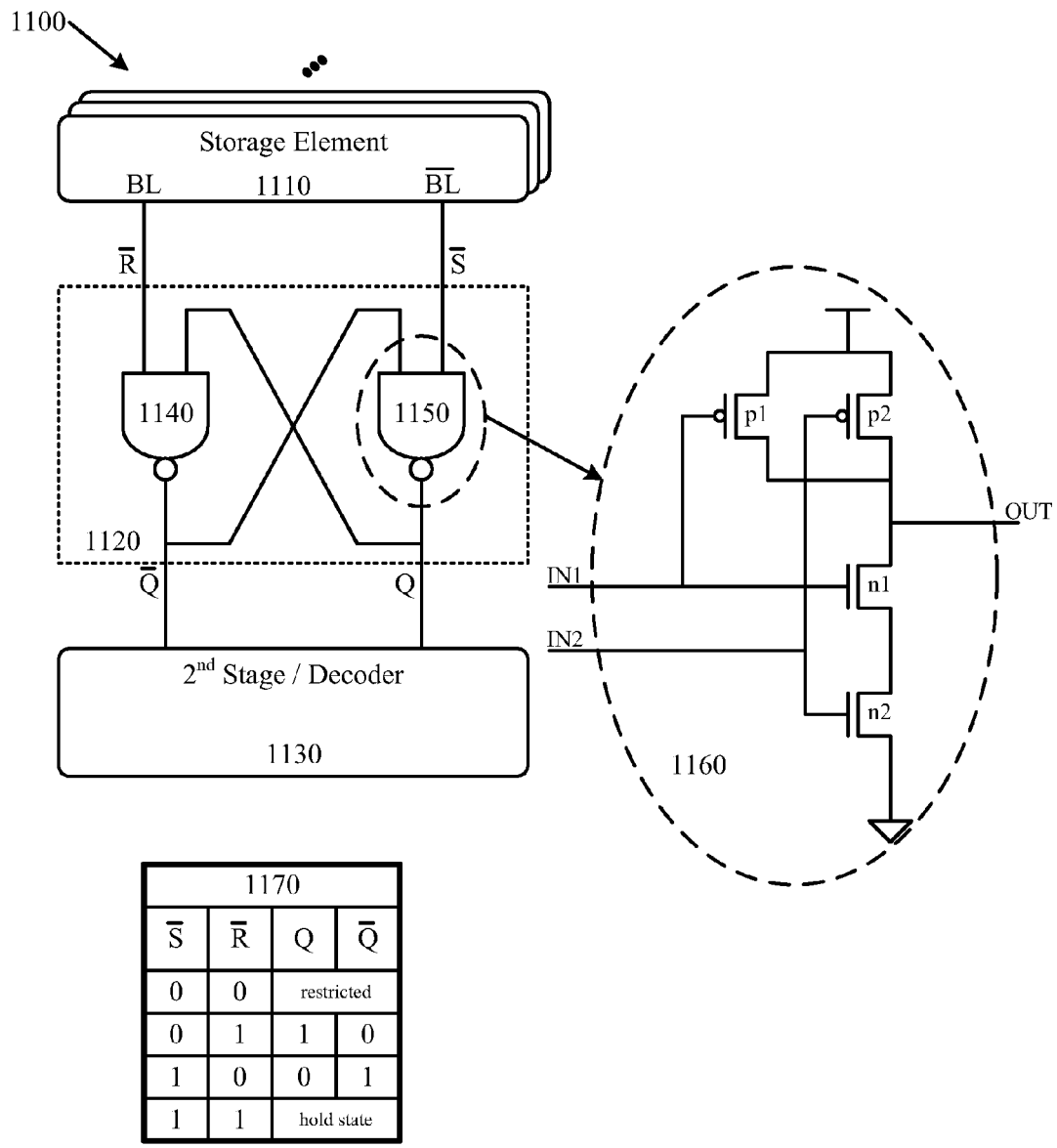
FIG. 11 illustrates an SR latch used as a first stage of the context switcher of some embodiments.

FIG. 11 illustrates an SR latch 1120 used as a first stage in some embodiments of the context switcher 120. As shown, the SR latch 1120 connects to a column of storage elements 1110 and a second stage or decoder 1130, the storage latch includes two NAND gates 1140 and 1150, where each NAND gate includes two pull-up transistors p1 and p2, and two pull-down transistors n1 and n2.

As shown in the figure, the latch takes its inputs, the complements of R and S, from the bit line outputs of a column of storage cells 1110. The individual bit storage cells contained within the column could be any one of the differential-read cells described above in reference to FIGS. 6-8. The latch passes its outputs to either a second stage or decoder 1130. This second stage or decoder 1130 could be any one of the second stage or decoder variations shown in FIG. 3 (e.g. elements 120b, 120c, or 120d).

The CMOS transistor-level embodiment of the NAND gates is shown in breakout section 1160 of FIG. 11. As shown, IN1 is tied to the gates of transistors p1 and n1, while IN2 is tied to the gates of transistors p2 and n2. If either IN1 or IN2 (or both) is brought to a logic high state, the respective parallel pmos transistor p1 or p2 (or both) is turned on, and the output of the NAND gate is driven to a logic high state through the enabled pmos transistor (or transistors). Conversely, because the nmos transistors n1 and n2 are connected in series, both IN1 and IN2 must be at a logic high level to turn on both transistors n1 and n2 and drive the output of the NAND gate to a logic low value.

The operation of the complete SR latch 1120 is shown by the truth table of FIG. 1170. As shown in the table, when both inputs are held at logic low, the latch is in a so-called restricted state. This is because when both inputs are held at logic low, both outputs are forced high, thus breaking the logical equation Q=complement (complement Q). When both inputs are at logic high, the latch is in a hold state. When both inputs are logic high, whichever output was previously high drives the input of the other NAND gate, thus causing the output of the other NAND gate to stay at logic low because both inputs are logic high. In addition, the NAND gate with a high output continues to receive the output of the other NAND gate at one of its inputs. Since the output of the other NAND gate is logic low, the output of the first NAND gate remains logic high. In the embodiments described above, the restricted state is not used because the bit lines of the column of storage cells 1110 are either complementary, or both pre-charged to a logic high. When both bit lines are pre-charged to logic high, the SR latch is placed in its hold state.

During normal operation of the latch, when S's complement is logic low and R's complement is logic high, the Q output of the latch is driven to logic high because S's complement is logic low at the input to the NAND gate 1150. Once the output of the NAND gate 1150 is driven to a logic high, both inputs of the other NAND gate 1140 are at a logic high level, and the complementary Q output is a logic low. Thus, the data is latched when both inputs to NAND gate 1140 are at logic high and both inputs of NAND gate 1150 are at a logic low. Conversely, when r's complement is logic low and S's complement is logic high, the complement of the Q output of the latch is driven to logic high because R's complement is logic low at the input to the NAND gate 1140. Once the output of the NAND gate 1140 is driven to a logic high, both inputs of the other NAND gate 1150 are at a logic high level, and the Q output is a logic low. Thus, the data is latched when both inputs to NAND gate 1150 are at logic high and both inputs of NAND gate 1140 are at a logic low.

The latch 1120 may be used with any of the differential second stages (e.g. second stage/decoder, decoder/second stage, etc.) described below. In addition, one of ordinary skill in the art will recognize that the latch 1120 may be implemented using different embodiments. For example, the latch 1120 could be implemented using NOR gates.

2. Single-Ended Weak Keeper

Figure 12:
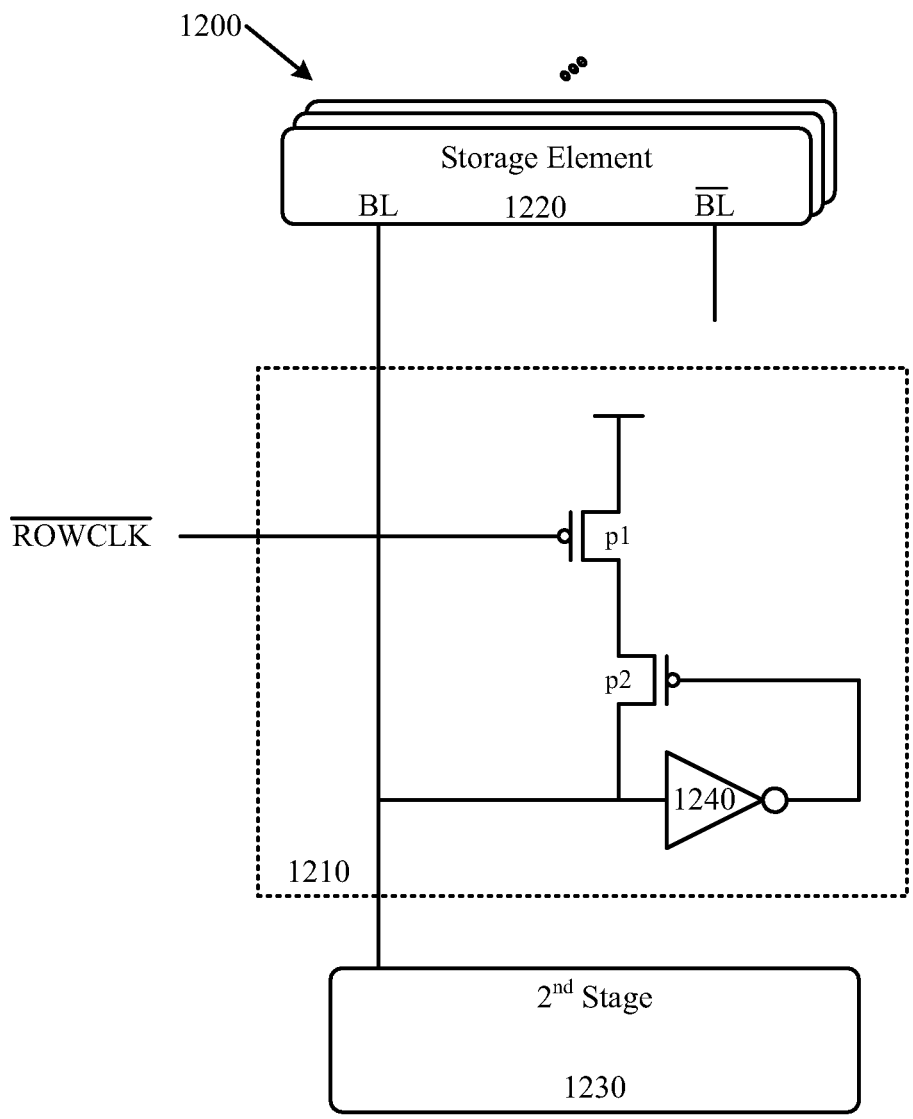
FIG. 12 illustrates a weak keeper pull-up latch and storage element as a first stage of the context switcher of some embodiments.

FIG. 12 illustrates a single-ended weak keeper 1210 and column of storage elements 1220 that implement the first stage of some embodiments. As shown, the weak keeper 1210 is connected to a column of storage elements 1220 and a second stage 1230, while the weak keeper includes a controllable pull-up transistor p1, a pull-up transistor p2, an inverter 1240, and a row clock input (complement of ROWCLK).

The weak keeper is used so the storage element does not have to source current through an nmos pass transistor when delay between the pre-charge and read or write is long (i.e. clock frequencies below some minimum limit). As shown in the figure, the weak keeper takes one input from the BL output of the column of storage cells 1220. This storage cell could be a single-ended read cell with pre-charge as described above in reference to FIG. 9A. The weak keeper 1210 passes its outputs to either a second stage 1230. This second stage 1230 could be any second stage configuration that requires only a single-ended input.

One embodiment of the weak keeper is shown in section 1210 of FIG. 12. As shown in the figure, the weak keeper 1210 includes two series pull-up transistors p1 and p2. Transistor p1 is controllable. The weak keeper also includes an inverter 1240 that drives the second pull-up transistor p2. In some embodiments, the transistors p1 and p2 are sized with relatively long gate lengths and are placed in series to avoid fighting with the active storage cell connected to the bit lines during a read or to the source driving the cell during a write. In addition, the ratio of the sizes of pmos to nmos transistors that make up the inverter 1240 may be selected such that the inverter has a relatively high switching threshold (e.g. p:n is 4:1 instead of a more typical ratio of 2:1 for a mid-point threshold inverter) so that it turns off the transistor p2 when the pre-charged bit line's (BL) voltage level drops below a relatively higher input voltage than an inverter with typical or other sizing.

When reading data from the storage cell, after a pre-charging operation, the complement of SC is held at logic low. When the complement of SC is held at logic low, transistor p1 is turned on, enabling the weak keeper circuit. The weak keeper is used to source current and hold BL at a logic high after the pre-charge operation. Without the weak keeper 1210, if the stored value to be output on BL is a logic high, the storage cell is required to source current through its nmos pass transistor to drive the BL. Whereas in differential-read embodiments, the source current is provided by the cross-coupled pull-up devices, during a single-ended read the weak keeper is required.

During a storage operation, the complement of SC is switched to a logic low level. When the complement of SC is switched to logic low, transistor p1 is turned on. Thus, if the output of the inverter 1240 is a logic low (e.g. after BL has been pre-charged), both transistors p1 and p2 are turned on, which drives the input of the inverter 1240 to a logic high, which reinforces the logic low at its output. If the output of the inverter 1240 is at a logic high when the complement of SC is switched to a logic low, transistor p2 is not turned on, and there is nothing driving the input of the inverter 1240.

The weak keeper 1210 may be used with any of the single-ended second stages described below. In addition, one of ordinary skill in the art will recognize that the weak keeper 1210 may be implemented using different embodiments. For example, the weak keeper 1210 could be implemented with a different switching threshold.

3. Storage Cell as First Stage

Figure 13:
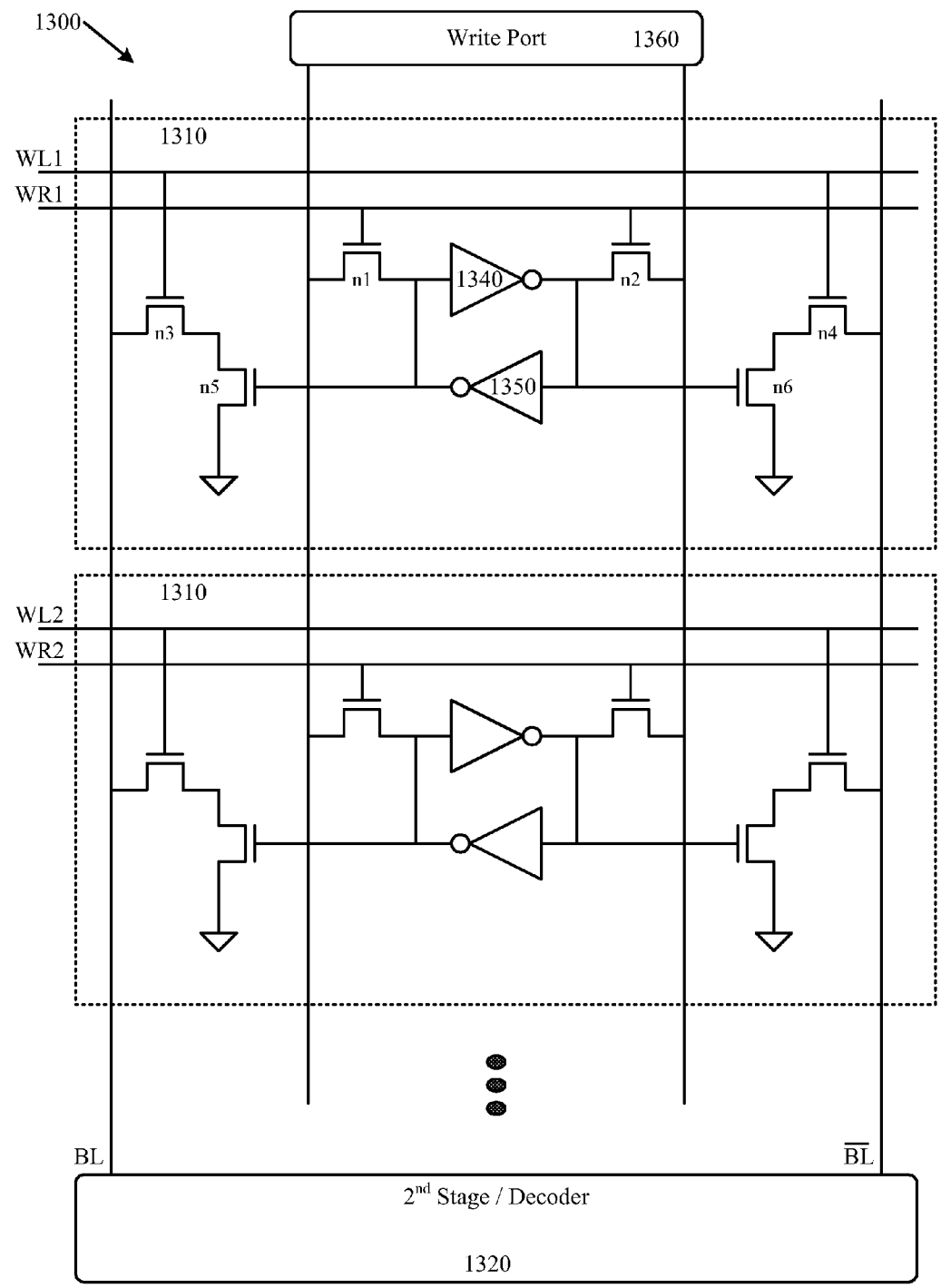
FIG. 13 illustrates a ten transistor, dual port, no-pre-charge storage cell as a first stage of the context switcher of some embodiments.

FIG. 13 illustrates the use of a column of storage cells 1310 as a first stage. Each storage element within the column 1310 is the same as the storage element that was described above in reference to FIGS. 6A and 6B. As described above, the isolating transistors n5 and n6 eliminate the need to do a pre-charge and also prevent the storage element from being corrupted during a read operation.

As shown in FIG. 13, the bit line outputs of the column of storage elements 1310 are passed to the second stage or decoder 1320 of the context switcher. This second stage or decoder 1320 may be any one of the embodiments described in reference to FIG. 3 above (e.g. 120a, 120e, 120f, 120g, 120h, or 120i), or other embodiments of the second stage or decoder.

The column of storage cells 1310 may be used with any of the differential second stages described below. In addition, one of ordinary skill in the art will recognize that the storage cell 1310 may be implemented using different configurations. For example, the storage cell 1310 used as the first stage may be single port instead of dual port.

4. Odd/Even Multiplexer with Storage Cell as First Stage

Figure 14A:
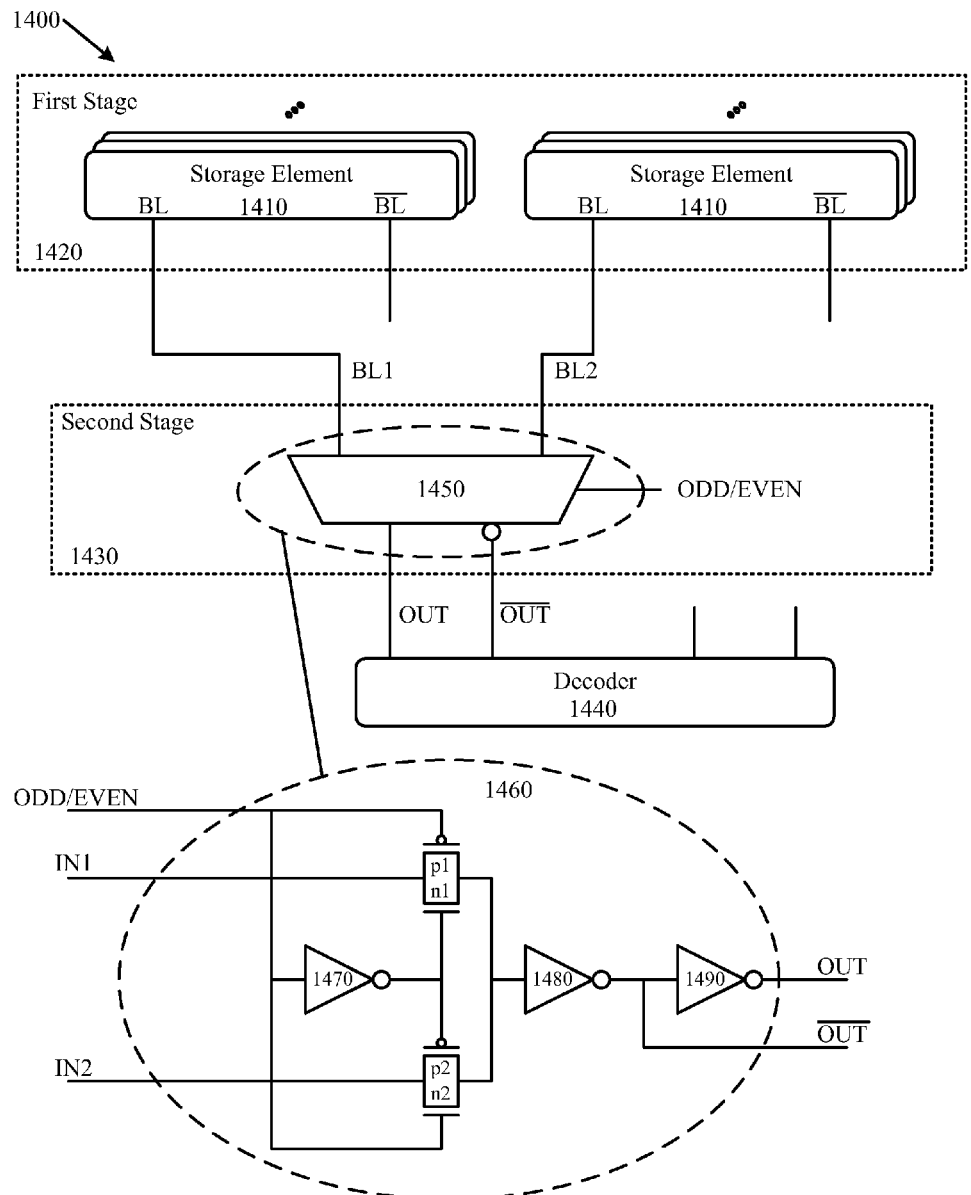
FIG. 14A illustrates a storage element as a first stage of the context switcher of some embodiments.

FIG. 14A illustrates the use of two columns of storage cells 1410 as a first stage 1420 of a context switcher 1400. As shown, the context switcher 1400 includes two columns of storage elements 1410 that act as a first stage 1420, a second stage 1430, a decoder 1440, a 2:1 multiplexer 1450, and a transistor-level circuit description 1460 of the 2:1 multiplexer 1450. As shown, the 2:1 multiplexer includes three inverters 1470, 1480, and 1490, and four pass transistors n1, n2, p1 and p2.

As shown in the figure, the first stage 1420 is arranged in two columns 1410 in this example. The storage cells contained in the columns may be any of the storage cells described in reference to FIGS. 6A-10B above. For instance, the storage cells 1410 may be single or dual port, single-ended or differential read, etc. In some embodiments that use a single-ended read operation, a weak keeper 1210 as described above in reference to FIG. 12 is included. Together with the second stage 1430 and decoder 1440, the storage cell as first stage shows one embodiment of the context switcher described above in reference to FIG. 3, element 120a. The second stage of this embodiment includes a 2:1 multiplexer 1450 which is connected to the storage cells at its inputs and the decoder or configuration circuits 1440 at its output.

As shown in FIG. 14A, the storage elements 1410 each pass the value on their respective bit lines to the odd-even multiplexer 1450. The odd-even multiplexer is equivalent to a second or re-timing stage 1430 of the context switcher because when one input is selected to be passed to the output of the multiplexer 1450, the other input does not have to be stabilized yet. It is only when the second input is selected to be passed to the output of the multiplexer 1450 that the value has to be stable. Once the second input is selected, the first input does not have to be stable, and thus can capture new data from the other column of storage elements.

The cmos embodiment of the odd-even multiplexer is shown in breakout section 1460 of FIG. 14A. When the ODD/EVEN input is logic high, the output of inverter 1470 is driven to a logic low. In this manner, both transistors p2 and n2 are turned on, and the value at IN2 is passed to the input of inverter 1480. Conversely, when the ODD/EVEN input is logic low, the output of inverter 1470 is driven to a logic high. Thus, both transistors p1 and n1 are turned on, and the value at IN1 is passed to the input of inverter 1480. In either case, the value placed at the input of inverter 1480 is inverted and passed to the input of inverter 1490. In this manner, the odd-even multiplexer 1450 creates a complementary set of signals from the single-ended signals provided to the multiplexer. These complementary signals may then be passed to a decoder 1440 (along with the complementary signals from a second storage cell output) if the original data has been encoded.

One of ordinary skill in the art will recognize that the first stage 1420 may be implemented using different configurations. For example, the columns of storage elements 1410 used as the first stage 1420 may be dual port instead of single port.

Figure 14B:
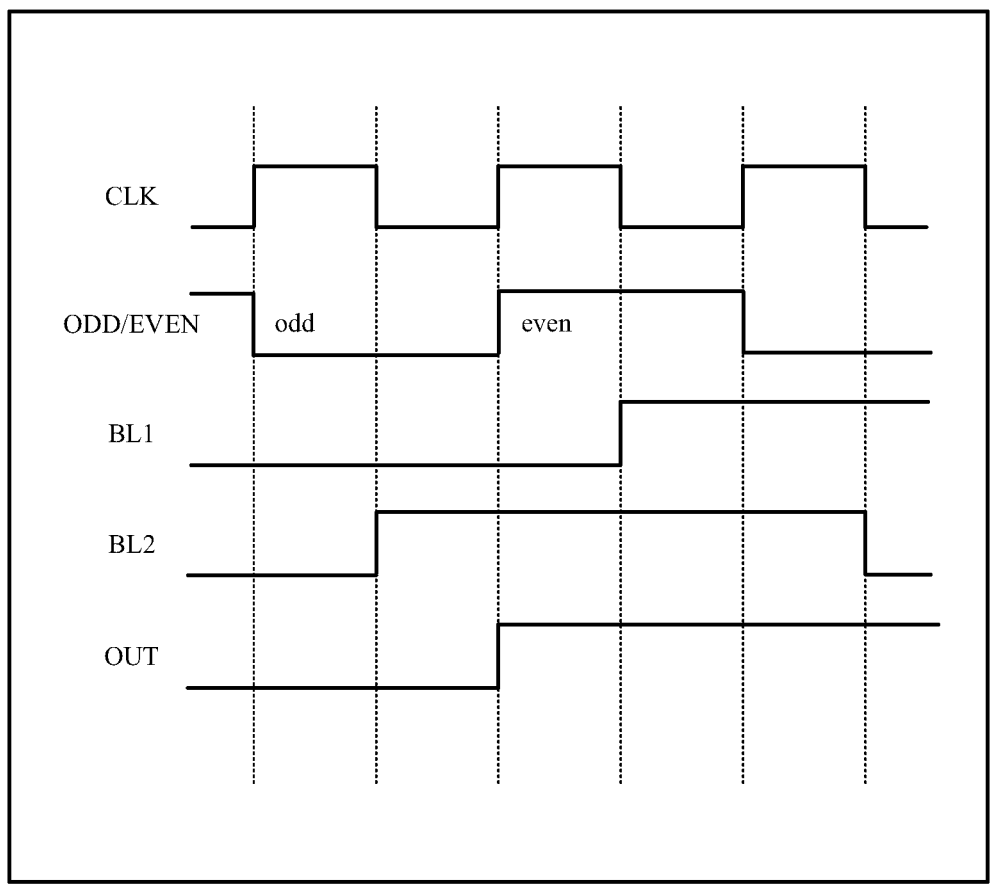
FIG. 14B illustrates the timing diagram of the circuit depicted in FIG. 14A of some embodiments.

FIG. 14B illustrates the timing diagram for the context switcher 1400 described in reference to FIG. 14A above. As shown, the timing diagram includes the signals CLK, ODD/EVEN, BL1, BL2, and OUT. In the example shown in FIG. 14B, when ODD/EVEN is low, the odd input (BL1) to the multiplexer 1450 is selected, and the output (OUT) is at logic low. When ODD/EVEN changes to logic high, the even input (BL2) to the multiplexer 1450 is selected, and the output (OUT) changes its value to a logic high, which is the value on BL2.

5. Storage Cell Q Node Tapped Directly

Figure 15A:
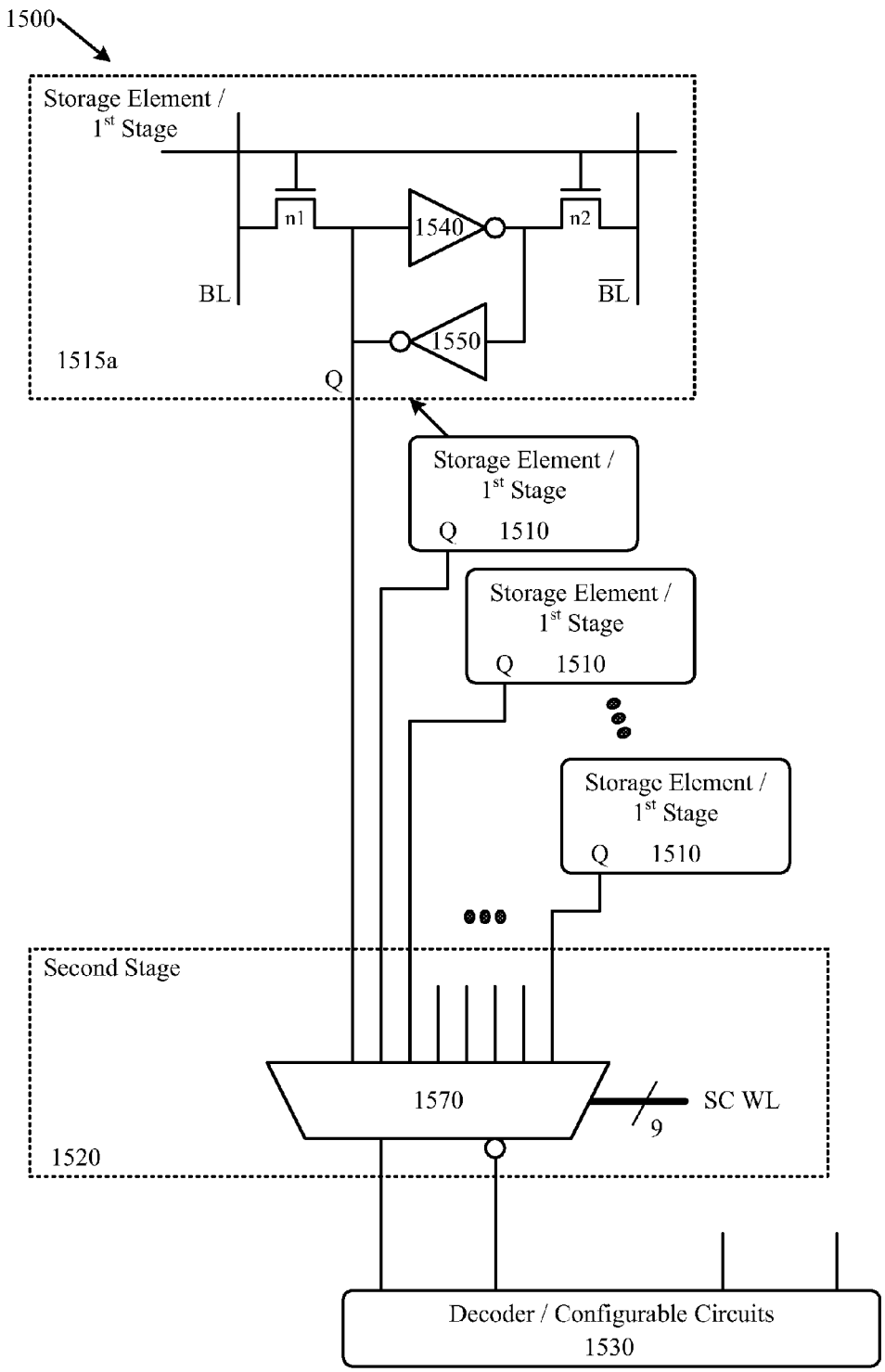
FIG. 15A illustrates a Q node storage element as a first stage of the context switcher of some embodiments.

FIG. 15A illustrates the use of a storage element 1510 as a first stage of the context switcher. As shown, the context switcher 1500 includes multiple first stages or storage elements 1510, a second stage 1520, a decoder or configurable circuits 1530, two inverters 1540 and 1550 and two pass transistors n1 and n2 for each storage element 1510, and a single-stage multiplexer 1570.

The Q node is tapped directly because the port may be used for other operations and to save power. Power is saved when the Q node is tapped directly because the bit lines and their large capacitive loads do not have to be switched. In some embodiments, both the Q node and its complementary node are tapped directly. The storage cells may be any of the storage cells described in reference to FIGS. 6A-10B above. For instance, the storage cells 1510 may be single or dual port, single-ended or differential read, etc. An example storage cell is shown in breakout section 1515a. When combined with the second stage 1520 and decoder 1530, the storage element as a first stage shows one embodiment of the context switcher described above in reference to FIG. 3, element 120h.

As shown in FIG. 15A, the storage element 1510 passes the value on its Q node (i.e. the output of inverter 1550) to one input of the single-stage multiplexer 1570 that makes up the second stage 1520 of this embodiment of the context switcher. The multiplexer is depicted with 9 control inputs, but other embodiments could use, e.g., four encoded control bits. The embodiment of the odd-even multiplexer is described in detail below in reference to FIG. 22.

Figure 15B:
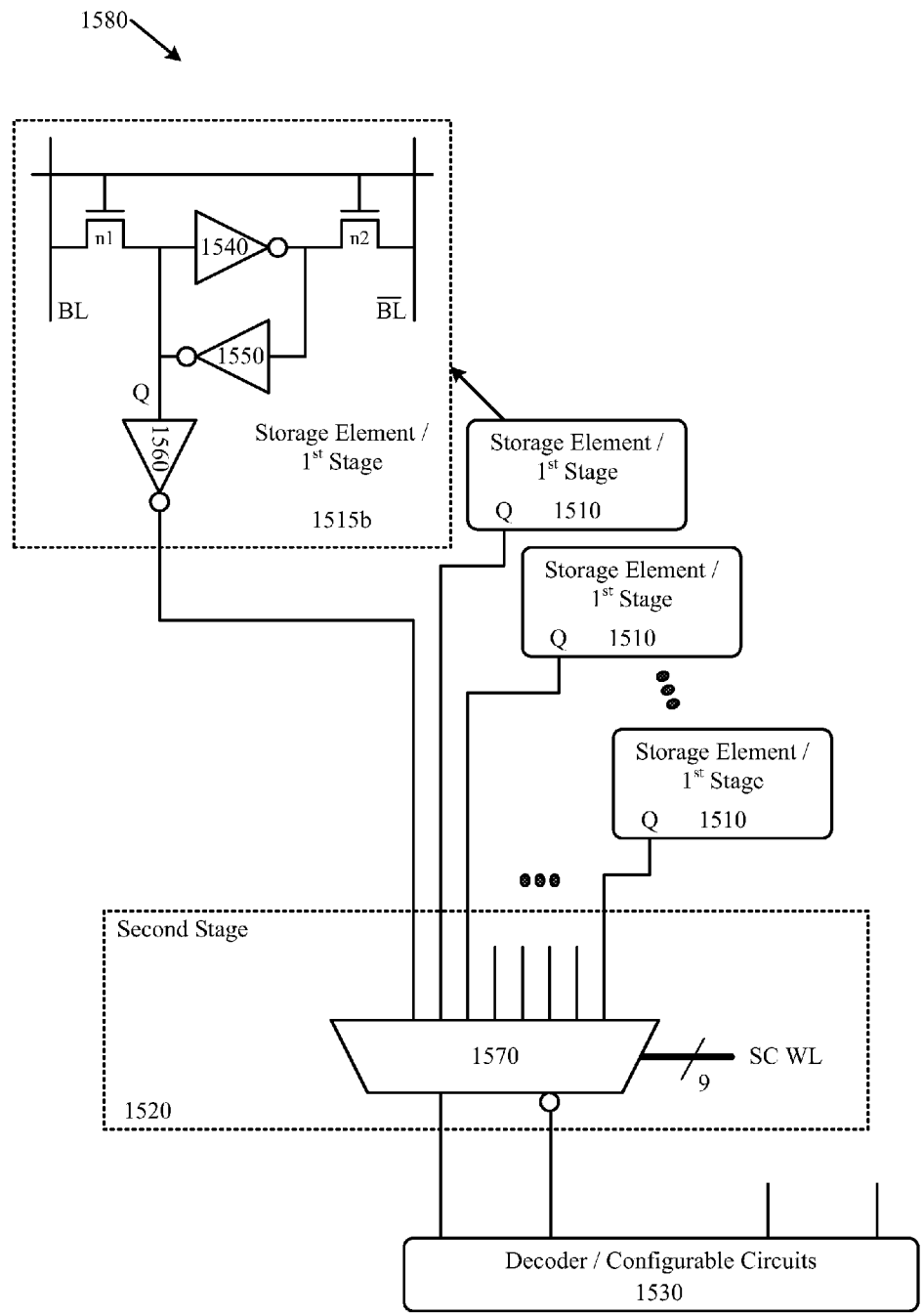
FIG. 15B illustrates a buffered Q node storage element as a first stage of the context switcher of some embodiments.

FIG. 15B illustrates an alternate embodiment where the storage element 1510 is used as a first stage of the context switcher. As shown in breakout section 1515b, the storage cell includes a buffering inverter 1560 at its output to prevent interference with or corruption of the internal Q node of the storage cell 1515b.

One of ordinary skill in the art will recognize that the context switchers 1500 and 1580 may be implemented using different configurations. For example, the multiplexer 1570 could be implemented with more or fewer inputs and/or outputs.

Figure 15C:
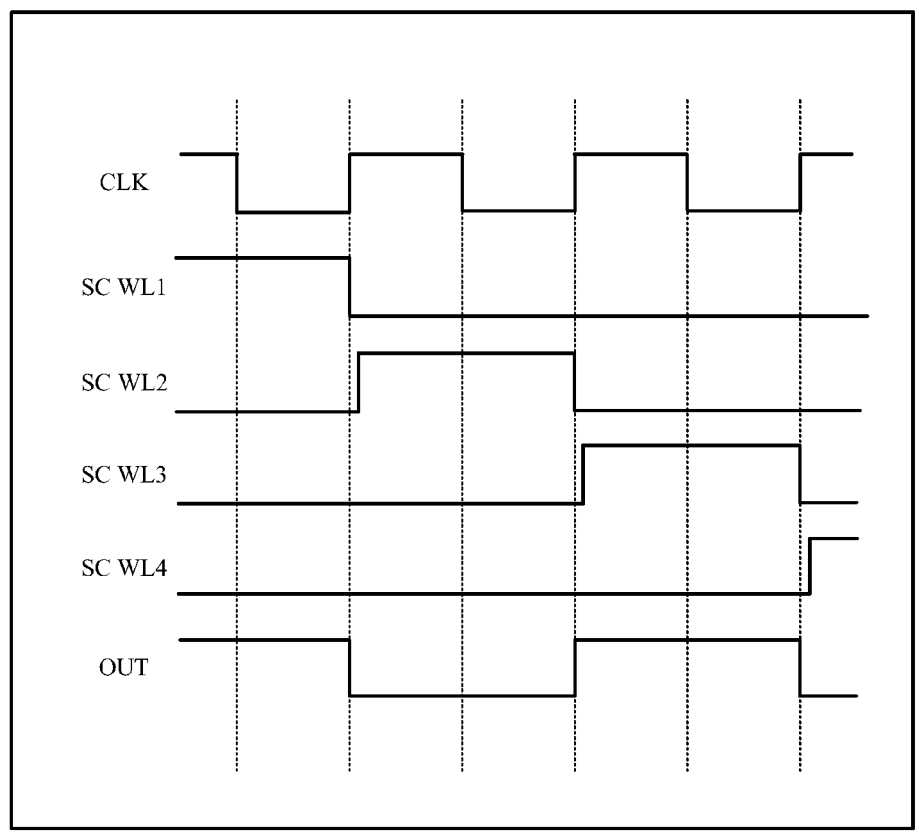
FIG. 15C illustrates the timing diagram of the circuit depicted in FIGS. 15A and 15B of some embodiments.

FIG. 15C illustrates the timing diagram for the context switchers 1500 and 1580 described in reference to FIGS. 15A and 15B above. As shown, the timing diagram includes the signals CLK, ST WL1, ST WL2, ST WL3, ST WL4, and OUT. In the example shown in FIG. 15C, ST WL1 is high, selecting the first input to the multiplexer 1570, and passing its value to the output of the multiplexer (OUT). When ST WL2 is logic high, selecting the second input to the multiplexer 1570, and passing its value to the output of the multiplexer (OUT). Thus, each input is individually passed to the output in sequence. In other embodiments, the sequence of input selections may vary. For instance, only a subset of inputs could be selected, or inputs could be selected in non-sequential order. In some embodiments it is important not to have overlap between the input select signals so that the storage elements are not coupled through the multiplexer's 1570 output node.

B. Second Stage of Context Switcher

The second stage of the context switcher is used to synchronize the data from the first stage for output to the configurable circuits of the IC. The second stage may take differential or single-ended signals as its inputs. In some cases, the second stage is combined with the first stage of the context switcher. Several embodiments of the second stage are described below.

1. Transparent Latch

Figure 16A:
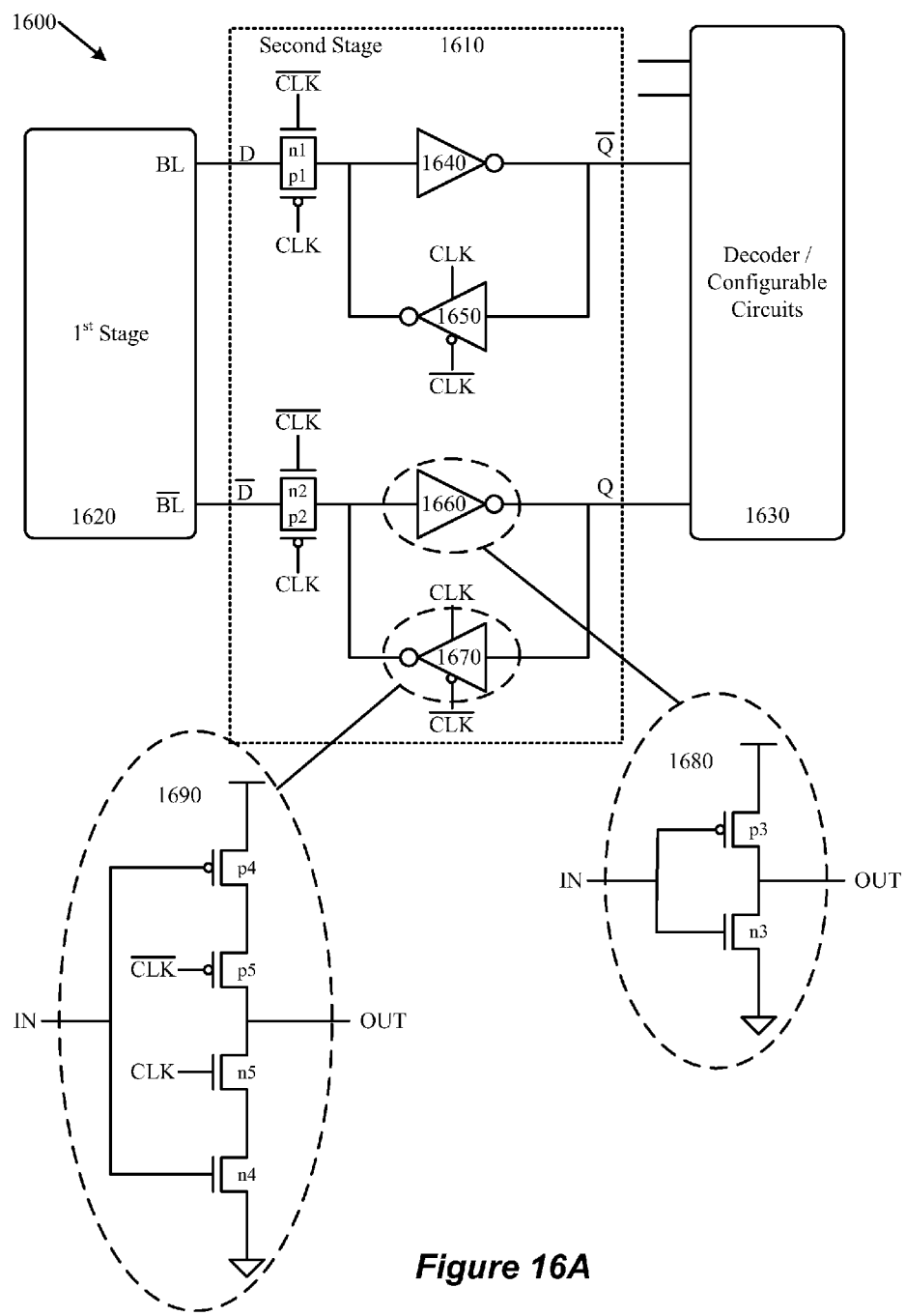
FIG. 16A illustrates a second stage of the context switcher of some embodiments.

FIG. 16A illustrates a transparent latch 1610 that implements the second stage of the context switcher 1600 of some embodiments. As shown, the transparent latch 1610 includes a connection to a first stage 1620, a connection to a decoder or configurable circuits 1630, two pairs of cross-coupled inverters 1640 and 1650 and 1660 and 1670, where one inverter 1680 of each pair includes a pull-up transistor p3 and a pull-down transistor n3 and each inverter 1690 includes two pull-up transistors p4 and p5 and two pull-down transistors n4 and n5, and four pass transistors n1, n2, p1 and p2.

Combined with the first stage 1620 and decoder 1630, the transparent latch 1610 shows one embodiment of the context switcher described above in reference to FIG. 3, element 120b, 120c, 120e or 120f. As shown in FIG. 16A, the latch takes its input from the BL outputs of a first stage 1620. The first stage could be any of the differential-read first stages described above in reference to FIGS. 11 and 13. In some embodiments, the first stage is one of the storage elements described above in reference to FIGS. 6A-10B. The latch passes its outputs to either a decoder or the IC's configurable circuits 1630. In some embodiments, the decoder 1630 is needed because the configuration data has been previously encoded. In some of these embodiments, the decoder may be placed before the transparent latch of FIG. 16A. Some embodiments of the decoder 1630 will be described below in reference to FIG. 25A, 25B, or 25C.

As shown in FIG. 16A, the transparent latch 1610 takes its inputs (D and its complement) from the first stage's 1620 complementary BL outputs. Each input is passed through a transmission gate. For instance, the D input passes through a transmission gate made of transistors p1 and n1. The use of a transmission gate instead of a single nmos or pmos pass transistor is preferred because the transmission gate provides better performance over the full swing of input values. When CLK is logic high, and its complement is logic low, the transmission gates are disabled, and the outputs of the first stage 1620 are isolated from the inputs and outputs of the storage inverters 1640, 1650, 1660, and 1670. When CLK is logic low and its complement is logic high, the transmission gates are turned on, and the outputs of the first stage 1620 drive the inputs of the inverters 1640 and 1660.

Also shown in FIG. 16A is the transistor level embodiments of the inverters 1660 and 1670 (which are the same as inverters 1640 and 1650, respectively). As shown in breakout section 1680, the first inverters 1640 and 1660 are typical cmos inverters with single nmos and pmos transistors. The inverters 1650 and 1670 are clock-enabled. When CLK is logic high, and its complement is logic low, transistors p5 and n5 are turned on, and the inverter 1690 functions like a normal cmos inverter. Thus, when the inverter 1690 is clock-enabled, a logic high on the input turns on n4 and drives the output to a logic low through n4 and n5, while a logic low on the input turns on p4 and drives the output to a logic high through p4 and p5.

During a write operation, CLK is logic low, and the transmission gates are enabled. Thus, if the outputs of the first stage 1620 drive the inputs of inverters 1640 and 1660. The outputs of the inverters 1640 and 1660 drive the second inverters 1650 and 1670. The second inverters 1650 and 1670 are disabled when CLK is logic low (and its complement is logic hi), which leaves their outputs floating, and thus they do not fight the outputs of the first stage 1620 during a write.

During a storage or read operation, CLK is logic high and its complement is logic low. This disables the transmission gates and disconnects the outputs of the first stage 1620 from the inputs of the inverters 1640 and 1660. When CLK is logic high (and its complement is logic lo), the inverters 1650 and 1670 are also enabled, thus inverting the values at the outputs of the inverters 1640 and 1660, and then reinforcing the value at the inputs of the inverters 1640 and 1660.

One of ordinary skill in the art will recognize that the transparent latch 1610 may be implemented using different embodiments. For example, the transparent latch 1610 could be implemented as a single-ended latch instead of a differential latch.

Figure 16B:
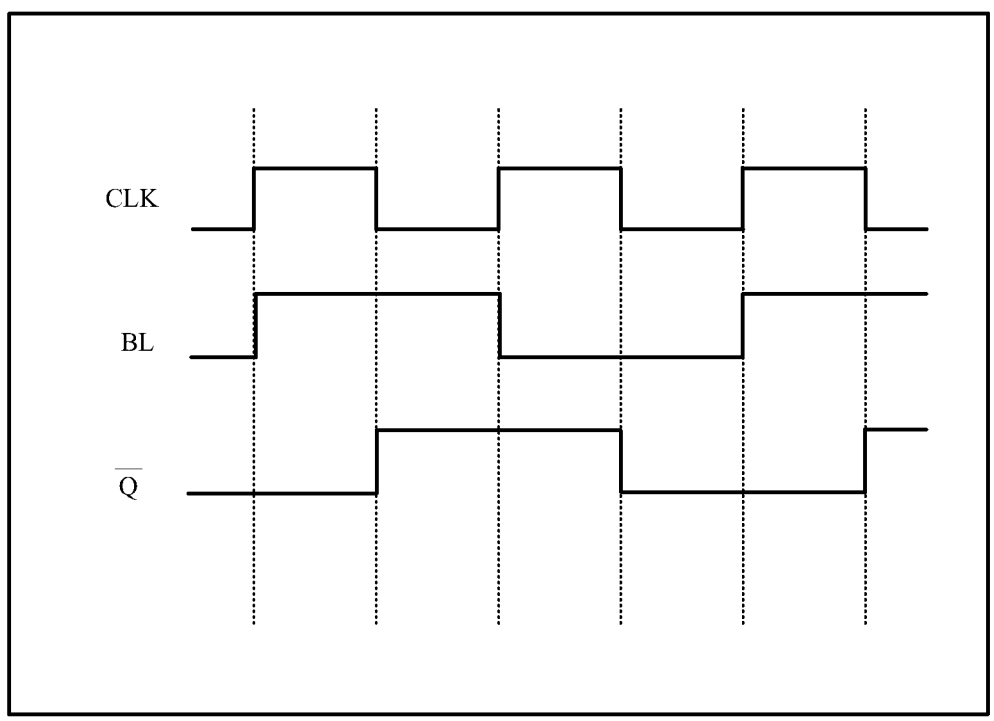
FIG. 16B illustrates the timing diagram of the circuit depicted in FIG. 16A of some embodiments.

FIG. 16B illustrates the timing diagram for the context switcher 1600 described in reference to FIG. 16A above. As shown, the timing diagram includes the signals CLK, BL, and Q's complement. In the example shown in FIG. 16B, the value at the second stage's 1610 input (BL) is a passed to the second stage's output (Q's complement) on CLK's falling edge. On CLK's rising edge, the previously stored value is held at the output (Q's complement).

2. Pulsed Latch

Figure 17A:
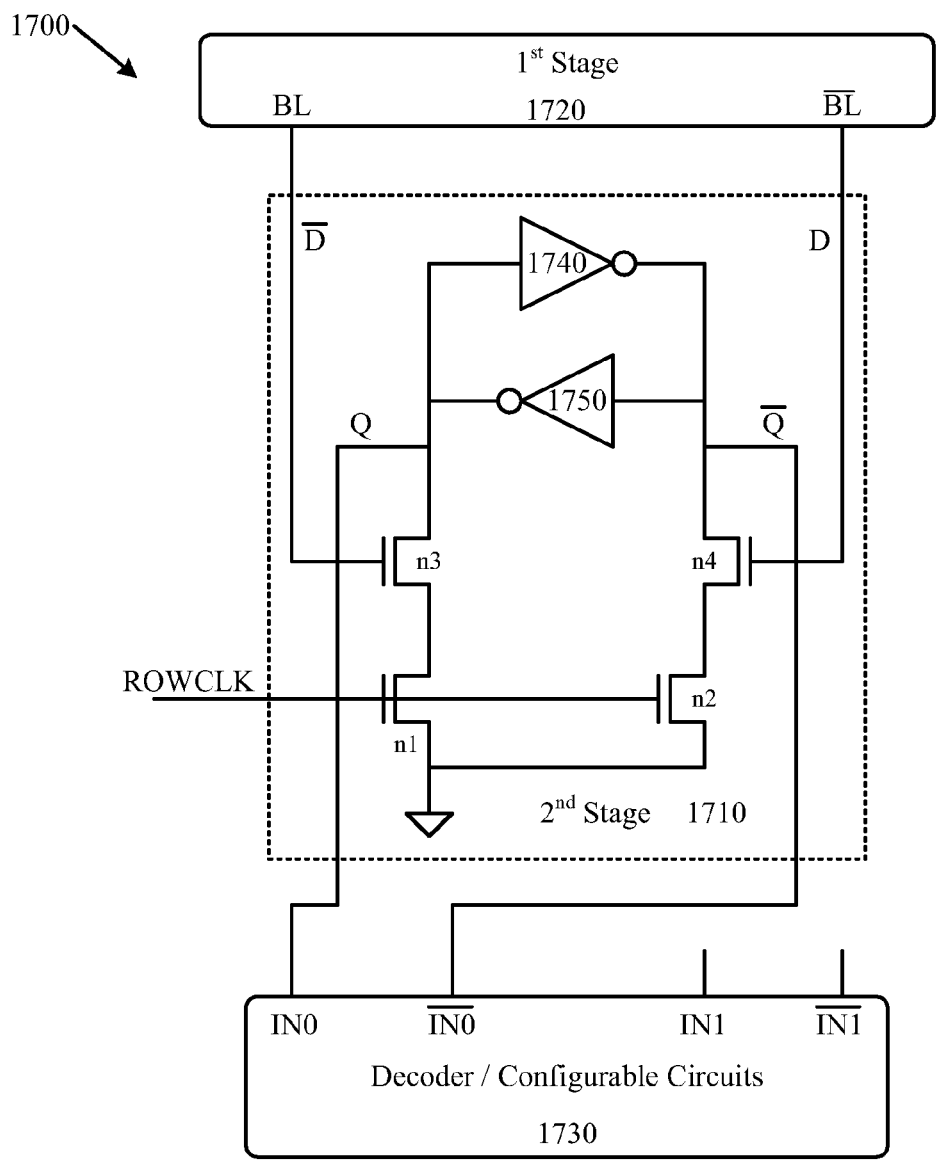
FIG. 17A illustrates a pulsed latch as a second stage of the context switcher of some embodiments.

FIG. 17A illustrates a pulsed latch 1710 that implements the second stage of the context switcher 1700 of some embodiments. As shown, the pulsed latch 1710 includes a connection to the first stage 1720, connections to the decoder or configurable circuits 1730, a pair of cross-coupled inverters 1740 and 1750, two controllable pull-down transistors n1 and n2, and two pull-down transistors n3 and n4. In some embodiments, pulsed latches receive a clock input that is pulsed (i.e. the duration of the signal is less than one-half clock cycle), while in other embodiments, the pulse input may be a typical half-duty clock cycle.

The pulsed latch shown in FIG. 17A presents a relatively small clock load, thus reducing power consumption. Combined with the first stage 1720 and decoder 1730, pulsed latch 1710 shows one embodiment of the context switcher described above in reference to FIG. 3, element 120b, 120c, 120e or 120f. As shown in FIG. 17A, the latch takes its inputs from the BL outputs of a first stage 1720. The first stage could be any of the differential-read first stages described above in reference to FIGS. 11 and 13. In other embodiments, the first stage is one of the storage elements described above in reference to FIGS. 6A-10B. The latch passes its outputs to either a decoder or the IC's configurable circuits 1730. In some embodiments, the decoder 1730 is needed because the configuration data has been previously encoded. In some of these embodiments, the decoder may be placed before the pulsed latch 1710. Some embodiments of the decoder 1730 will be described below in reference to FIG. 25A, 25B, or 25C.

As shown in FIG. 17A, the pulsed latch 1710 takes its inputs, D and its complement, from the first stage's 1720 complementary BL outputs. The inputs to the pulsed latch 1710 are connected to the gates of transistors n3 and n4. During a write operation, ROWCLK is pulsed logic high, turning on transistors n1 and n2. Since the outputs of the first stage 1720 are complementary, either D or its complement will be logic high. If for instance, D's complement is logic high, n3 is turned on, and the Q output is driven to a logic low through n1 and n3.

During a storage or read operation, the ROWCLK pulse is released, bringing ROWCLK to a logic low. This turns off transistors n1 and n2, and leaves the sources of both n3 and n4 floating, thus isolating Q and its complement from the inputs, and leaving the inverters 1740 and 1750 to drive the Q output and its complement, latching the written value through their reinforcing configuration.

One of ordinary skill in the art will recognize that the pulsed latch 1710 may be implemented using different embodiments. For example, the pulsed latch 1710 could be implemented as a single-ended latch instead of a differential latch.

Figure 17B:
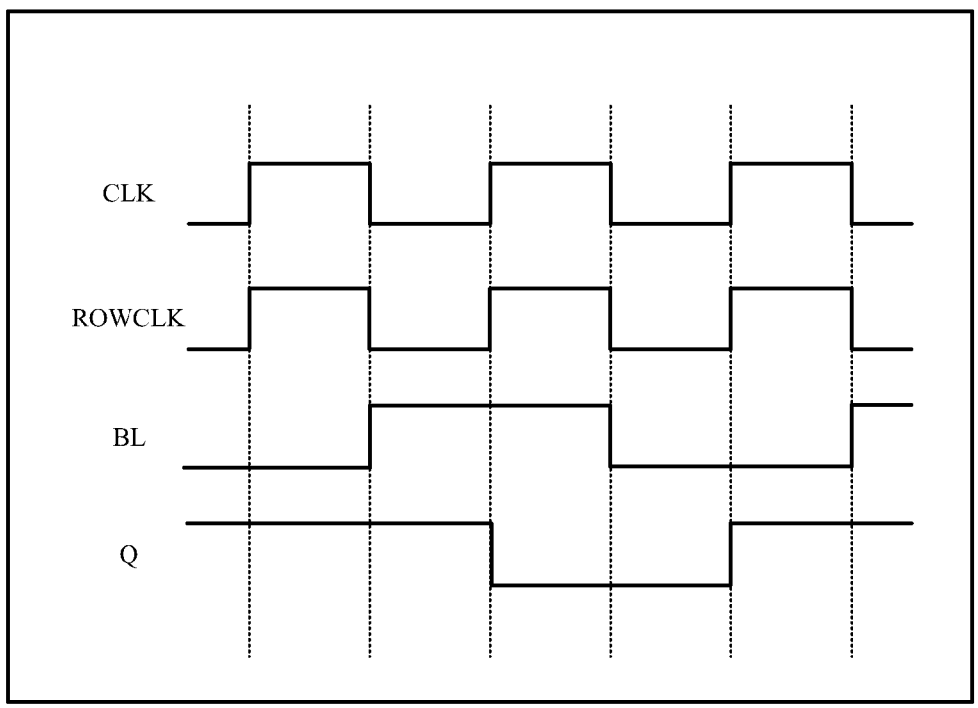
FIG. 17B illustrates the timing diagram of the circuit depicted in FIG. 17A of some embodiments.

FIG. 17B illustrates the timing diagram for the context switcher 1700 described in reference to FIG. 17A above. As shown, the timing diagram includes the signals CLK, ROWCLK, BL, and Q. In the example shown in FIG. 17B, the value at the input (BL) of the latch 1710 is passed to its output (Q) when ROWCLK is logic high. When ROWCLK switches to logic low, the previously stored value is presented at its output.

3. Pulsed Latch without Fight

Figure 18A:
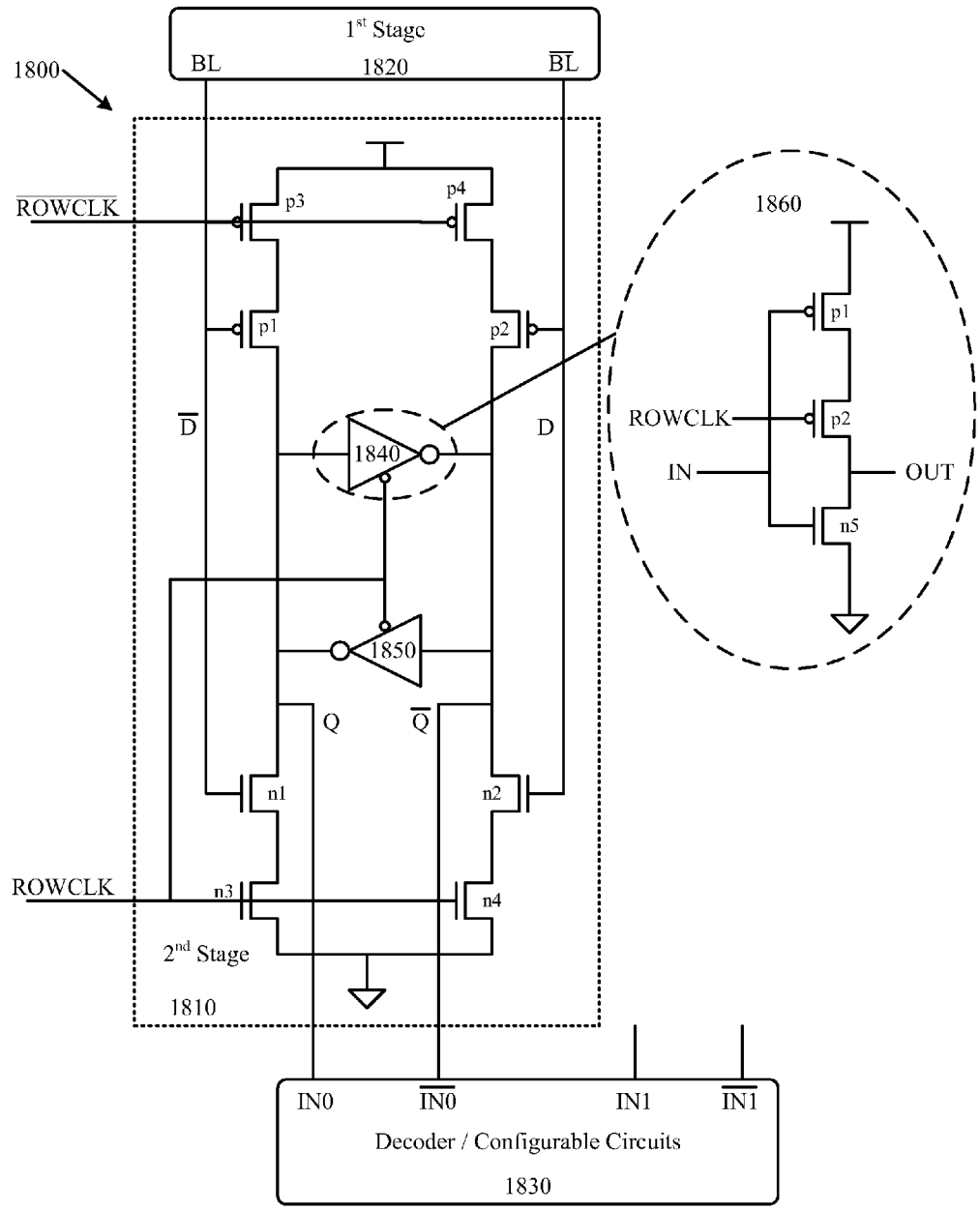
FIG. 18A illustrates a pulsed latch without fight as a second stage of the context switcher of some embodiments.

FIG. 18A illustrates a pulsed latch without fight 1810 that implements the second stage of the context switcher 1800 of some embodiments. As shown, the pulsed latch without fight 1810 includes a connection to the first stage 1820, a connection to a decoder or configurable circuits 1830, a pair of cross-coupled inverters 1840 and 1850, where each inverter includes two pull-up transistors p5 and p6 and one pull-down transistor n5, two pull-down transistors n1 and n2, two controllable pull-down transistors n3 and n4, two pull-up transistors p1 and p2, and twp controllable pull-up transistors p2 and p4.

The pulsed latch shown in FIG. 18A uses more power than the pulsed latch described in reference to FIGS. 17A and 17B, and provides increased reliability. Combined with the first stage 1820 and decoder 1830, the pulsed latch 1810 shows one embodiment of the context switcher described above in reference to FIG. 3, element 120b, 120c, 120e or 120f. As shown in FIG. 18A, the latch takes its inputs from the BL outputs of a first stage 1820. The first stage could be any of the differential-read first stages described above in reference to FIGS. 11 and 13. In other embodiments, the first stage is one of the storage elements described above in reference to FIGS. 6A-10B. The latch passes its outputs to either a decoder or the IC's configurable circuits 1830. In some embodiments, the decoder 1830 is needed because the configuration data has been previously encoded. In some of these embodiments, the decoder may be placed before the pulsed latch 1810. Some embodiments of the decoder 1830 will be described below in reference to FIG. 25A, 25B, or 25C.

As shown in FIG. 18, the pulsed latch 1810 takes its inputs, D and its complement, from the first stage's 1820 complementary BL outputs. The inputs to the pulsed latch 1810 are connected to the gates of transistors p1, p2, n1 and n2. During a write operation, ROWCLK is pulsed logic high, turning on transistors n3 and n4. Since the outputs of the first stage 1820 are complementary, either D or its complement will be logic high. If for instance, D's complement is logic high, n1 is turned on, and the Q output is driven to a logic low through n1 and n3. In addition, during a write operation, the pull-up path of inverters 1840 and 1850 are disabled, thus preventing the inverters from fighting the transistors n1 and n3 or n2 and n4 when attempting to write a value. As shown in breakout section 1860, the inverters 1840 and 1850 have a second series pmos transistor, p5, which acts as a controllable enable. When ROWCLK is logic high, the gate of p5 is also logic high, thus turning off transistor p5. When p5 is turned off, the inverter cannot drive a logic high value at its output, thus eliminating fighting between the inverters 1840 and 1850 and the nmos pull-down transistors n1 and n3, and n2 and n4. Since the pull-up paths of the inverters are disabled, current is sourced through either the series combination p1 and p3 or the series combination p2 and p4. To continue the example above, if the D input to the second stage is logic low, p2 is turned on, and the Q's complement node is driven to a logic high through p2 and p4, ensuring that there is no race condition when the inverters 1840 and 1850 are enabled. When ROWCLK is logic low, p5 is turned on, and the inverters operate like typical cmos inverters. Bringing ROWCLK to logic low also disables n3, n4, p3, and p4, thus leaving the second stage 1810 to hold its value without interference from its complementary inputs (D and D's complement).

During a storage or read operation, the ROWCLK pulse is released, bringing ROWCLK to a logic low. This turns off transistors n3 and n4, and leaves the sources of both n1 and n2 floating, thus isolating Q and its complement from the inputs, and leaving the inverters 1840 and 1850 to drive the Q output and its complement, latching the written value through their reinforcing configuration.

One of ordinary skill in the art will recognize that the pulsed latch 1810 may be implemented using different embodiments. For example, the pulsed latch 1810 could be implemented as a single-ended latch instead of a differential latch.

Figure 18B:
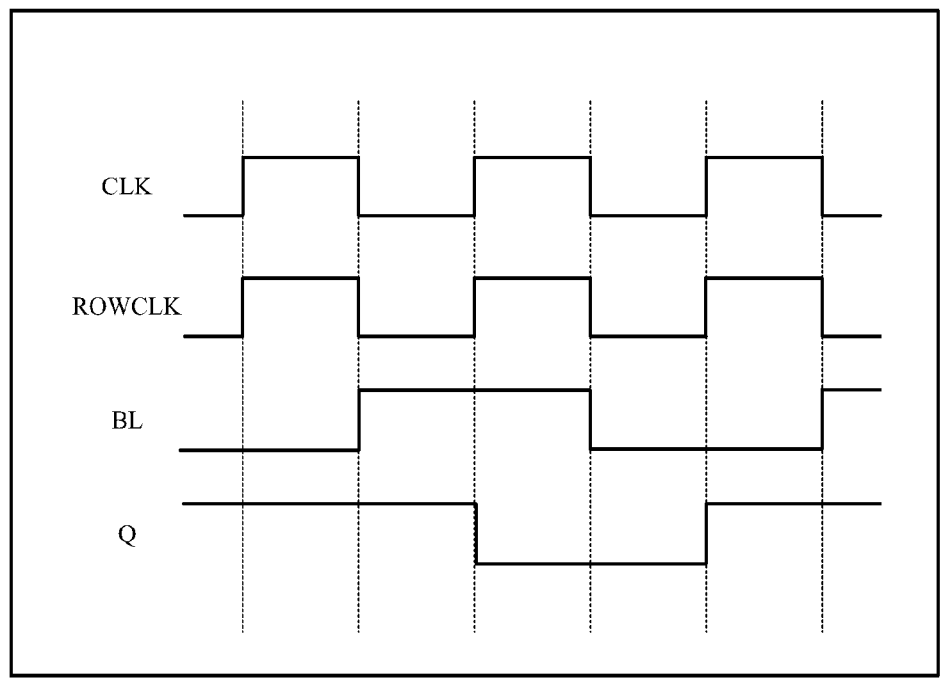
FIG. 18B illustrates the timing diagram of the circuit depicted in FIG. 18A of some embodiments.

FIG. 18B illustrates the timing diagram for the context switcher 1800 described in reference to FIG. 18A above. As shown, the timing diagram includes the signals CLK, ROW-CLK, BL, and Q. In the example shown in FIG. 18B, the value at the input (BL) of the latch 1810 is passed to its output (Q) when ROWCLK is logic low. When ROWCLK switches to logic high, the previously stored value is presented at its output.

4. Complementary Logic Latch

Figure 19A:
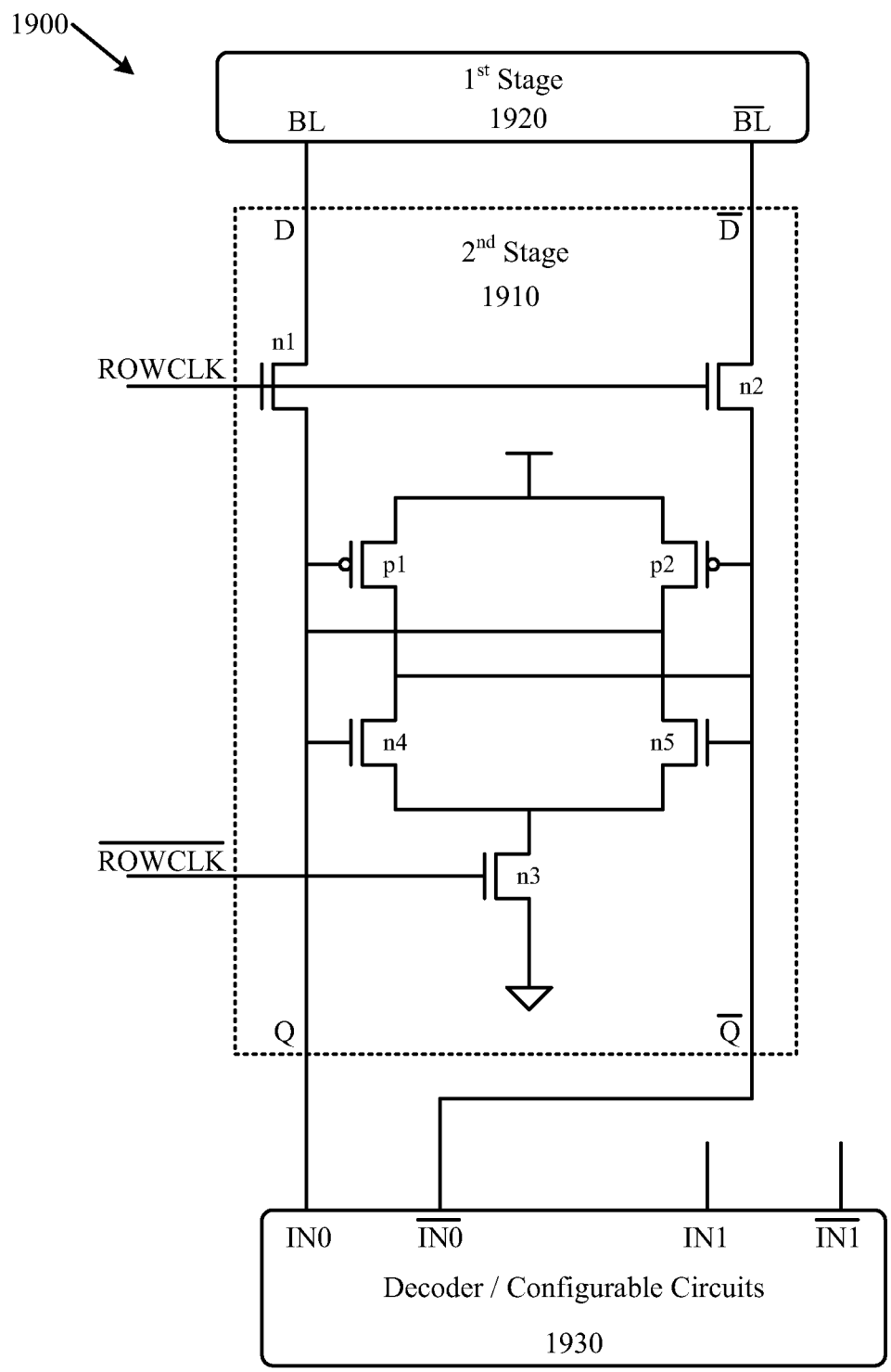
FIG. 19A illustrates a complementary latch as a second stage of the context switcher of some embodiments.

FIG. 19A illustrates a complementary logic latch 1910 that implements the second stage of the context switcher 1900 of some embodiments. As shown, the complementary latch 1910 has an input connection to a first stage 1920, an output connection to a decoder or configuration circuits 1930, two controllable pass transistors n1 and n2, a controllable pull-down transistor n3, two pull-down transistors n4 and n5, and two pull-up transistors p1 and p2.

Combined with the first stage 1920 and decoder 1930, the complementary logic latch 1910 shows one embodiment of the context switcher described above in reference to FIG. 3, element 120b, 120c, 120e or 120f. As shown in FIG. 19A, the latch takes its inputs from the BL outputs of a first stage 1920. The first stage could be any of the differential-read first stages described above in reference to FIGS. 11 and 13. In other embodiments, the first stage is one of the storage elements described above in reference to FIGS. 6A-10A. The latch passes its outputs to either a decoder or the IC's configurable circuits 1930. In some embodiments, the decoder 1930 is needed because the configuration data has been previously encoded. In some of these embodiments, the decoder may be placed before the complementary latch 1910. Some embodiments of the decoder 1930 will be described below in reference to FIG. 25A, 25B, or 25C.

As shown in FIG. 19A, the complementary latch 1910 takes its inputs, D and its complement, from the first stage's 1920 complementary BL outputs. The outputs of the first stage 1920 are routed through two pass transistors, n1 and n2. After passing through the pass transistors, the inputs to the complementary latch 1910 are connected to the gates of transistors p1 and n4, and p2 and n5. During a write operation, ROWCLK is pulsed logic high, turning on transistors n1 and n2, and turning off transistor n3. When n1 and n2 are turned on, the values held in the first stage drive the gates of p1 and n4 and p2 and n5. If BL is logic high (and its complement is logic lo), for instance, p1 is turned off, while p2 is turned on. The Q output is then driven to a logic high through p2.

During a storage or read operation, the ROWCLK pulse is released, bringing ROWCLK to a logic low. When ROWCLK is logic low (and its complement is logic hi), n1 and n2 are turned off, while n3 is turned on. Thus, the gates of p1 and n4, and p2 and n5 are driven only by the Q node and its complement, and are isolated from the outputs of the first stage 1920. Since n3 is turned on, and the Q node is high, the logic low at Q's complement is reinforced by the pull-down path through n3 and n4. Likewise, the logic high at the Q output is reinforced by the pull-up path through p2.

One of ordinary skill in the art will recognize that the complementary latch 1910 may be implemented using different embodiments. For example, the transparent latch 1910 could be implemented using transmission gates at its inputs instead of the pass transistors n1 and n2.

Figure 19B:
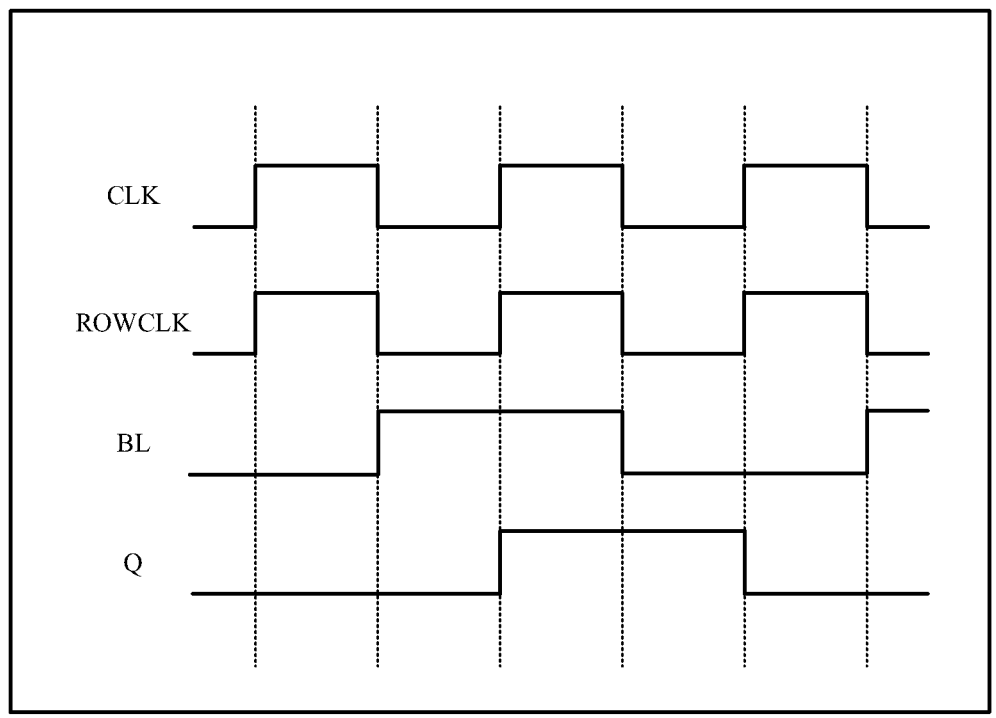
FIG. 19B illustrates the timing diagram of the circuit depicted in FIG. 19A of some embodiments.

FIG. 19B illustrates the timing diagram for the context switcher 1700 described in reference to FIG. 19A above. As shown, the timing diagram includes the signals CLK, ROW-CLK, BL, and Q. In the example shown in FIG. 19B, the value at the input (BL) of the second stage 1910 is passed to its output (Q) when ROWCLK is logic high. When ROWCLK switches to logic low, the previously stored value is presented at its output, while.

5. Toggle Latch

Figure 20A:
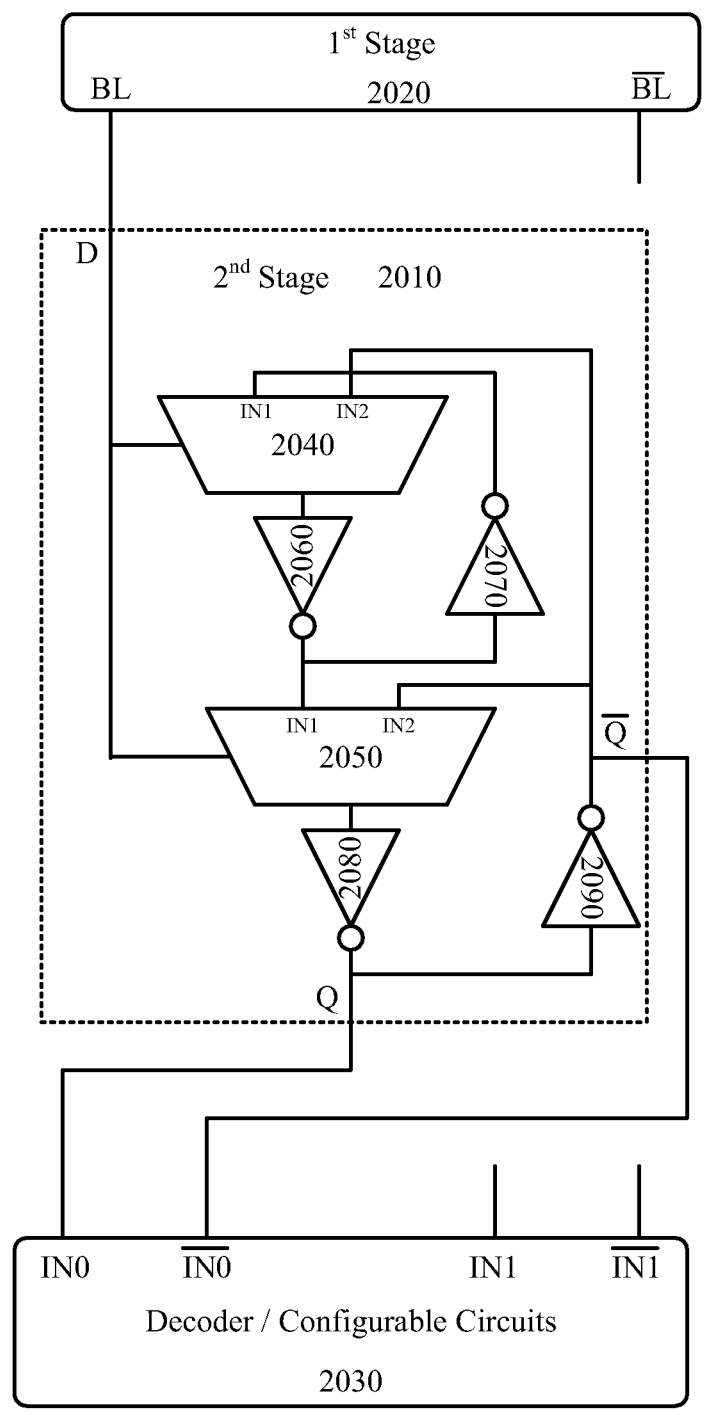
FIG. 20A illustrates an unclocked toggle latch as a second stage of the context switcher of some embodiments.

FIG. 20A illustrates a toggle latch 2010 that implements the second stage of the context switcher 2000 of some embodiments. As shown, the toggle latch 2010 includes a connection to a first stage 2020, a connection to a decoder or configurable circuits 2030, two 2:1 multiplexers 2040 and 2050, and four inverters 2060, 2070, 2080, and 2090.

Combined with the first stage 2020 and decoder 2030, the toggle latch 2010 shows one embodiment of the context switcher described above in reference to FIG. 3, element 120b, 120c, 120e or 120f. As shown in FIG. 20, the latch takes its single-ended input from the BL output of a first stage 2020. The first stage could be any of the bit line pre-charge, single-ended read first stages described above in reference to FIG. 12. In other embodiments, the first stage may be one of the storage elements described above in reference to FIGS. 6A-10B. The latch passes its outputs to either a decoder or the IC's configurable circuits 2030. In some embodiments, the decoder 2030 is needed because the configuration data has been previously encoded. Some embodiments of the decoder 2030 will be described below in reference to FIG. 25A, 25B, or 25C.

As shown in FIG. 20A, the toggle latch 2010 takes its input D from the first stage's 2020 BL output. The D input drives the input selection controls of multiplexers 2040 and 2050. The operation of the toggle latch 2010 is not defined by read, write and storage operations. Rather, the toggle latch holds a value until its D input changes from logic low to high, at which point the outputs of the toggle latch 2010 are updated.

When the bit line, BL, is pre-charged to a logic high value, each 2:1 multiplexer 2040 and 2050 selects its first input (i.e. the inputs driven by the outputs of inverters 2070 and 2060, respectively). The value at the first input (IN1) of the first multiplexer is simply its output passed through a pair of inverters 2060 and 2070 (i.e. its first input is the same value as its output). In contrast, the second input (IN2) of the first multiplexer is the inversion of its input because the signal is passed through three inverters 2060, 2080, and 2090. The second multiplexer 2050 has its output value provided at its second input (IN2) through inverters 2080 and 2090, while its output is also the signal present at its first (i.e. selected) input (IN1)

During evaluation of the bit line, after pre-charging, if the value on BL is a logic high, there is no change to the output of the toggle latch, and the inputs and outputs are maintained as above. If however, the value on BL after pre-charge changes to a logic low, then the value held at the output of the toggle latch is updated when the bit line (BL) is pre-charged to logic high again. When BL is driven to a logic low, each multiplexer 2040 and 2050 selects its second input to route to its output. Since the second multiplexer 2050, has its twice inverted output at its second input, there is no change at its output. The first multiplexer 2040, however, changes its output to the alternate logic state (e.g. high to low) when it selects its second input instead of its first. The output of the first multiplexer 2040, then drives the input of the inverter 2060. Consequently, the value at the output of the inverter 2060 changes its logic state. The value at the output of inverter 2060 also drives the input of inverter 2070, and changes its output, which is placed at the first input of both multiplexers 2040 and 2050. When the bit line goes to logic high during the next pre-charge cycle, the first input of both multiplexers 2040 and 2050 is selected, thus toggling the value at the Q output, when the second multiplexer 2050 selects its triple-inverted input, latching the values of Q and its complement. In addition, the inputs the multiplexer 2040 are now complementary, so its output will change at the next falling edge of BL (i.e. when the multiplexer's other inputs is selected), while the second multiplexer 2050 has the same value on both inputs, and doesn't toggle its output on a falling edge of BL.

One of ordinary skill in the art will recognize that the toggle latch 2010 may be implemented using different embodiments. For example, the toggle latch 2010 could be combined with the decoder 2030.

Figure 20B:
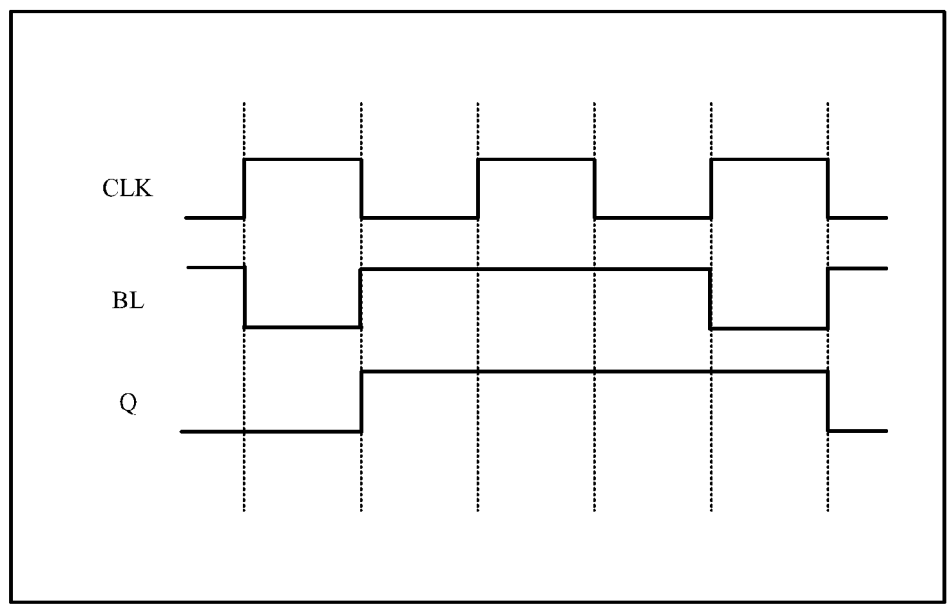
FIG. 20B illustrates the timing diagram of the circuit depicted in FIG. 20A of some embodiments.

FIG. 20B illustrates the timing diagram for the context switcher 2000 described in reference to FIG. 20A above. As shown, the timing diagram includes the signals CLK, BL, and Q. In the example shown in FIG. 20B, the value at the input (BL) of the latch 2010 is passed to its output (Q) when the bit line (BL) changes from logic low to logic high. When the bit line changes from logic high to logic low, the previously stored value is presented at its output.

6. Equalized Bit Line Half-Swing Clock Latch

Figure 21A:
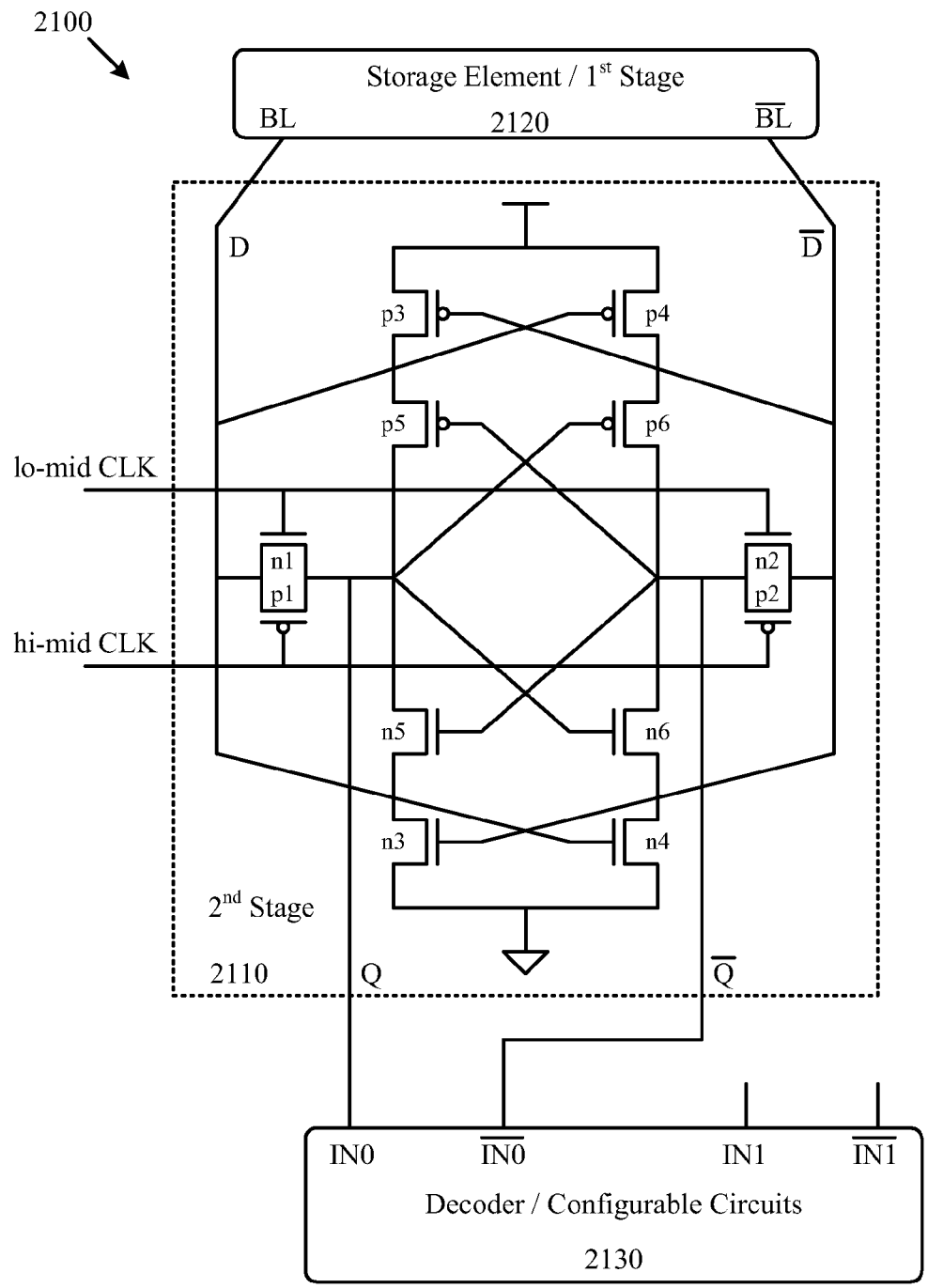
FIG. 21A illustrates a half-swing clock latch as a second stage of the context switcher of some embodiments.

FIG. 21A illustrates a half-swing clock latch 2110 that implements the second stage of the context switcher 2100 of some embodiments. As shown, the half-swing clock latch 2110 includes a connection to a first stage 2120, a connection to a decoder or configurable circuits 2130, four pass transistors n1, n2, p1 and p2, two pull-down transistors n3 and n4, two cross-coupled pull-down transistors n5 and n6, two pull-up transistors p3 and p4, and two cross-coupled pull-up transistors p5 and p6.

Because the clock signal only swings from a midpoint voltage to supply or ground, the latch 2110 uses much less power than a full-swing clock latch because dynamic power varies with the square of voltage change, all else being equal. Combined with the first stage 2120 and decoder 2130, the toggle latch 2110 shows one embodiment of the context switcher described above in reference to FIG. 3, element 120e or 120f. As shown in FIG. 21, the latch takes its complementary inputs from the bit line outputs of a first stage 2120. In some embodiments, the first stage may be one of the storage elements described above in reference to FIGS. 8A and 8B. The latch passes its outputs to either a decoder or the IC's configurable circuits 2130. In some embodiments, the decoder 2130 is needed because the configuration data has been previously encoded. Some embodiments of the decoder 2130 will be described below in reference to FIG. 25A, 25B, or 25C.

As shown in FIG. 21A, the second stage 2110 takes its inputs, D and its complement, from the first stage's 2120 complementary BL outputs. The outputs of the first stage 2120 are routed through two transmission gates, made up of p1 and n1 and p2 and n2, respectively. In this embodiment, transmission gates are used instead of a single pass transistor because the half-swing clocks do not turn the transistors of the transmission gates to a hard on state. Thus, the use of transmission gates provides better signal strength once the inputs pass the transmission gates than would be achieved with a single transistor (either a pmos or an nmos).

Before writing a value to the latch 2110 or reading a value from the latch, the bit lines are equalized as described above in reference to FIGS. 8A and 8B. During equalization, the half-swing clocks are at the low and high values, respectively, and the transmission gates of the second stage 2110 are both turned off while the bit lines are brought to the $V_{REF}$ value.

During a read/write operation, the half-swing clock signals (lo-mid CLK and hi-mid CLK) are brought to their midpoint value, turning on the transmission gates. When the D input to the second stage 2110 is logic high, for instance, its value is passed through the transmission gate made up of p1 and n1 to the Q node of the second stage 2110. Thus, the logic high at node D is present on the gates of transistors n4 and n6, driving Q's complement to a logic low value. Since D's complement was already at a logic low value, transistors p3 and p5 are turned on, and pull-up the Q node to a logic high value. When the value at the D's complement inputs to the second stage 2110 is logic high, its value is passed through the transmission gate made up of p2 and n2 to the Q's complement node of the second stage 2110. Thus, the logic high at the D's complement node and the Q's complement node turns on transistors n3 and n5, thus driving the Q node to ground through n3 and n5. Since the D and Q node are both at a logic low value, transistors p4 and p6 are turned on, and the logic high at Q's complement is reinforced.

One of ordinary skill in the art will recognize that the second stage 2110 may be implemented using different embodiments. For example, the second stage 2110 could be placed after the decoder 2130.

Figure 21B:
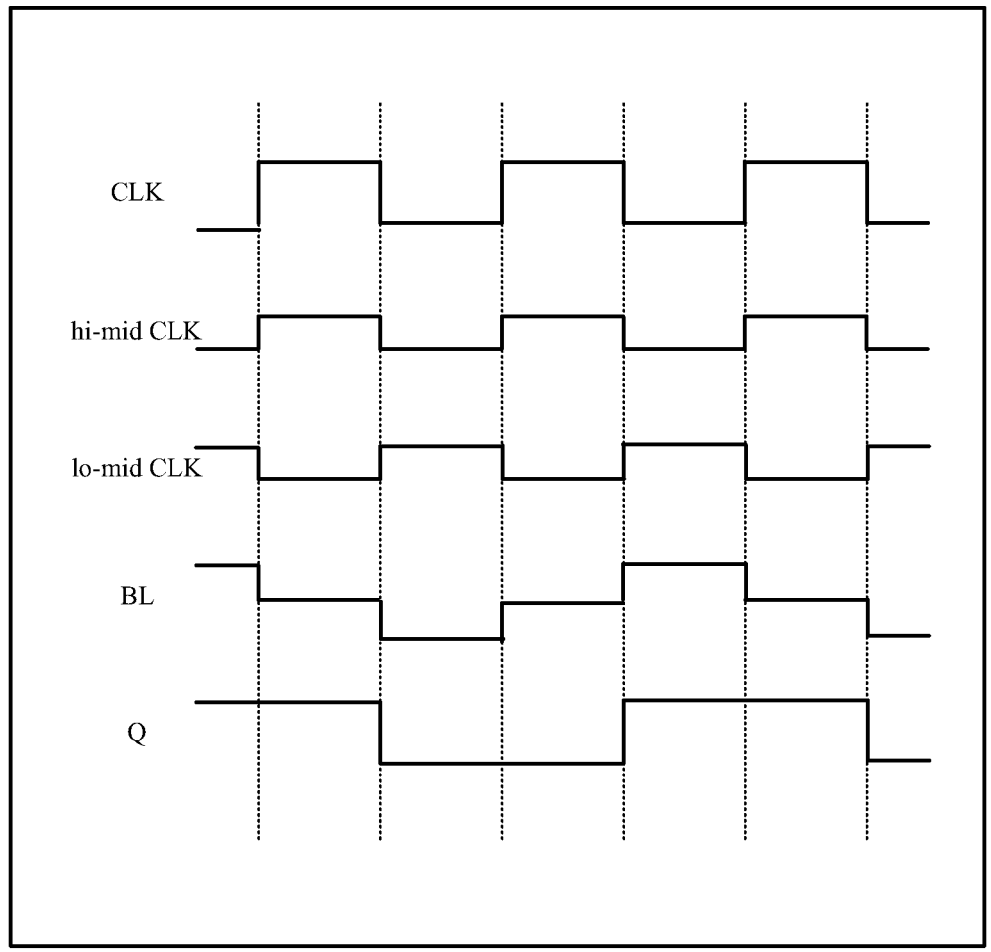
FIG. 21B illustrates the timing diagram of the circuit depicted in FIG. 21A of some embodiments.

FIG. 21B illustrates the timing diagram for the context switcher 2100 described in reference to FIG. 21A above. As shown, the timing diagram includes the signals CLK, hi-mid CLK, lo-mid CLK, BL, and Q. In the example shown in FIG. 21B, the value at the input (BL) of the latch 2110 is passed to its output (Q) when hi-mid CLK and lo-mid CLK are at the mid-logic level voltage. When hi-mid CLK switches to logic high and lo-mid CLK switches to logic low, the BL is equalized.

C. First and Second Stage Variations

In some embodiments, the two stages of the context switcher are combined into a single element or other variation of the two-stage embodiment. The following discussion describes some of these variation stages of some context switchers.

1. Two-Stage 10-Input Multiplexer

Figure 22:
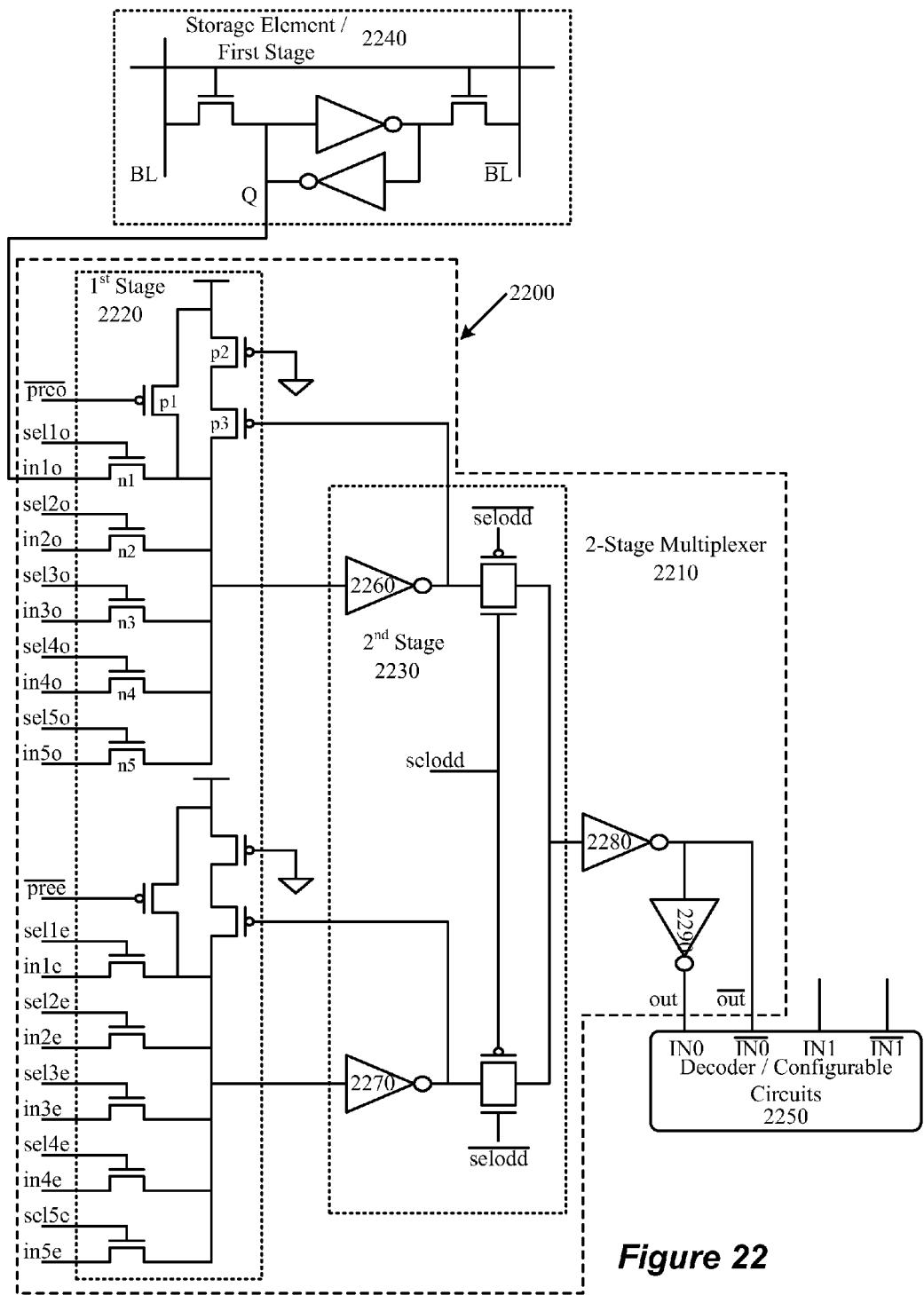
FIG. 22 illustrates a two-stage multiplexer as the first and second stages of the context switcher of some embodiments.

FIG. 22 illustrates a multiplexer 2210 used as a first and second stage in some embodiments of the context switcher 2200. As shown, the multiplexer 2210 includes a first stage 2220, a second stage 2230, input connections to a first stage or storage element 2240, output connections to a decoder or configurable circuits 2250, four inverters 2260, 2270, 2280, and 2290, two controllable pull-up transistors, four pull-up transistors, and fourteen controllable pass transistors.

The multiplexer has a first stage 2220 and a second stage 2230. Combined with the storage element 2240 and decoder 2250, the 10-input multiplexer 2210 shows one embodiment of the context switcher described above in reference to FIG. 3, element 120i. As shown in the figure, the multiplexer takes its inputs from the Q node of a storage cell 2240. This storage element could be any one of the cells described above in reference to FIGS. 6A-10B. The multiplexer passes its outputs to either the IC's configurable circuits or a decoder 2250. In some embodiments, the decoder 2250 is needed because the configuration data has been previously encoded. Some embodiments of the decoder 2250 will be described below in reference to FIG. 25A, 25B, or 25C.

As shown in FIG. 22, the multiplexer 2210 includes a first stage 2220 and a second stage 2230. The first stage includes a set of even inputs and a set of odd inputs. For simplicity and clarity, the odd section of the multiplexer will be explained. The multiplexer 2210 receives 12 bits of control data. 10 bits of control data are used to select from among the 10 inputs of the first stage 2220. The other two bits of control data are used to select the odd or even side of the second stage 2230 of the multiplexer 2210. The set of inputs has an optional controllable pull-up transistor p1. The set of inputs also includes two series-connected pull-up transistors p2 and p3. Each input to the multiplexer has a controllable nmos pass transistor (e.g. n1, controlled by sel1o for in1o). The even set of inputs includes identical components as the odd set of inputs. The second stage of the multiplexer includes two buffering inverters 2260 and 2270. The buffering inverters are connected to two transmission gates, which are alternately selected using the selodd signal and its complement. The multiplexer also includes two output buffering inverters 2280 and 2290 which drive the complementary outputs of the multiplexer.

As shown in FIG. 22, each input to the multiplexer is directly connected to the Q node of a storage element 2240 which also serves as a first stage in this configuration. Within the first stage 2220 of the multiplexer 2210, each input to the multiplexer has an nmos pass transistor which is controlled by a select line. When a particular select line is logic high the value at that input is passed to the second stage 2230 of the multiplexer, for instance if sel1o is logic high, the transistor n1 is turned on, and the value at in1o is passed to the input of the inverter 2260.

The first stage 2220 of the multiplexer 2210 also performs an optional pre-charge function. When the preo signal's complement is logic low, for instance, transistor p1 is turned on, and the node at the input of the inverter 2260 is pulled up to a logic high through p1. In some embodiments, the controllable pull-up transistor p1 is omitted. When the input of inverter 2260 is pulled to logic high, the output of the inverter is driven to a logic low, turning on transistor p3 and reinforcing the logic high at the input to the inverter 2260 through transistors p2 and p3. Thus the input to inverter 2260 is held at logic high after pre-charge until a logic low input is selected and drives the node at the input of inverter 2260 to logic low. Pmos transistor p2 is placed in series with transistor p3 such that the pull-up of the node at the input of inverter 2260 is relatively weak, and able to be driven to a logic low by the output of the storage element 2240. In addition, the transistors within the inverters 2260 and 2270 may be sized to produce a low input voltage threshold (e.g., the size ratio of the pmos to nmos device may be 1:2 as oppose to a typical inverter that is 2:1). The pull up transistors p2 and p3 are sized with relatively long gate lengths to prevent fighting with the circuits driving the inputs of the multiplexer 2200.

The second stage 2230 of the multiplexer 2210 is used for re-timing and synchronization of the captured input, this functionality is analogous to the functionality of the second stages described above in reference to FIGS. 16A-20B. The re-timing and synchronization is achieved by varying the odd/even selection at the first stage with the odd/even selection of the second stage. For instance, when capturing a value from one of the odd inputs (i.e. in1o to in5o), the value at the output of inverter 2270 is allowed to settle before the second stage 2230 of the multiplexer 2210 selects the even input side of the first stage 2220.

One of ordinary skill in the art will recognize that the multiplexer 2210 may be implemented using different embodiments. For example, the multiplexer 2210 could be implemented using transmission gates at its inputs.

2. Single-Stage Multiplexer

Figure 23A:
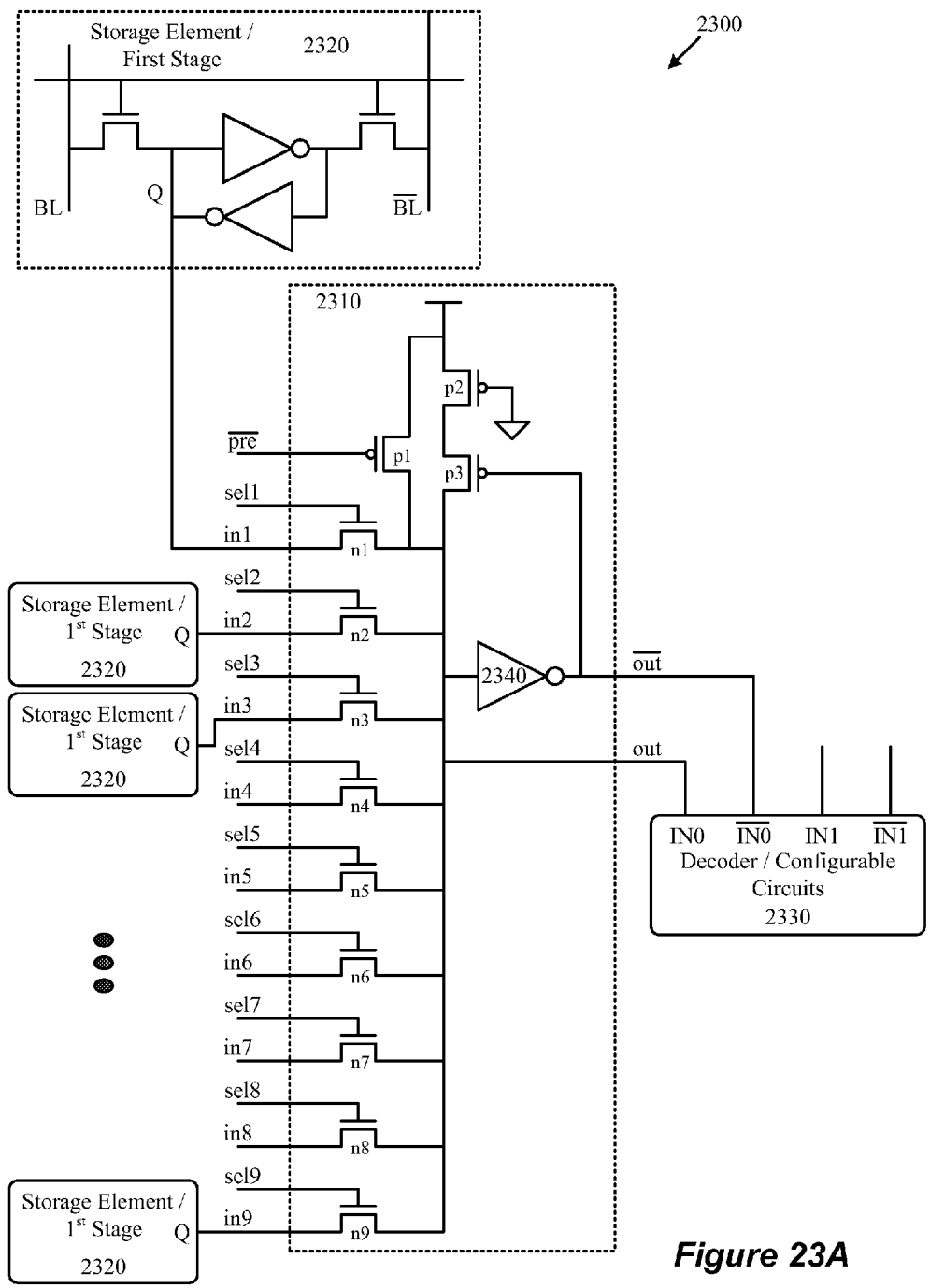
FIG. 23A illustrates a single-stage multiplexer with Q-tapped storage cell as the context switcher of some embodiments.

FIG. 23A illustrates a single-stage multiplexer 2310 used as a first and second stage in some embodiments of the context switcher 2300. As shown, the multiplexer 2310 includes connection to storage element 2320, a connection to a decoder or configurable circuits 2330, an inverter 2340, an optional controllable pull-up transistor p1, two pull-up transistors p2 and p3, and nine controllable pass transistors n1, n2, n3, n4, n5, n6, n7, n8 and n9.

Figure 23B:
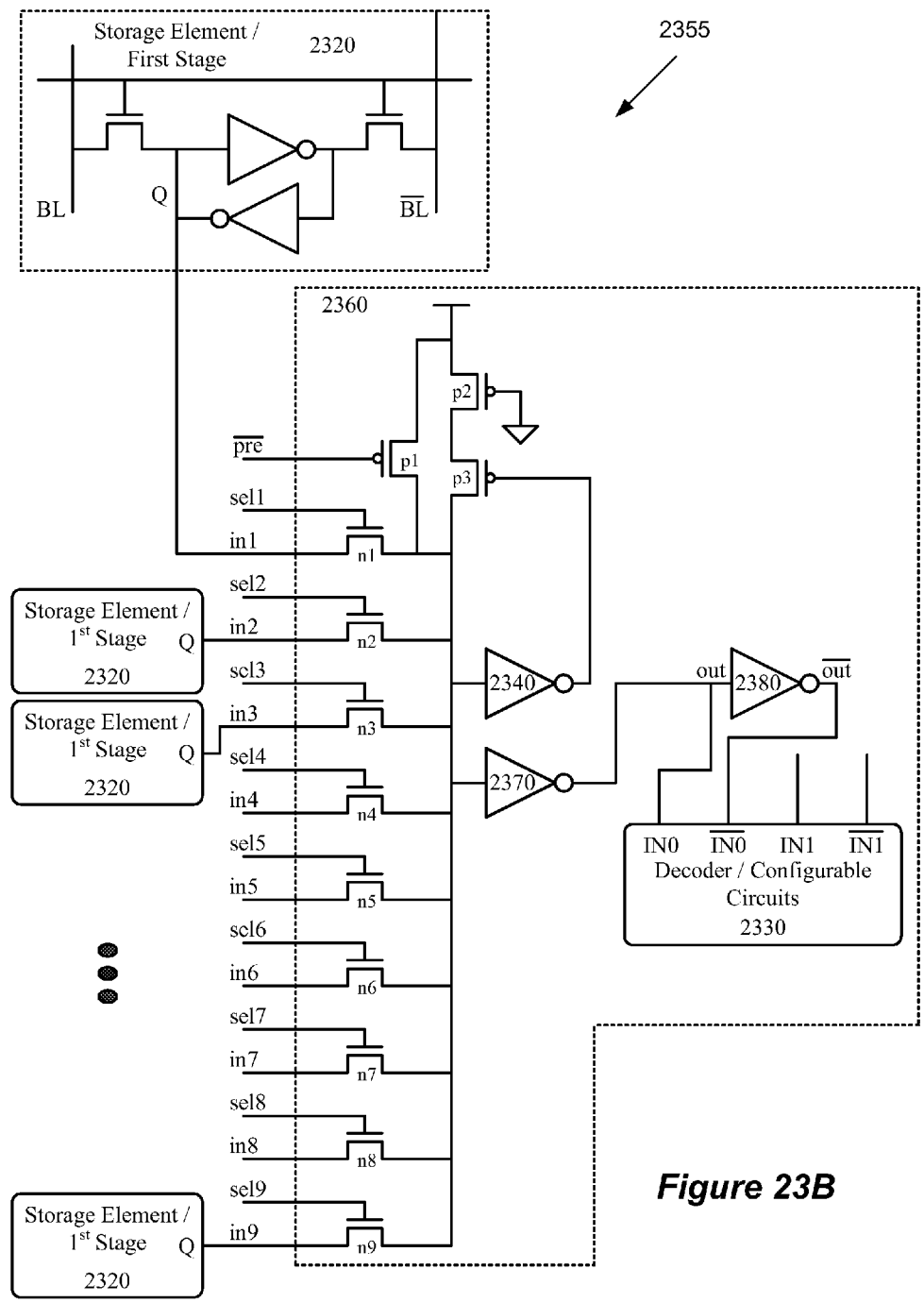
FIG. 23B illustrates a single-stage multiplexer with Q-tapped storage cell and buffered output as the context switcher of some embodiments.

FIG. 23B illustrate an alternative embodiment 2355 of the multiplexer 2310 with added buffering inverters at its outputs. As shown, in addition to the components of multiplexer 2310, multiplexer 2360 also includes two more inverters 2370 and 2380.

Combined with the storage element 2320 and decoder 2330, the 9-input multiplexers 2310 or 2360 show one embodiment of the context switcher described above in reference to FIG. 3, element 120h. As shown in FIGS. 23A and 23B, the multiplexer takes its inputs from the Q node of a storage cell 2320. This storage element could be any one of the cells described above in reference to FIGS. 6A-10B. The multiplexer passes its outputs to either the IC's configurable circuits or a decoder 2330. In some embodiments, the decoder 2330 is needed because the configuration data has been previously encoded. Some embodiments of the decoder 2330 will be described below in reference to FIG. 25A, 25B, or 25C. Although the inputs are shown as single-ended, and are connected through nmos pass transistors, other embodiments may use different devices. For instance, in some embodiments, the nmos pass transistors are replaced by complementary transmission gates containing both an nmos and a pmos pass transistor. In other embodiments, the nmos transistors may be driven by boosted select lines, where the select signals are driven by a higher voltage supply than is used in the rest of the circuit (e.g. the select lines could be driven by 1.2V signals instead of 1V signals). If a higher voltage supply is used, it may be generated externally, or through the use of a bootstrap circuit. Other embodiments may use complementary inputs instead of single-ended, such one or the other complementary inputs will be a low, and can be used to pull-up its corresponding complementary input through a pmos device instead of an nmos pass transistor. Any of these alterations to the input structure can be applied to the input structure of the multiplexer described above in reference to FIG. 22.

As shown in FIG. 23A and FIG. 23B, each input to the multiplexer is directly connected to the Q node of a storage element 2320 which also serves as a first stage in this configuration. Each input to the multiplexer 2310 or 2360 has an nmos pass transistor which is controlled by a select line. When a particular select line is logic high the value at that input is passed to the outputs of the multiplexer 2310 or 2360. For instance, if sel1 is logic high, the transistor n1 is turned on, and the value at in1 is passed to the output of the multiplexer and the input of the inverter 2340. The output of inverter 2340 provides the complementary output of the multiplexer.

The out node of the multiplexer 2310 is connected to a controllable pull-up transistor p1 that pre-charges the out node in some embodiments. In other embodiments, pre-charge is not performed, and the controllable pull-up transistor p1 is omitted. In addition, the transistors within the cross-coupled inverters may be sized to produce a low input voltage threshold (e.g., the size ratio of the pmos to nmos device may be 1:2 as oppose to a typical inverter that is 2:1). The pull up transistors p2 and p3 may also be sized with relatively long gate lengths to prevent fighting with the circuits driving the inputs of the multiplexer 2300.

One of ordinary skill in the art will recognize that the multiplexer 2310 or 2360 may be implemented using different embodiments. For example, the multiplexer 2310 could be implemented using transmission gates at its inputs.

3. Single-Ended Read Pre-Sense First Stage with SR Latch Second Stage

Figure 24:
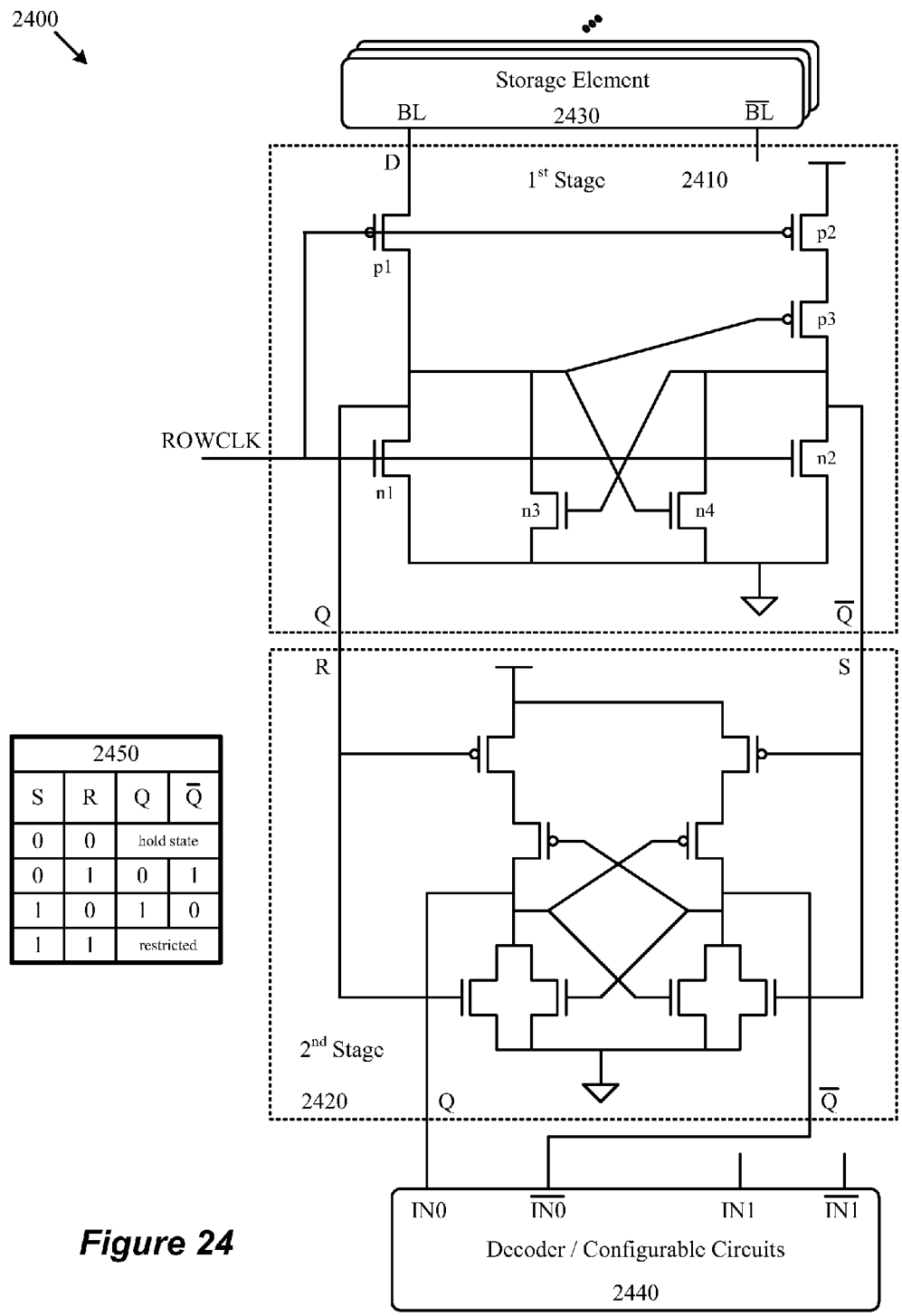
FIG. 24 illustrates a first and second stage of the context switcher of some embodiments.

FIG. 24 illustrates a single-ended read pre-sense first stage 2410 combined with an SR latch second stage 2420. As shown, the latch 2410 includes one controllable pass transistor p1, a controllable pull-up transistor p2, a pull-up transistor p3, two controllable pull-down transistors n1 and n2, two cross-coupled pull-down transistors n3 and n4, two cross-coupled NOR gates. Each NOR gate includes two pmos pull-up transistors connected in series and two nmos pull-down transistors connected in parallel. One NOR gate receives the Q value from the first stage 2410 at one input, and the output of the second NOR gate at its other input. The second NOR gate receives the Q's complement value from the first stage 2410 at one input, and the output of the first NOR gate at its other input. Each NOR gate's output is connected to one of the other NOR gate's inputs.

When combined with the storage element 2430 and the decoder 2440, the latches 2410 and 2420 show one embodiment of the context switcher described above in reference to FIG. 3, element 120c. As shown in FIG. 24, the first stage 2410 takes its input from the bit line of the storage element 2430. This storage element could be any one of the cells described above in reference to FIGS. 6A-10B. The first stage 2410 passes its outputs to the inputs of the SR latch second stage 2420. The SR latch second stage 2420 then passes its outputs to either the IC's configurable circuits or a decoder 2440. In some embodiments, the decoder 2440 is needed because the configuration data has been previously encoded. Some embodiments of the decoder 2440 will be described below in reference to FIG. 25A, 25B, or 25C.

The first stage 2410 shown in FIG. 24 takes its input from the BL output of the storage element 2430. Prior to a write operation to the first stage 2410, a pre-sense operation is performed. When ROWCLK is pulsed to logic high, transistors n1 and n2 are turned on, and both the Q output of the first stage and its complement are pulled to logic low through n1 and n2. Since both the Q output and its complement are pulled to logic low, transistors n3 and n4 are turned off. The ROWCLK pulse operation also pulls the gate of transistor p3 to a logic low value through transistor n1 and turns transistor p3 on. When ROWCLK is logic high, however, both p1 and p2 are turned off, so there is no active pull-up path at the Q's complement output. When the ROWCLK pulse is released and ROWCLK goes to a logic low value, transistors n1 and n2 are turned off, and transistors p1 and p2 are turned on. When p1 is turned on, the value at the BL output of the storage element 2430 is placed at the Q output of the first stage 2410. If the passed value is a logic low, there is no change to the value at the Q node, and transistors p2 and p3 are both turned on, thus pulling Q's complement to a logic high value through p2 and p3. If the passed value is a logic high, the value of the Q node is pulled to logic high, and transistor p3 is turned off, while n4 is turned on. In this manner, Q's complement is pulled to a logic low.

The second stage 2420 shown in FIG. 24 takes its input from the complementary outputs of the first stage 2410. The second stage 2420 in this case is simply a NOR-gate based SR latch, whose operation is described by the truth table 2450. Thus, when the first stage's 2410 Q output (tied to the R input) is at a logic high, while the first stage's Q's complement output (tied to the S input) is at a logic low, the second stage 2420 stores a logic high at its Q output node, and a logic low at its Q's complement output node. During an evaluation operation, when ROWCLK is pulsed to logic high, both S and R are pulled to logic low through n1 and n2, thus holding the value previously stored in the SR latch second stage 2420.

The first stage 2410 may be used with any of the single-ended read storage cells, while the second stage 2420 may be used with any first stage that provides complementary outputs. In addition, one of ordinary skill in the art will recognize that the master-slave combination of FIG. 24 may be implemented using different configurations. For example, the storage cell 2420 used as the master may be dual port instead of single port.

D. Decoder

The decoder converts one or more bits of encoded input data into 1 or more bits of decoded output data. In some embodiments, the decoder follows the second stage of the context switcher and drives the configuration circuits of the IC. In other embodiments, the decoder receives its inputs from the first stage of the context switcher and passes its outputs to the second stage of the context switcher. Some embodiments of the context switcher do not use a decoder. The embodiment of various decoders is described below. In some embodiments, the decoder is a 2:4 decoder (i.e. two input bits are decoded into four output bits), in other embodiments, the decoder is a 2:3 decoder, in other embodiments, the decoder is a 1:1 decoder. Some embodiments use multiple different types of decoders for one set of configuration data for different types of configurable circuits within the IC. In addition to the specific decoder embodiments discussed in reference to FIGS. 25A, 25B, and 25C below, the encoding and decoding operations are further discussed in reference to FIGS. 43-45 below.

Figure 25A:
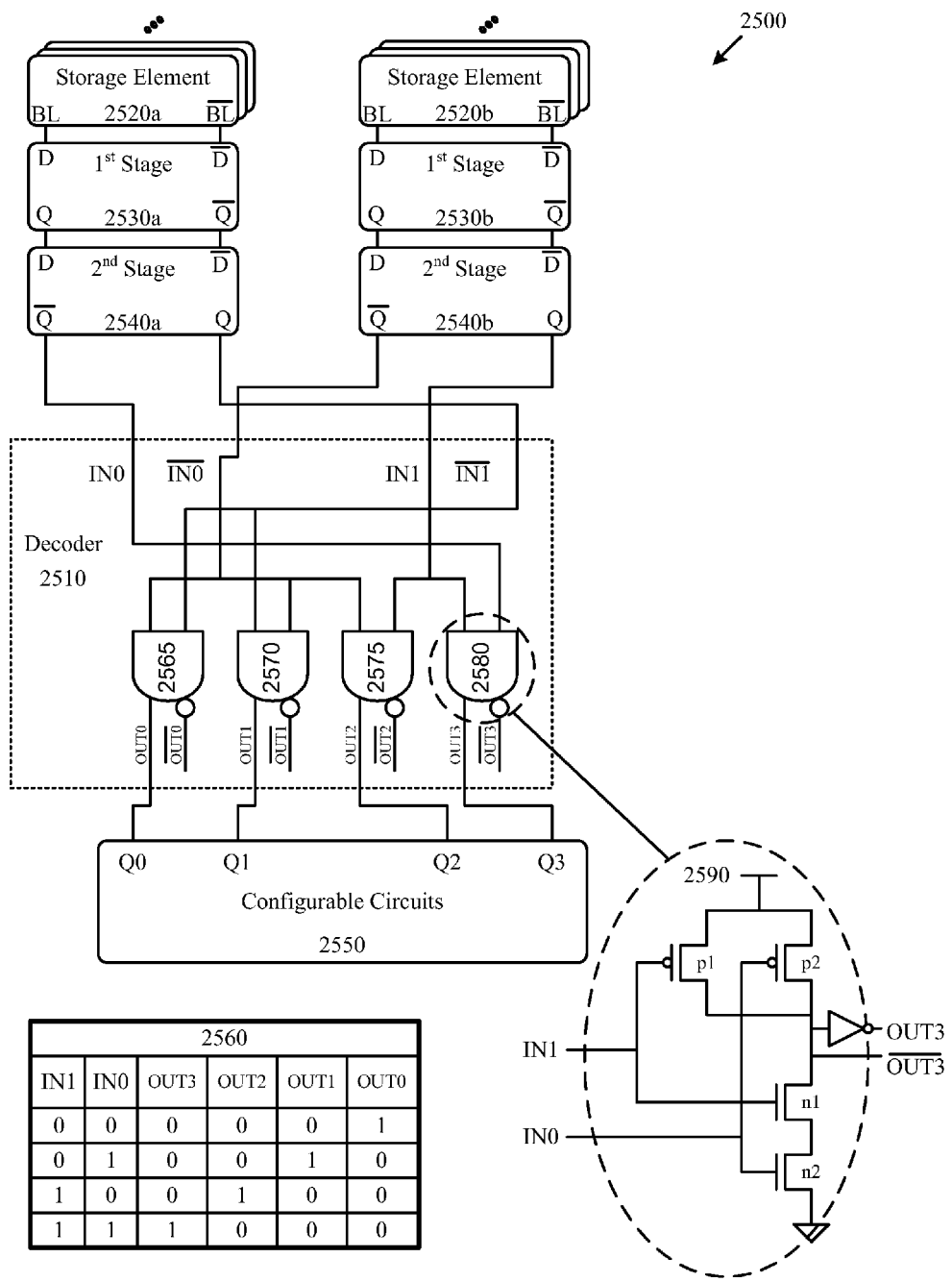
FIG. 25A illustrates a two-to-four decoder of some embodiments.

FIG. 25A illustrates an embodiment of a 2:4 decoder circuit 2510 introduced in reference to FIG. 3 element 220. As shown, the decoder 2510 includes four NAND gates 2565, 2570, 2575, and 2580.

Two columns of storage elements 2520a and 2520b drive the context switcher, which in this example consists of decoder 2510, two first stages 2530a and 2530b, two second stages 2540a and 2540b. The first stages drive the two second stages 2540a and 2540b, which in turn drive the decoder 2510 which operates on two complementary inputs at a time before feeding its output to the configurable circuits 2550. The operation of the decoder is described by the truth table 2560. Combined with the first stages 2530a and 2530b and the second stages 2540a and 2540b, the decoder 2510 illustrates one embodiment of the context switcher described above in reference to FIG. 3, element 120a, 120b, 120c, 120e, 120f or 120h.

As shown in FIG. 25A, the decoder 2510 includes four NAND gates 2565, 2570, 2575, and 2580. Each NAND gate is a standard cmos NAND gate as shown in breakout section 2590. Thus, each NAND gate has two pull-up transistors connected in parallel and two pull-down transistors connected in series.

As shown in FIG. 25A, in some embodiments the decoder 2510 takes its two sets of complementary inputs from the complementary outputs of the two second stages 2540a and 2540b. The second stages could be any of the second stages described in reference to FIGS. 16A-21B or the master/slave variations described in reference to FIGS. 22-24. The first stages 2530a and 2530b could be any of the first stages described in reference to FIGS. 11-15 or any of the master/slave variations described in reference to FIGS. 22-24. The storage elements 2520a and 2520b may be any of the elements discussed above in reference to FIGS. 6A-10B that is appropriate to drive the first stages. The outputs of the decoder 2510 drive the inputs of the configurable circuits 2550. In some embodiments, the decoder takes its inputs from the first stages and provides its outputs to the second stages in the context switcher 2500. In other embodiments, the decoder is combined with the second stages to form the context switcher 2500.

The two-to-four decoder's operation is described by the truth table 2560. The two input bits are used to select one of the four outputs, as shown. As shown in FIG. 25A, the decoder 2510 is made up of 4 NAND gates 2565, 2570, 2575, and 2580. The NAND gates are all standard cmos NAND gates as shown in breakout section 2590. As an example, for NAND gate 2580, when IN0 and N1 are both logic high, the output of the NAND gate is pulled-down to ground by n1 and n2, causing the NAND gate to output a logic low. For all other combinations of the inputs IN0 and IN1 (i.e. when either IN0 or IN1 is a logic lo) one of the nmos transistors n1 or n2 is turned off, thus removing the pull-down path, while one or both of the pmos transistors p1 or p2 are turned on, pulling-up the output to logic high. The inputs to the other NAND gates 2565, 2570, and 2575 are connected in a similar manner, such that each gate will produce a logic low output for only one set of inputs, as described by the truth table 2560.

Figure 25B:
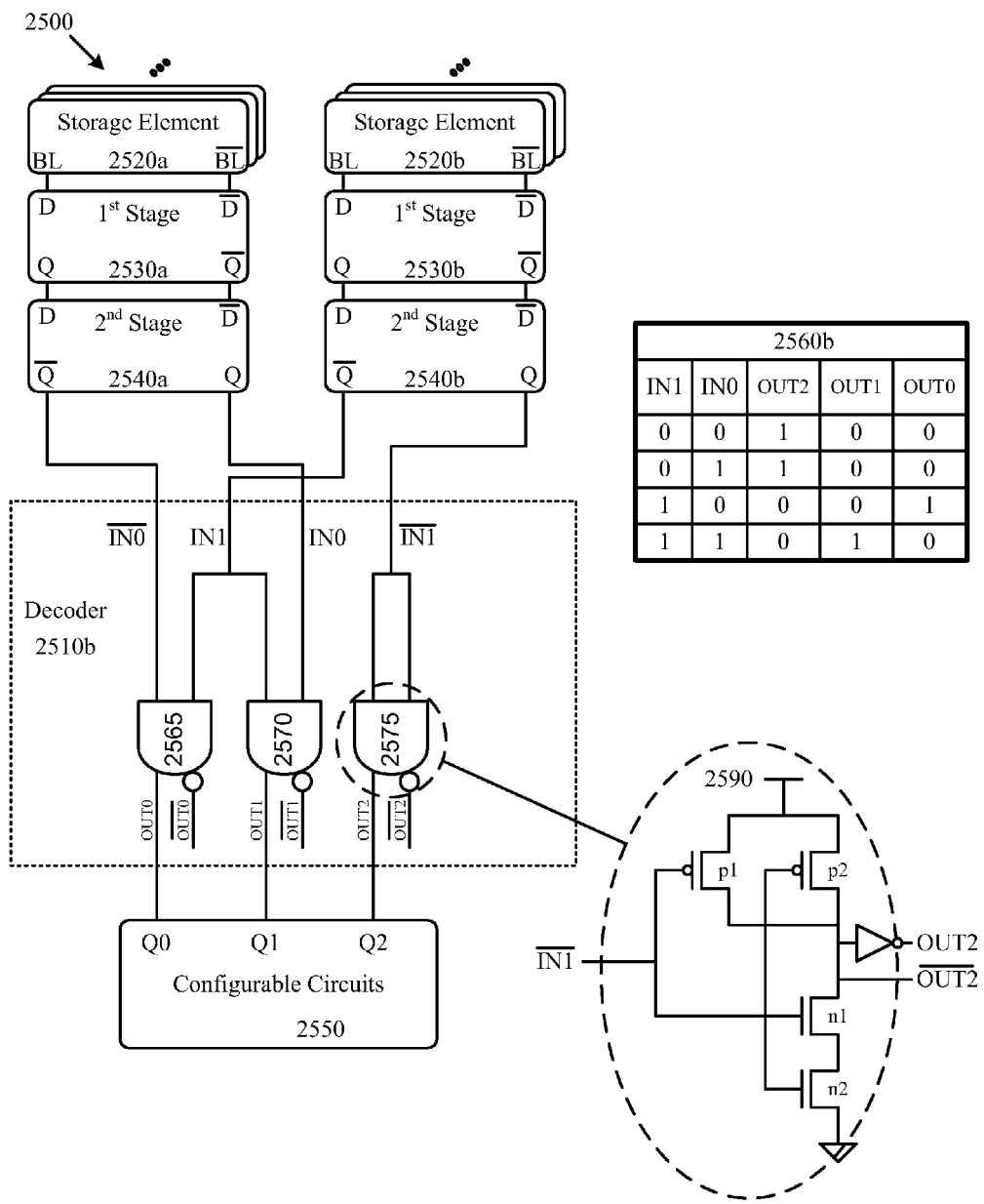
FIG. 25B illustrates a two-to-three decoder of some embodiments.

FIG. 25B illustrates a 2:3 decoder used in some embodiments. The decoder operates in a similar manner to that described above in reference to FIG. 25A with two input bits being used to generate three output bits.

Figure 25C:
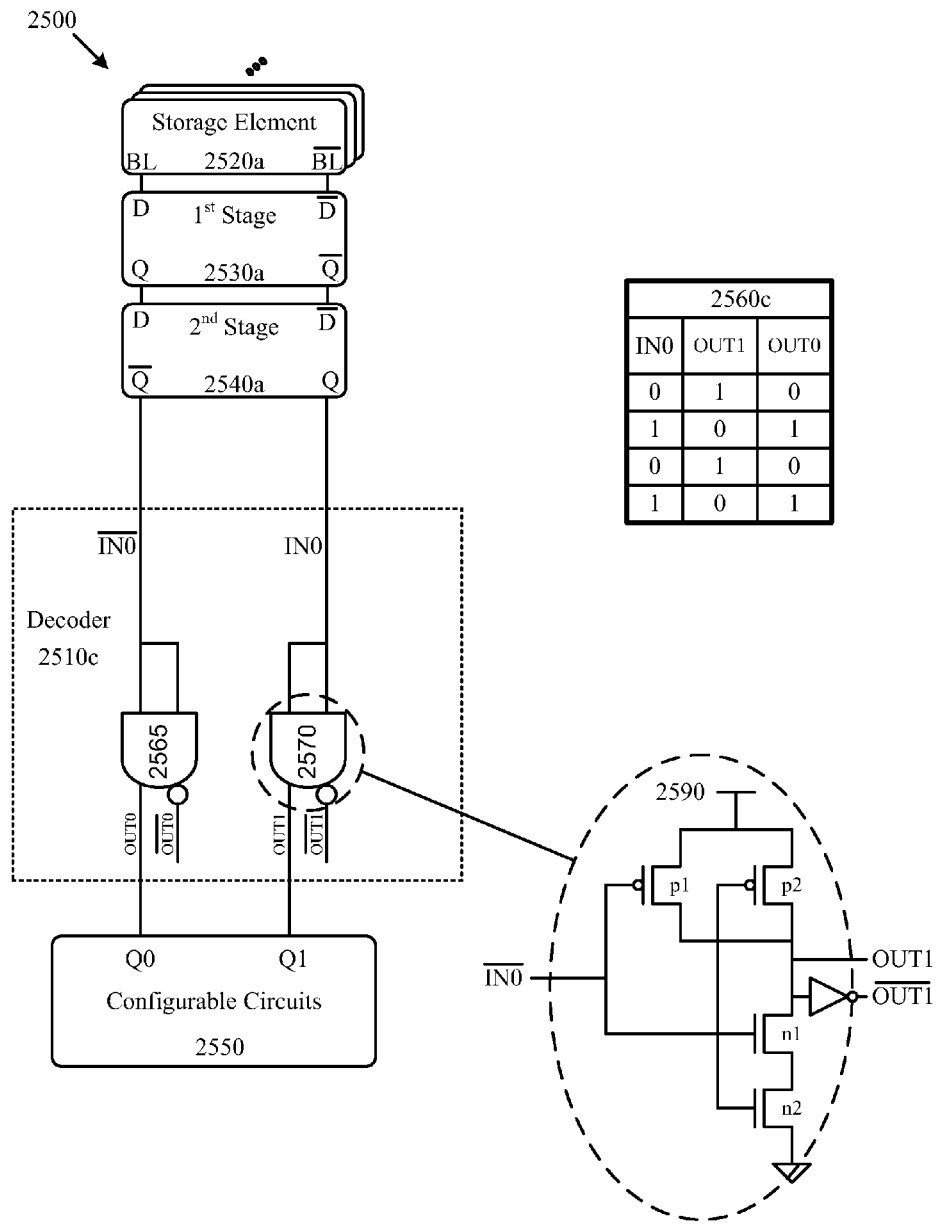
FIG. 25C illustrates a one-to-one decoder of some embodiments.

FIG. 25C illustrates a 1:1 decoder used in some embodiments. The decoder generates a complementary pair of output bits for each complementary pair of input bits.

One of ordinary skill in the art will recognize that the decoders 2510 may be implemented using different embodiments. For example, NOR gates could be substituted for the NAND gates of the decoder.

E. Decoder and Second Stage Variations

The decoder discussed above can be placed before or after the second stage of the context switcher. In some embodiments, the second stage and decoder are combined into a single element. Several of these variations on the encoder and second stage signal paths and architectures are described below.

1. Decoder Drives Second Stages

Figure 26:
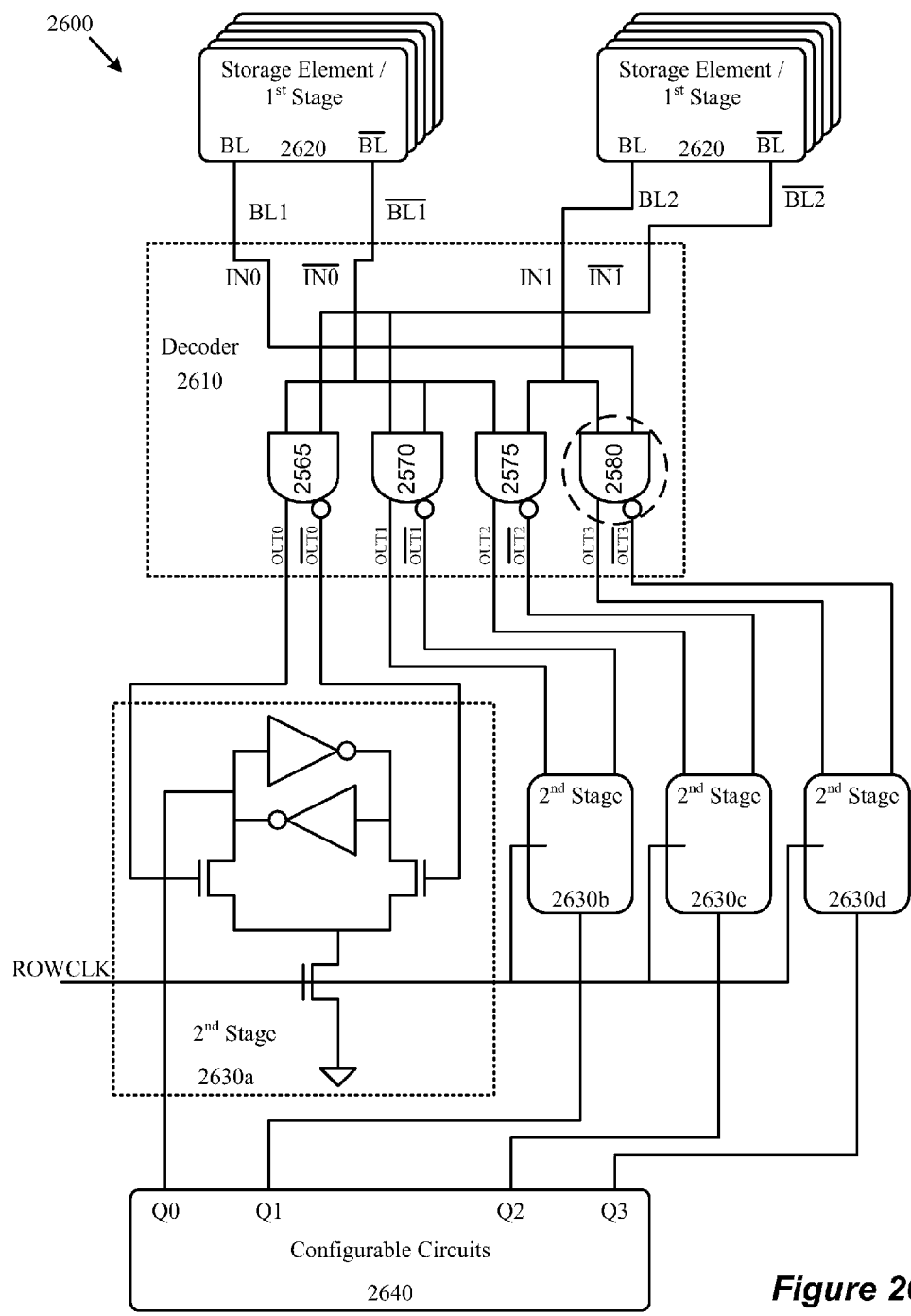
FIG. 26 illustrates an example context switcher where the second stage follows the decoder of some embodiments.

FIG. 26 illustrates a variation of the context switcher 2600 where the decoder 2610 takes its inputs from the first stages 2620 and provides its output to the second stages 2630a and 2630b. As shown, the context switcher includes two columns of storage elements or two first stages 2620, a decode 2610, four second stages 2630a, 2630b, 2630c, and 2630d, and a set of configurable circuits 2640. The decoder 2610 includes four NAND gates 2576, 2570, 2575, and 2580.

FIG. 26 represents a 2:4 decoder 2610 as an example, the actual decoder could be any of the embodiments described above in reference to FIG. 25A, 25B, or 25C among others. This embodiment of the slave and decoder elements of the context switcher allows the second stages to hide the decode delay of the decoder and minimize clock skew at the inputs of the configurable circuits. Combined with the first stages 2620 and the second stages 2630a and 2630b, the decoder 2610 illustrates one embodiment of the context switcher described in reference to FIG. 3, element 120b, or 120e.

As shown in FIG. 26, the half decoder 2610 includes two NAND gates, each including an inverter to provide complementary outputs. The second stages 2630 each contain a pair of cross-coupled inverters, a controllable pull-down transistor, and two other pull-down transistors connected to its storage nodes/outputs.

As shown in FIG. 26, the decoder takes the complementary outputs of the first stages 2620 of the context switcher and the decoder provides its outputs to the second stages 2630a and 2630b. The second stages then provide their outputs to the configurable circuits 2640. The first stages 2620 could be any of the first stages described in reference to FIGS. 11-15C or any of the master/slave variations described in reference to FIGS. 22-24. The second stages could be any of the second stages described in reference to FIGS. 16A-21B or the master/slave variations described in reference to FIGS. 22-24.

One of ordinary skill in the art will recognize that the decoder-slave combination may be implemented using different embodiments. For example, the decoder 2610 could provide single-ended outputs.

2. Second Stages Drive Decoder

Figure 27:
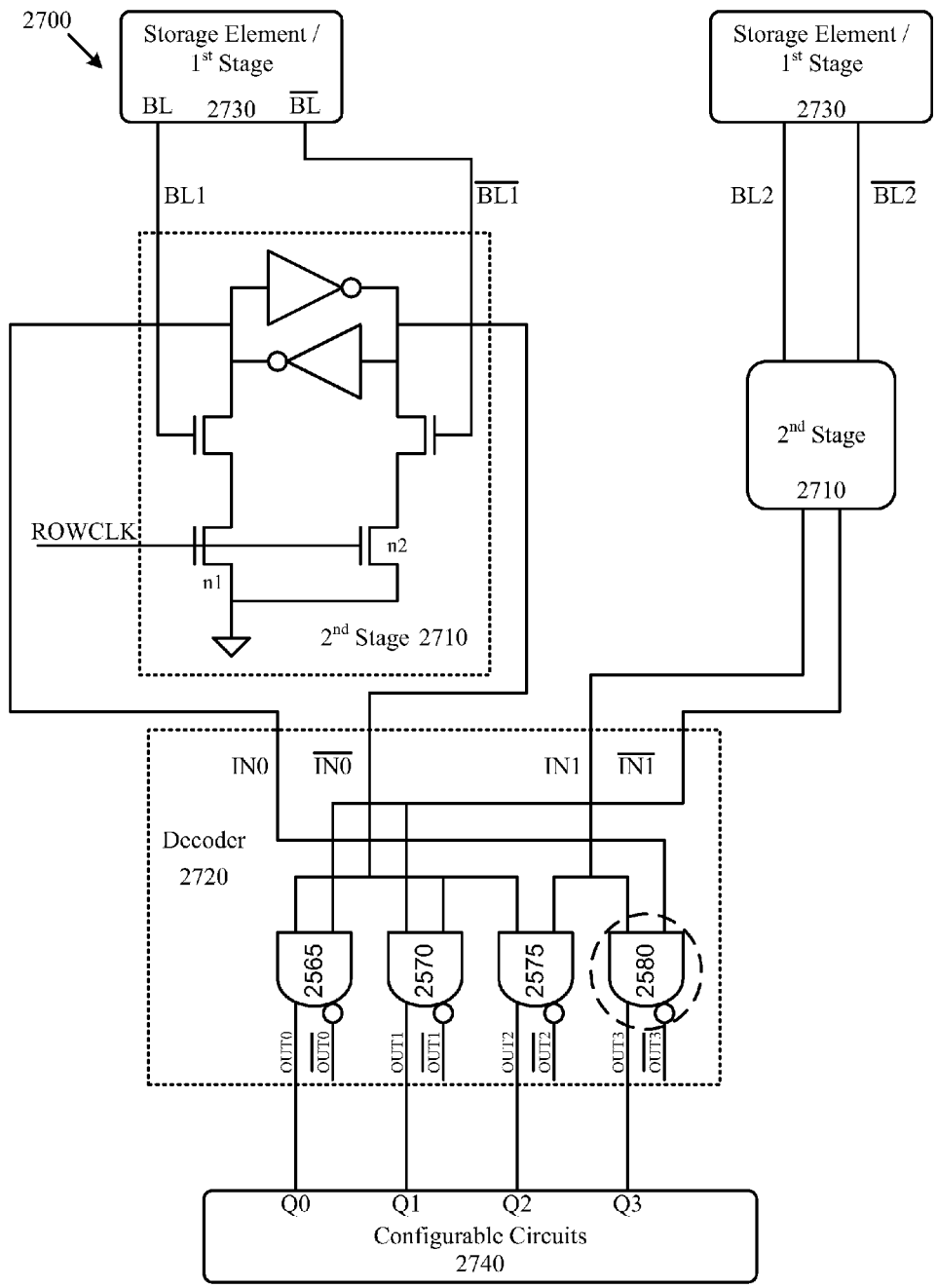
FIG. 27 illustrates an example context switcher where the decoder follows the second stage of some embodiments.

FIG. 27 illustrates a variation of the context switcher 2700 where the second stages 2710 drive the decoder 2720 which provides its outputs to the configurable circuits 2730. As shown, context switcher 2700 includes two columns of storage elements or a pair of first stages 2730, a pair of second stages 2710, and a half decoder 2720, and a set of configurable circuits 2740.

This embodiment of the slave and decoder elements of the context switcher minimizes the number of second stages, saving area and clock load, which also reduces power which varies linearly with clock load. Combined with the first stages 2730, the second stages 2710 the decoder 2720 illustrate one embodiment of the context switcher described in reference to FIG. 3, element 120c, or 120f.

As shown in FIG. 27, the decoder 2720 takes the complementary outputs of the second stages 2710 of the context switcher which receive their inputs form the first stages 2730. The outputs of the decoder drive the configurable circuits 2740. The first stages 2630 could be any of the first stages described in reference to FIGS. 11-15C or any of the master/slave variations described in reference to FIGS. 22-24. The second stages could be any of the second stages described in reference to FIGS. 16A-21B or the master/slave variations described in reference to FIGS. 22-24.

One of ordinary skill in the art will recognize that the slave-decoder combination may be implemented using different embodiments. For example, the second stages 2710 could provide single-ended outputs.

3. Combined Decoder and Second Stage

Figure 28:
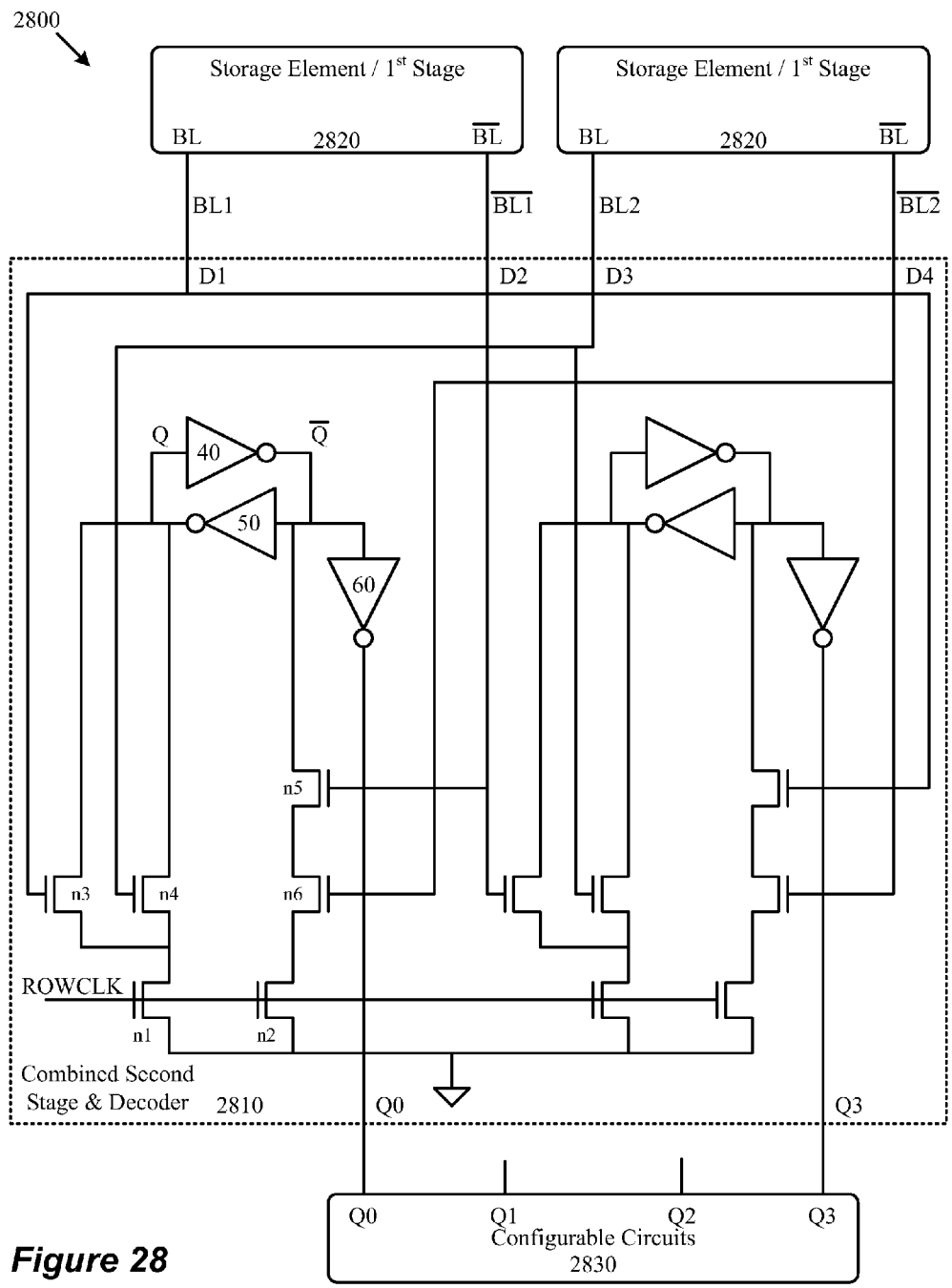
FIG. 28 illustrates a combined decoder and latch that form the second stage of the context switcher of some embodiments.

FIG. 28 illustrates a variation of the context switcher 2800 where the second stages are combined with the decoder to form one element 2810 which takes its inputs from the first stages 2820 and provides its outputs to the configurable circuits 2830. As shown, the context switcher 2800 includes a pair of storage elements or first stages 2820, a combined second stage and decoder 2810, and a set of configurable circuits 2830. As shown, the combined second stage and half decoder 2810 includes six inverters, eight pull-down transistors, and four controllable pull-down transistors.

FIG. 28 represents a half slave-decoder element 2810 for clarity. This embodiment of the slave and decoder elements of the context switcher minimizes circuit area. Combined with the first stages 2810, the slave-decoder 2810 illustrates one embodiment of the context switcher described in reference to FIG. 3, element 120d, or 120g.

As shown in FIG. 28, the half slave-decoder 2810 includes a pair of cross-coupled inverters to store each decoded bit (e.g. inverters 2840 and 2850 store the value to be output at the Q0 node (after inversion). The output of each cross-coupled storage element is passed through a buffering inverter (e.g. inverter 2860 buffers the Q's complement output of inverter 2850) before being provided to the configurable circuits 2830. In addition, two parallel-connected pull-down transistors are connected to the Q node of the storage cell (e.g. n3 and n4 are connected to the Q node that produces the Q0 output). As shown, two series connected pull-down transistors are connected to the Q's complement node of the storage cell (e.g. n5 and n6 are connected to the Q's complement node that provides the Q0 output). The decoder 2810 also includes two controllable pull-down transistors which connect the series and parallel pull-down transistors to ground (e.g. transistors n1 provides a path to ground for n3 and n4, and n2 provides a path to ground for n5 and n6 in the Q0 section of the slave-decoder).

As shown in FIG. 28, the half slave-decoder 2810 takes the complementary outputs of the first stages 2820 of the context switcher 2800. The outputs of the slave-decoder drive the configurable circuits 2830. The first stages 2830 could be any of the first stages described in reference to FIGS. 11-15C.

The operation of the slave-decoder 2810 is illustrated by reference to the Q0 output of the slave-decoder. During a write operation to the slave-decoder 2810, ROWCLK is driven to logic high, enabling transistors n1 and n2. If either D1 or D2 is logic high, either n3 or n4 is turned on, and the Q node is pulled-down through n3 or n4 and n1. The Q's complement node is then driven to logic high through the inverter 2840, while the Q0 output is inverted again through inverter 2850. If both D3 and D4 are logic high, the Q's complement node is pulled-down through n5, n6 and n2. The Q node is then driven by the output of the inverter 2860, while the Q0 node is driven by the output of inverter 2850. For either state of Q0, the value is latched when ROWCLK is brought to logic high, and the values at Q and Q's complement reinforce each other's current state through the inverters 2840 and 2860. The other outputs of the slave-decoder 2810 are generated in a similar manner, with the inputs connected in such a way as to produce the truth table 2560 discussed above in reference to FIG. 25A, 25B, or 25C.

One of ordinary skill in the art will recognize that the slave-decoder combination may be implemented using different embodiments. For example, the slave-decoder 2810 could be implemented using pmos transistors instead of nmos to control the output values.

F. Exemplary Circuits

A number of exemplary partial context switcher embodiments, including storage elements, first stages, second stages, and decoders is presented below. These embodiment illustrate the complete signal path from the storage cells to the configurable circuits.

Figure 29A:
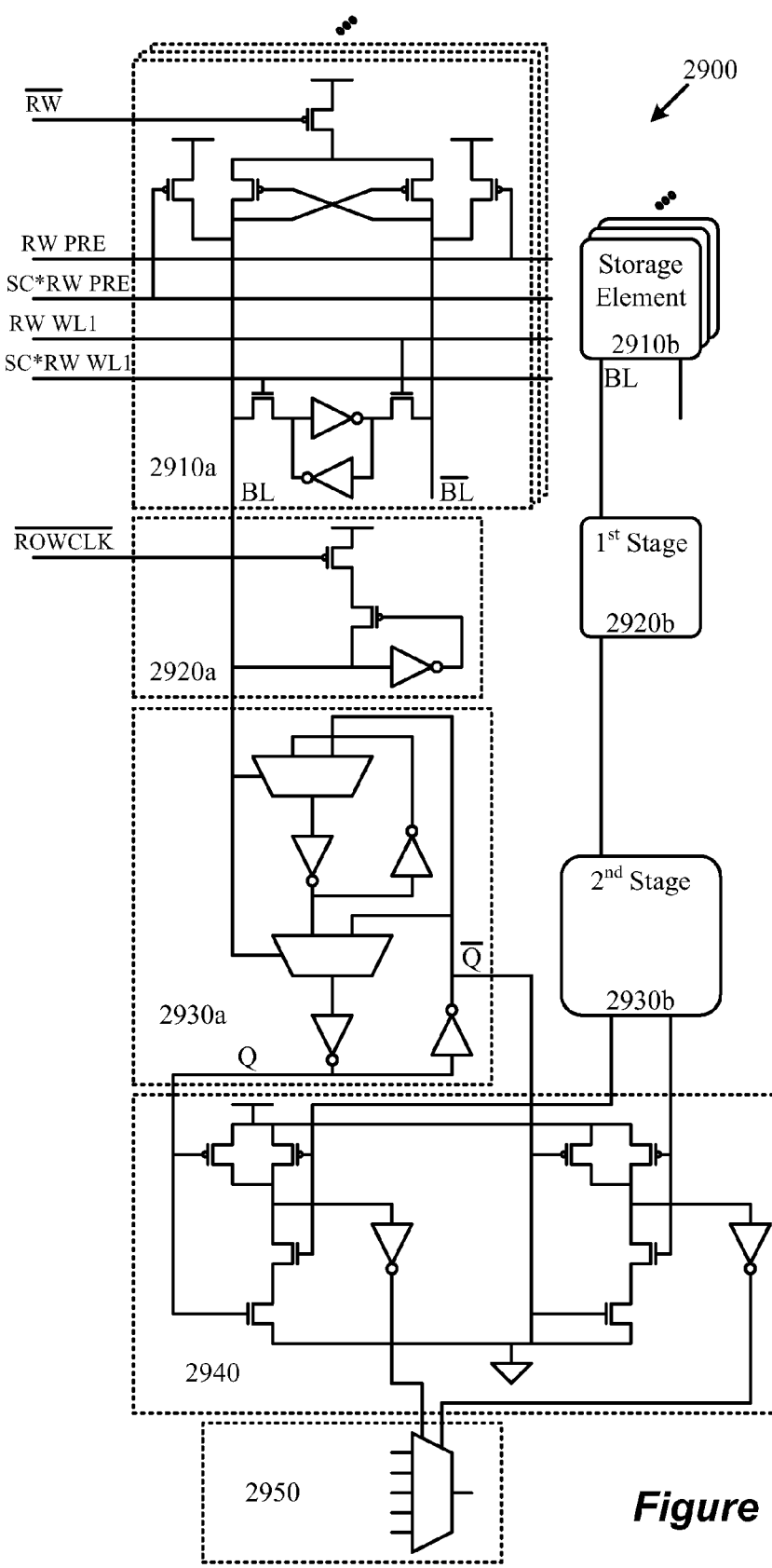
FIG. 29A illustrates an exemplary embodiment including a single-ended read, pre-charge storage cell and weak keeper as a first stage, toggle latch as second stage, and decoder as the context switcher of some embodiments.

1. Single Port Storage, Single-Ended Read with Bit Line Pre-Charge and Toggle Latch Driving Decoder FIG. 29A illustrates an exemplary embodiment of a partial context switcher using several of the circuit blocks described above. As shown, the partial context switcher 2900 includes columns of storage elements 2910a and 2910b as first stages, a weak keeper for each column 2920a and 2920b, two toggle latches 2930a and 2930b as second stages, a half-decoder 2940, and a set of configurable circuits 2950.

As shown in the figure, the context switcher 2900 captures data from the single-port pre-charge storage elements 2910a and 2910b. The operation of the storage elements was described in detail above in reference to FIGS. 9A and 9B. The context switcher 2900 includes two weak keepers 2920a and 2920b that hold BL at a logic high level after a pre-charge operation. The operation of the weak keepers was described in detail above in reference to FIG. 12. In addition, the single-ended BL outputs of the storage cells 2910a and 2910b drive the input of the toggle latches 2930a and 2930b. The operation of the toggle latches was described in detail above in reference to FIG. 20. The complementary outputs of the toggle latches are passed to the decoder 2940. For clarity, only one-half of a full decoder is shown. The operation of the decoder is described in detail above in reference to FIG. 25A, 25B, or 25C. The outputs of the decoder drive the configurable circuits of the IC 2950.

Figure 29B:
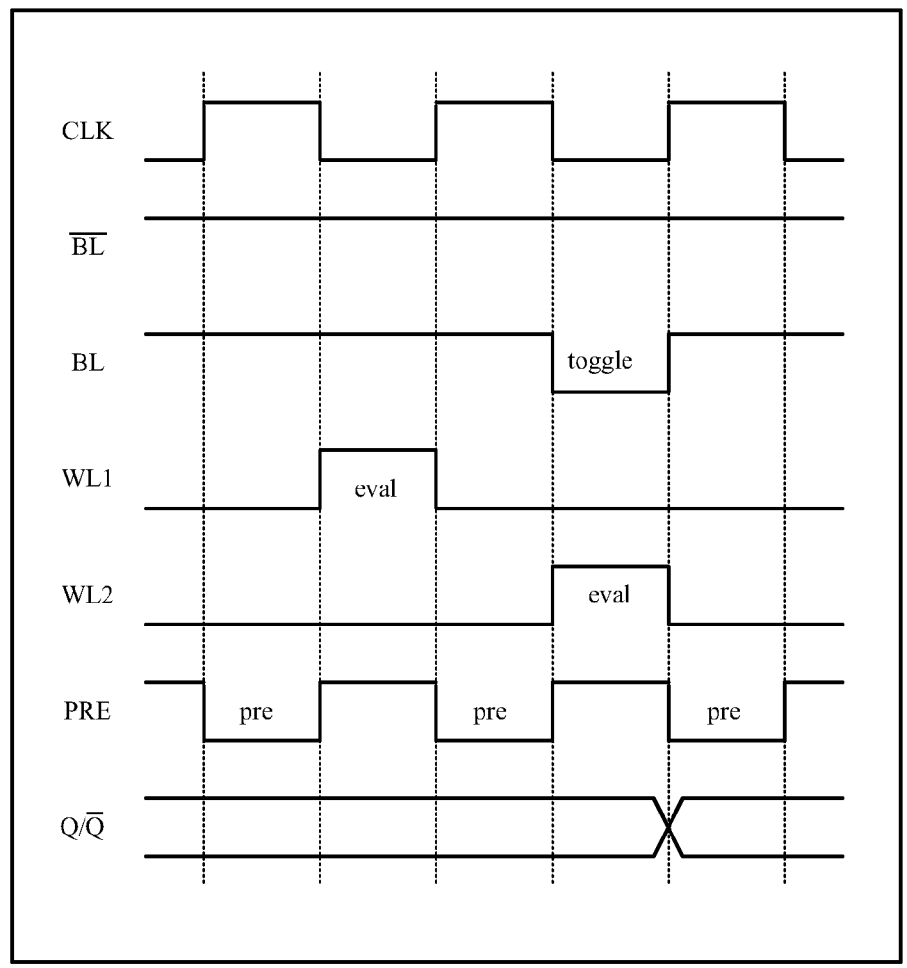
FIG. 29B illustrates a timing diagram for the circuit of FIG. 29A of some embodiments.

The operation of the complete circuit is described by the partial timing diagram of FIG. 29B. Note that the timing diagram is for illustrative purposes and is not meant to accurately reflect setup time, slew rates, or sample-and-hold times, etc. As shown in the diagram, the single-ended first and second stage embodiment of 2900 does not use BL's complement, so that signal is at the pre-charge voltage during the operation of this circuit. As shown in the diagram, the PRE signal is used to pre-charge the bit lines of the storage elements 2910a and 2910b. The pre-charge operation is described in greater detail in reference to FIGS. 9A and 9B above. Also, as shown in the diagram 2960, when WL1 is driven to logic high, the nmos pass transistor of the storage element is turned on, and the bit line from storage element 2910a may be evaluated (i.e. read) by the subsequent circuitry (in this example, WL1 is used for simplicity, whereas the actual signal is SC*RW WL). In the example shown, BL is high during the WL1 evaluation, so there is no change to the value held in the toggle latch 2930a. When WL2 is activated (reading the data held in storage element 2910b), the BL signal goes to logic low in this example, and the toggle latch 2930b changes its output in response to the change on BL, thus updating the data that is passed to the decoder 2940. The decoder in turn decodes the data placed at its inputs and provides its decoded outputs to the configurable circuits 2950.

One of ordinary skill in the art will recognize that the context switcher 2900 may be implemented using different embodiments. For example, the second stages 2930a and 2930b could be placed after the decoder 2940.

Figure 30A:
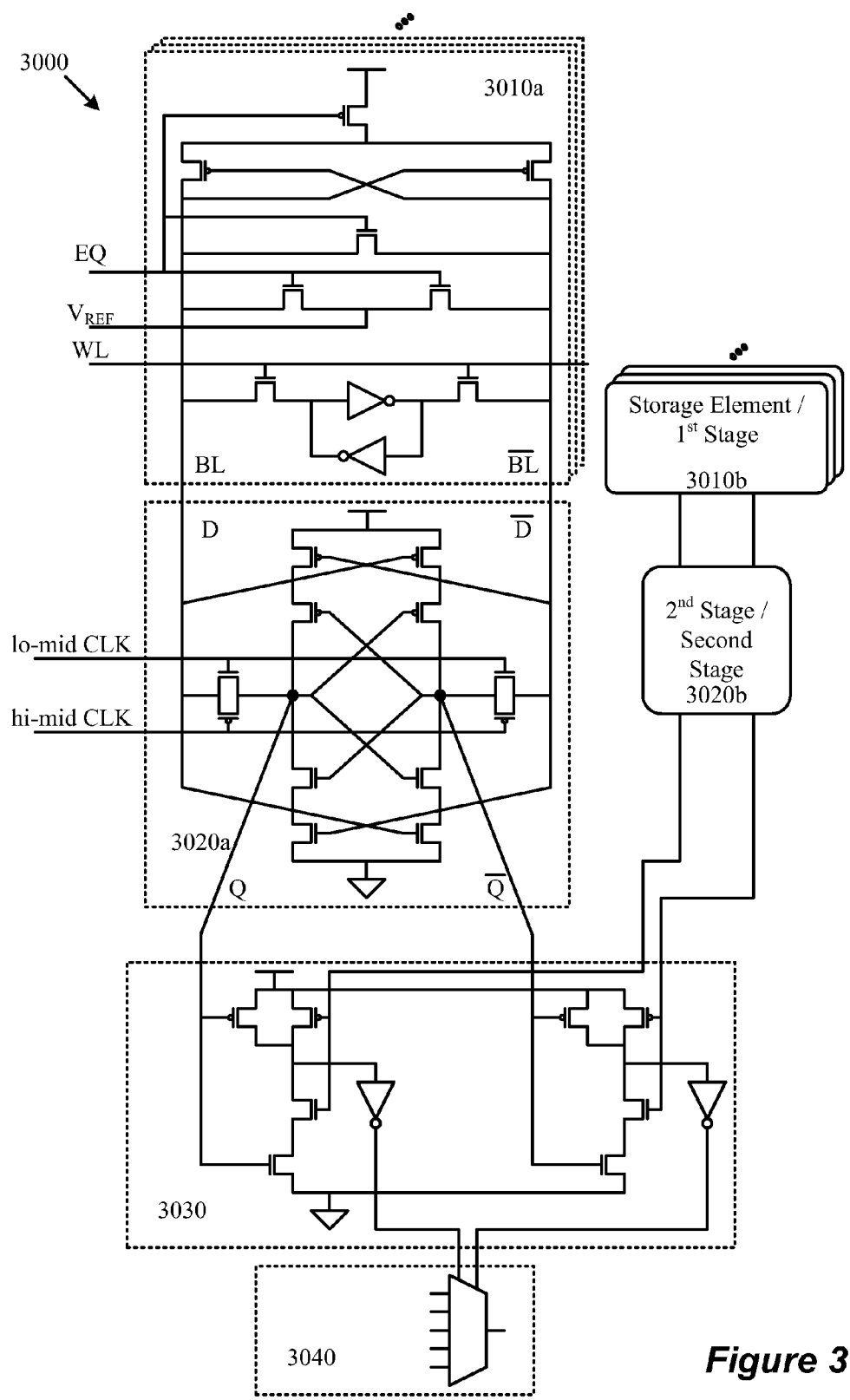
FIG. 30A illustrates an exemplary embodiment including an equalized storage cell as a first stage, a half-swing clock latch as a second stage, and a decoder as the context switcher of some embodiments.

2. Single Port Storage, Differential Read with Bit Line Equalization, Half-Swing Clock Latch Driving Decoder FIG. 30A illustrates another exemplary embodiment of a partial context switcher using several of the circuit blocks described above. As shown, the partial context switcher 3000 includes two columns of storage elements 3010a and 3010b, two half-swing clock latches 3020a and 3020b, a half decoder 3030, and a set of configurable circuits 3040.

As shown in the figure, the context switcher 3000 captures data from the single-port equalized columns of storage elements 3010a and 3010b that also act as the first stage in some embodiments. The operation of the storage elements was described in detail above in reference to FIGS. 8A and 8B. The context switcher 3000 includes two half-swing clock second stages 3020a and 3020b that store the value of BL and its complement. The operation of the second stages was described in detail above in reference to FIGS. 21A and 21B. The complementary outputs of the toggle latches are passed to the decoder 3030. For clarity, only one-half of a full decoder is shown. The operation of the decoder is described in detail above in reference to FIG. 25A, 25B, or 25C. The outputs of the decoder drive the configurable circuits of the IC 3040.

Figure 30B:
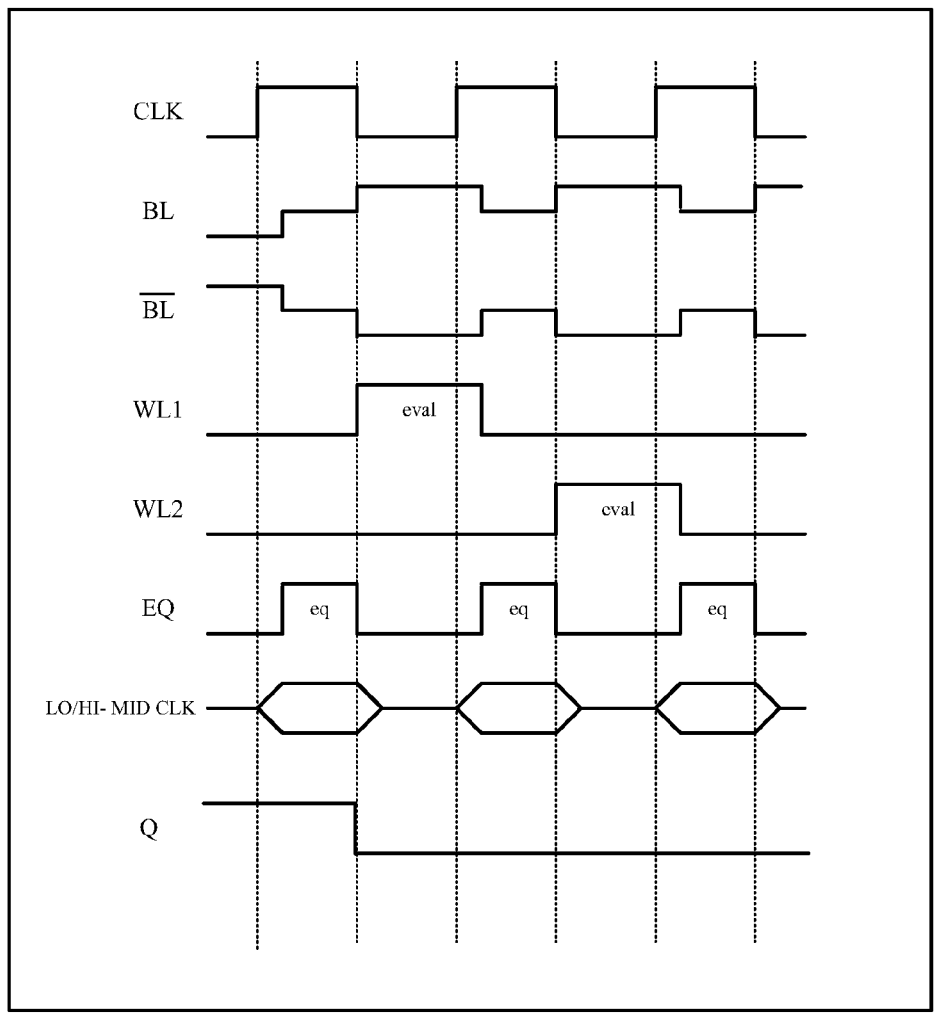
FIG. 30B illustrates a timing diagram for the circuit of FIG. 30A of some embodiments.

The operation of the complete circuit is described by the partial timing diagram of FIG. 30B. Note that the timing diagram is for illustrative purposes and is not meant to accurately reflect setup time, slew rate, or sample-and-hold times, etc. As shown in the diagram, the EQ signal is used to pre-charge the bit lines of the storage elements 3010a and 3010b to some mid-level voltage, $V_{REF}$. The equalization operation is described in greater detail in reference to FIGS. 8A and 8B above. Also, as shown in the diagram, when WL1 is driven to logic high, the nmos pass transistors of the storage element are turned on, and the complementary bit lines from storage element 3010a may be evaluated (i.e. read) by the second stage 3020a. In the example shown, BL is logic high during the WL1 evaluation, while its complement is logic low. When WL2 is activated (reading the data held in storage element 3010b), the BL signal again goes to logic high in this example, while its complement goes to logic low. As further shown in the diagram and figure, during the evaluation of the bit lines, the lo-mid and hi-mid clocks are brought to their mid-range value, thus turning on the transmission gates that couple the bit lines to the inputs of the second stages 3020a and 3020b. The operation of the second stages during an evaluation cycle is described in detail above in reference to FIG. 21. Once the half-swing clocks return to their logic high and low states, the transmission gates are opened, and the second stages 3020a and 3020b hold the data at their complementary Q outputs to be read by the decoder 3030. The decoder then decodes the signals at its inputs, and provides the decoded data to the configurable circuits 3040.

One of ordinary skill in the art will recognize that the context switcher 3000 may be implemented using different embodiments. For example, the second stages 3020a and 3020b could be placed after the decoder 3030.

Figure 31A:
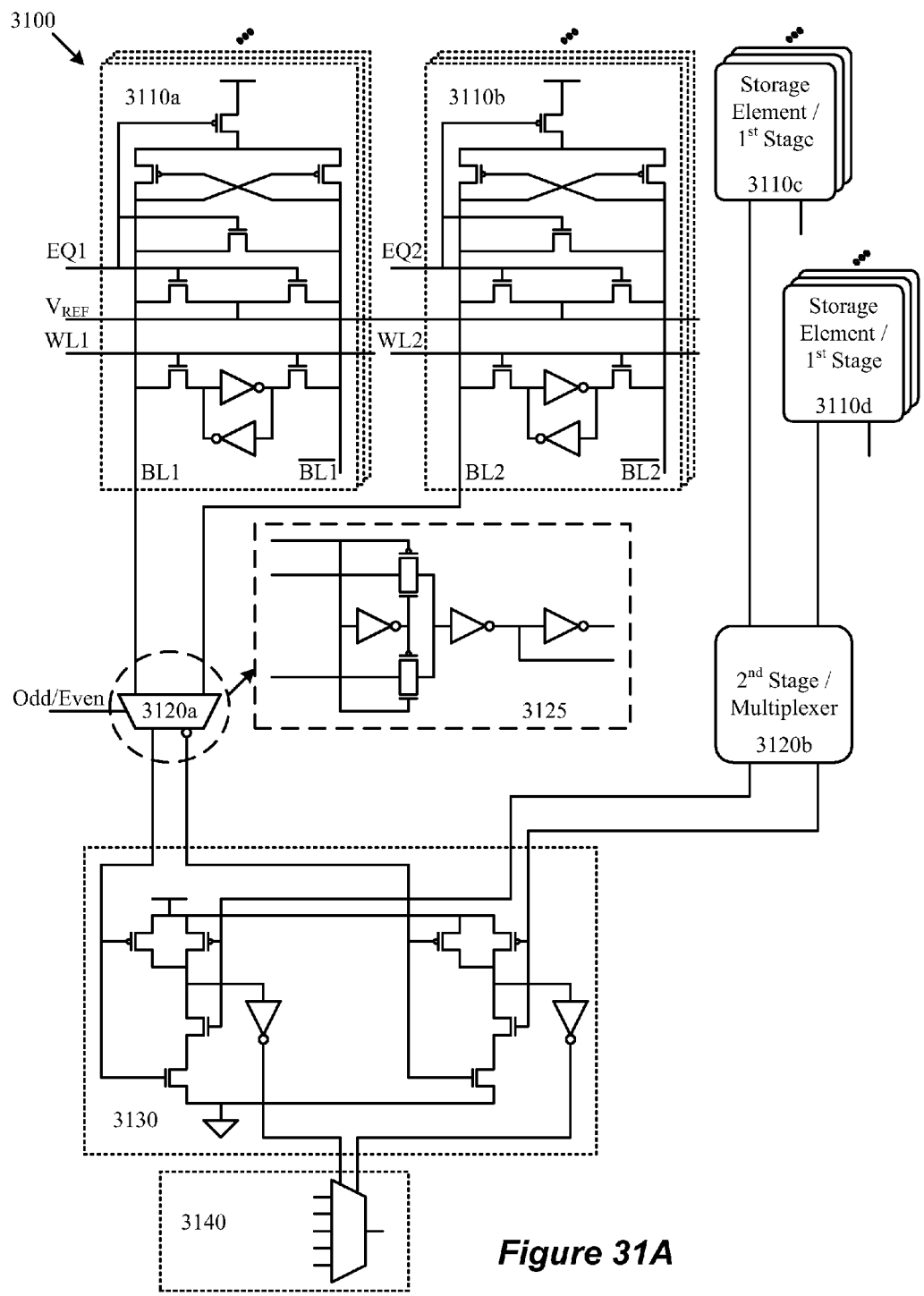
FIG. 31A illustrates a dual-column storage cell as a first stage, and a two-to-one multiplexer as a second stage of the context switcher of some embodiments.

3. Single Port Storage, Differential Read with Bit Line Equalization, with Odd/Even Multiplexer Driving Decoder FIG. 31A illustrates another exemplary embodiment of a partial context switcher using several of the circuit blocks described above. As shown, the context switcher 3100 includes two pairs of columns of storage cells 3110a and 3110b, and 3110c and 3110d, two odd-even multiplexers 3120a and 3120b, a half decoder 3130, and a set of configurable circuits 3140.

As shown in the figure, the context switcher 3100 captures data from the single-port equalized storage elements 3110a, 3110b, 3110c, and 3110d that also act as the first stage in some embodiments. The storage elements are arranged in two columns for each multiplexer in this configuration. The operation of the storage elements was described in detail above in reference to FIGS. 8A and 8B. The context switcher 3100 includes two odd/even multiplexers 3120a and 3120b that alternately select and store the output from either storage element 3110a or 3110b in the case of multiplexer 3120a (while multiplexer 3120b alternately selects and stores the output from either storage element 3110c or 3110d). The transistor-level embodiment of the multiplexers is shown in breakout section 3125. The operation of the odd/even multiplexer as a second stage of the context switcher was described in detail above in reference to FIGS. 21A and 21B. The complementary outputs of the odd/even multiplexers are passed to the decoder 3130. For clarity, only one-half of a full decoder is shown. The operation of the decoder is described in detail above in reference to FIG. 25A, 25B, or 25C. The outputs of the decoder drive the configurable circuits of the IC 3140.

Figure 31B:
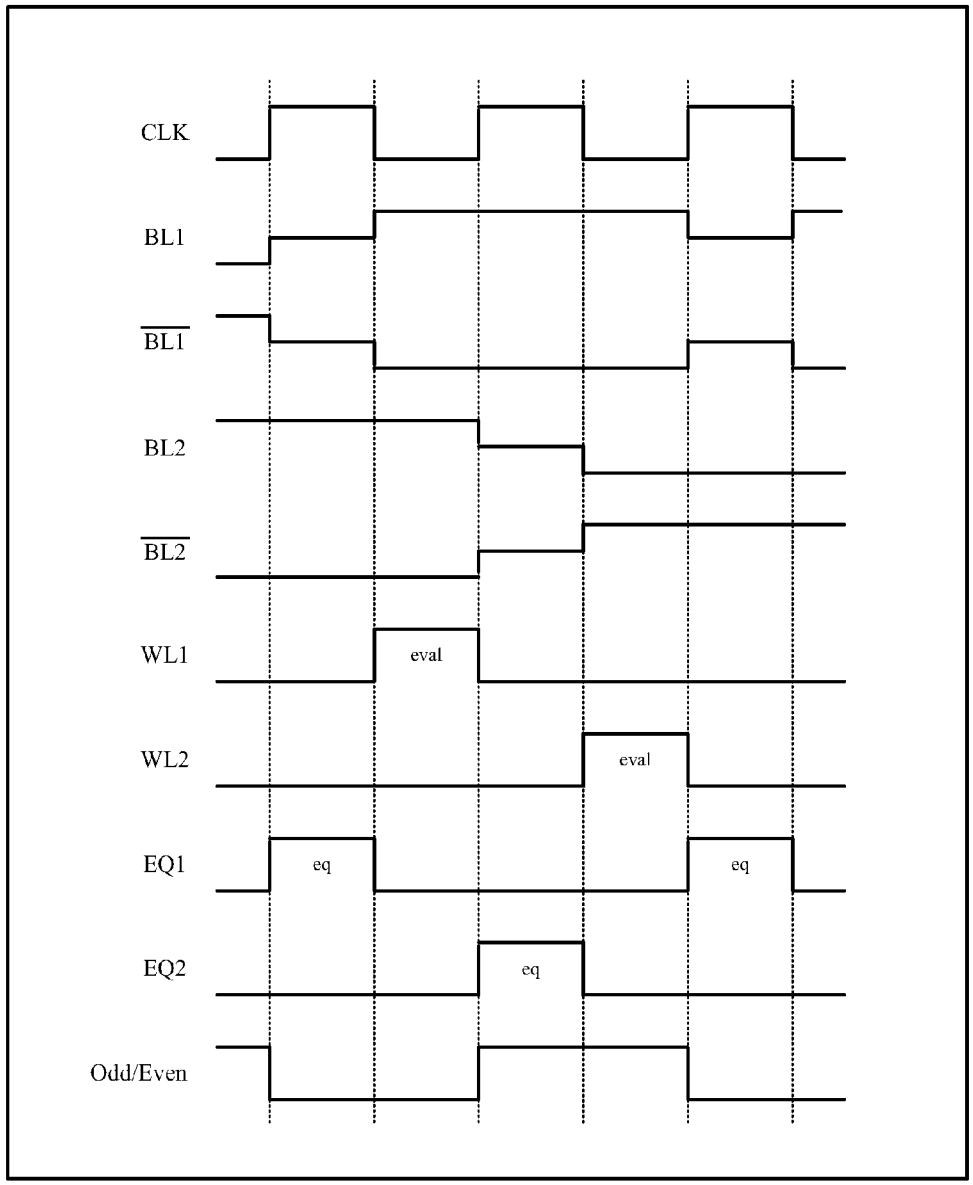
FIG. 31B illustrates a timing diagram for the circuit of FIG. 31A of some embodiments.

The operation of the complete circuit is described by the partial timing diagram of FIG. 31B. Note that the timing diagram is for illustrative purposes and is not meant to accurately reflect setup time, slew rate, or sample-and-hold times, etc. As shown in the diagram 3150, the EQ signal is used to pre-charge the bit lines of the storage elements 3110a, 3110b, 3110c, and 3110d to some mid-level voltage, $V_{REF}$. The equalization operation is described in greater detail in reference to FIGS. 8A and 8B above. Also, as shown in the diagram, when WL1 is driven to logic high, the nmos pass transistors of the storage element are turned on, and the complementary bit lines from storage element 3110a may be evaluated (i.e. read) by the second stage odd/even multiplexer 3120a. In addition, when WL1 is at logic high, the odd/even selection bit is at logic low, thus selecting the input of the multiplexer 3120a corresponding to BL1. In the example shown, BL is logic high during the WL1 evaluation, while its complement is logic low. When WL2 is activated (reading the data held in storage element 3110b), the BL signal again goes to logic high in this example, while its complement goes to logic low. In addition, when WL2 is at logic high, the odd/even selection bit is at logic high, thus selecting the input of the multiplexer 3120a corresponding to BL2. The operation of the odd/even multiplexers during an evaluation cycle is described in detail above in reference to FIG. 14. The multiplexers then pass their complementary outputs to the decoder 3130. The decoder then decodes the signals at its inputs, and provides the decoded data at its outputs to the configurable circuits 3140.

One of ordinary skill in the art will recognize that the context switcher 3100 may be implemented using different embodiments. For example, the multiplexers 3120a and 3120b could include complementary inputs for differential-reading of the storage elements.

Figure 32A:
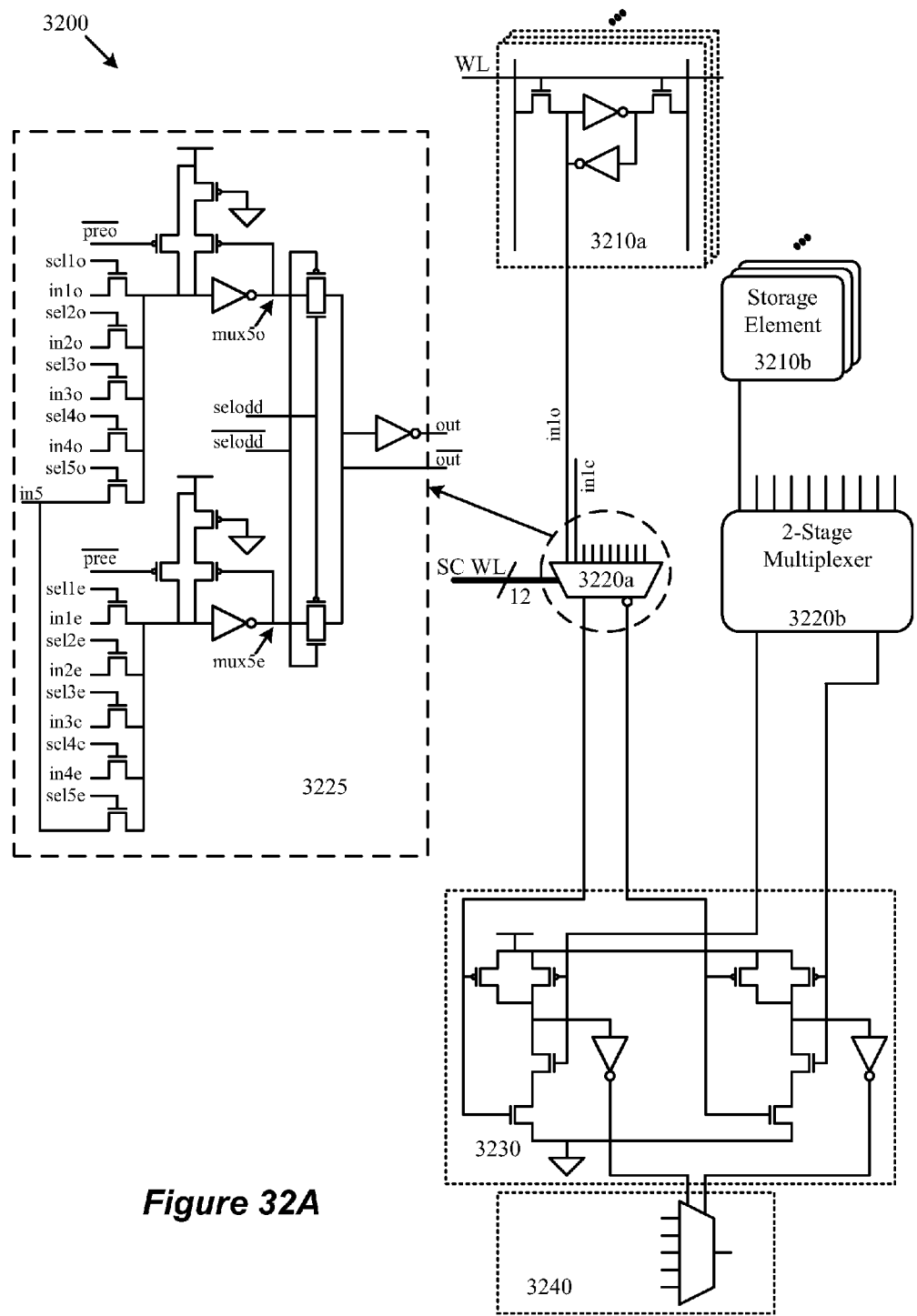
FIG. 32A illustrates a two-stage multiplexer and decoder as the context switcher of some embodiments.

4. Single Port Storage with Tapped Q Node and Two-Stage Multiplexer Driving Decoder FIG. 32A illustrates another exemplary embodiment of a partial context switcher using several of the circuit blocks described above. A shown, the context switcher includes two columns of storage elements 3210a and 3210b, two two-stage multiplexers 3220a and 3220b, a half-decoder 3230, and a set of configurable circuits 3240.

As shown in the figure, the context switcher 3200 captures data directly from the Q nodes of the storage elements 3210a and 3210b that also act as the first stage in some embodiments. The storage elements are arranged in two columns for each multiplexer in this configuration. The operation of the storage elements in this configuration was described in detail above in reference to FIGS. 15A, 15B, and 15C. The context switcher 3200 includes two two-stage multiplexers 3220a and 3220b. Within the multiplexers, as shown in breakout section 3225, the first stage selects from among four storage element inputs on the "even" side, and four storage element inputs on the "odd" side. As shown, the storage element 3210a is connected to the in1o input of the multiplexer 3220a, while another storage element may be connected to input in1e. In some embodiments, the inputs of the multiplexers 3220 may be arranged such that the inputs alternate between the even and odd side (i.e. in1o is followed by in1e, etc.), in other embodiments, the order of the inputs may be arranged in a different manner (e.g. with all odd inputs placed next to each other, and all even inputs next to each other). The second stage of the multiplexers then selects either the odd or even branch for evaluation. The operation of the two-stage multiplexer was described in detail above in reference to FIG. 22. The complementary outputs of the two-stage multiplexers are passed to the decoder 3230. For clarity, only one-half of a full decoder is shown. The operation of the decoder is described in detail above in reference to FIG. 25A, 25B, or 25C. The outputs of the decoder drive the configurable circuits of the IC 3240.

Figure 32B:
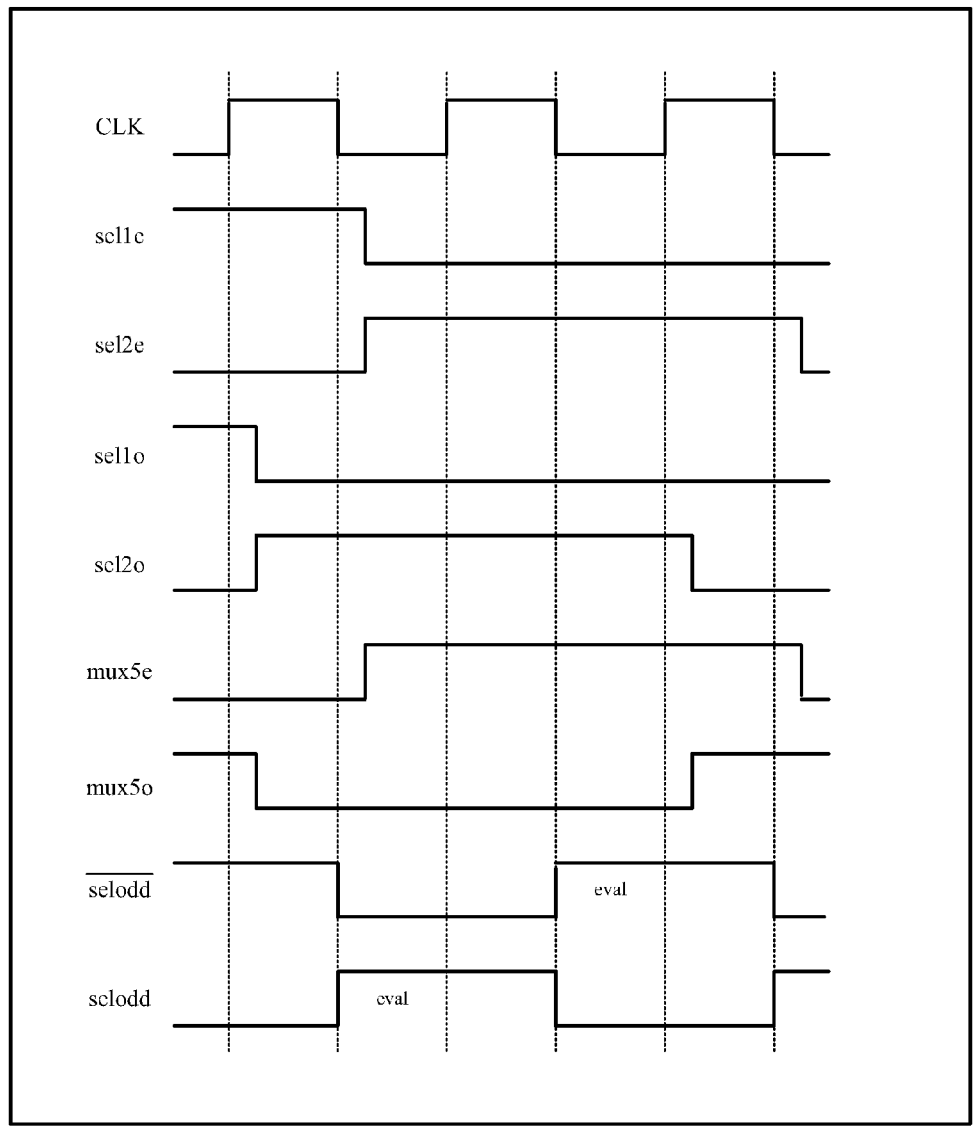
FIG. 32B illustrates a timing diagram for the circuit of FIG. 32A of some embodiments.

The operation of the complete circuit is described by the partial timing diagram of FIG. 32B. Note that the timing diagram is for illustrative purposes and is not meant to accurately reflect setup time, slew rate, or sample-and-hold times, etc. As shown in the example of diagram 3250, when sel1e is logic high, the input in1e is selected and passed through the inverter to node mux5e. When sel1e is brought to logic low, and sel2e is brought to logic high, input in2e is selected on the even side of the first stage of the multiplexers. When the even signal is also logic high, the value at node mux5e is passed through the transmission gate to the outputs of the multiplexer (the signal is also inverted once more). By switching the inputs (from in1e to in2e) while the even signal is logic low, the two-stage multiplexer allows the data to stabilize at node mux5e. Once the even signal is brought to logic high, the second stage of the multiplexer passes the value to its complementary outputs. The two-stage multiplexer operates in the same manner when reading from the odd column of storage elements, except the odd signal is logic high, while the even signal is logic low. The operation of the two-stage multiplexers during an evaluation cycle is described in detail above in reference to FIG. 22. The multiplexers pass their complementary outputs to the decoder 3230. The decoder then decodes the signals at its inputs, and provides the decoded data at its outputs to the configurable circuits 3240.

One of ordinary skill in the art will recognize that the context switcher 3200 may be implemented using different embodiments. For example, the first stage of the multiplexers 3220a and 3220b could include transmission gates instead of nmos pass transistors at the inputs.

Figure 33A:
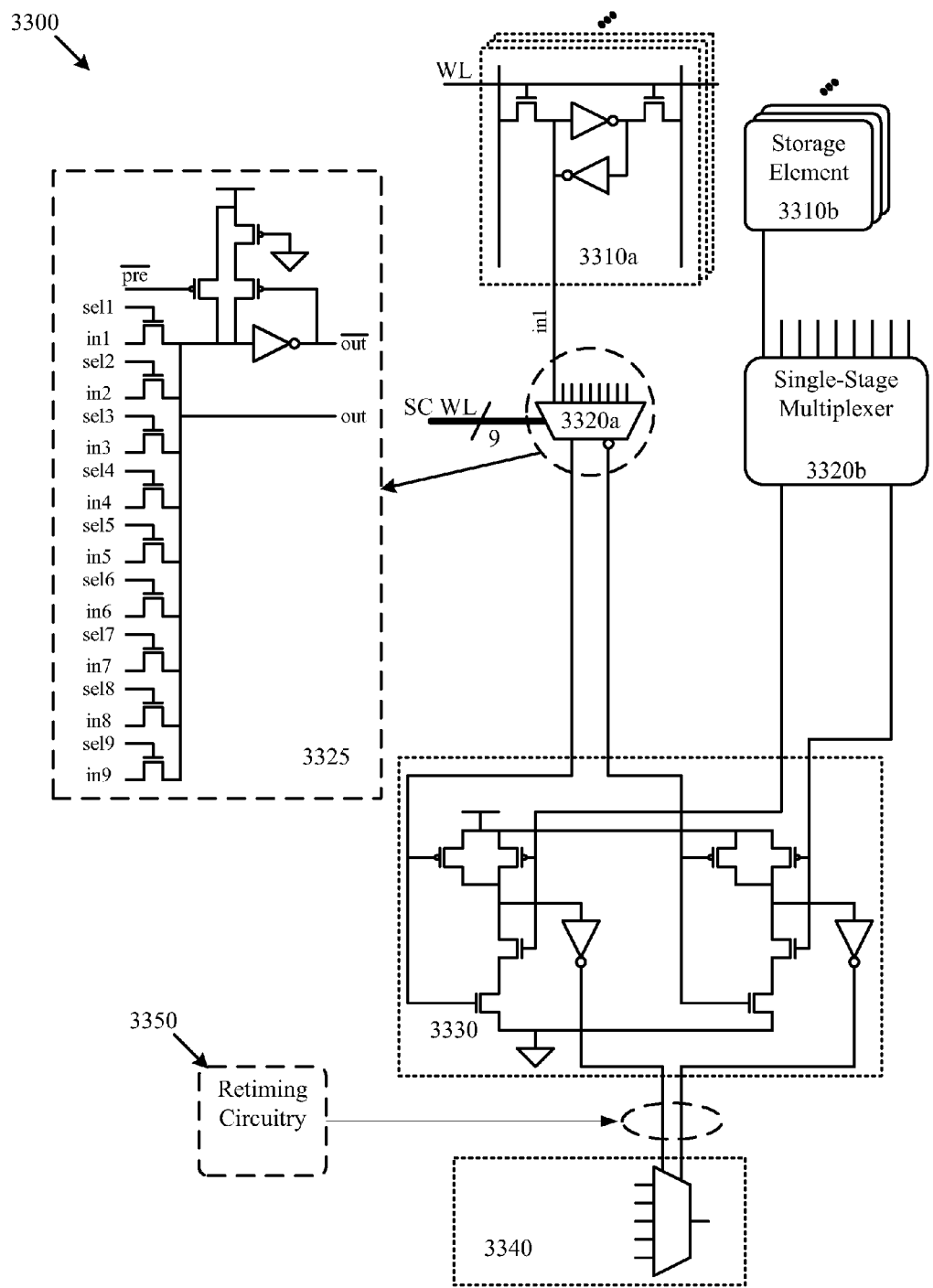
FIG. 33A illustrates a single stage multiplexer as the context switcher of some embodiments.

5. Single Port Storage with Tapped Q Node with One-Stage Multiplexer Driving Decoder FIG. 33A illustrates another exemplary embodiment of a partial context switcher using several of the circuit blocks described above. As shown, the context switcher 3300 includes two columns of storage elements 3310a and 3310b, two single-stage multiplexers 3320a and 3320b, a half decoder 3330, and a set of configurable circuits 3340.

As shown in the figure, the context switcher 3300 captures data directly from the Q nodes of the storage elements 3310a and 3310b that also act as the first stage in this embodiment. The operation of the storage elements in this configuration was described in detail above in reference to FIGS. 15A-15C. The context switcher 3300 includes two single-stage multiplexers 3320a and 3320b. Within the multiplexers, as shown in breakout section 3325, a single input is selected and passed to the output as a complementary signal. The operation of the single-stage multiplexer was described in detail above in reference to FIGS. 23A and 23B. The complementary outputs of the single-stage multiplexers are passed to the decoder 3330. For clarity, only one-half of a full decoder is shown. The operation of the decoder is described in detail above in reference to FIG. 25A, 25B, or 25C. The outputs of the decoder drive the configurable circuits of the IC 3340.

Figure 33B:
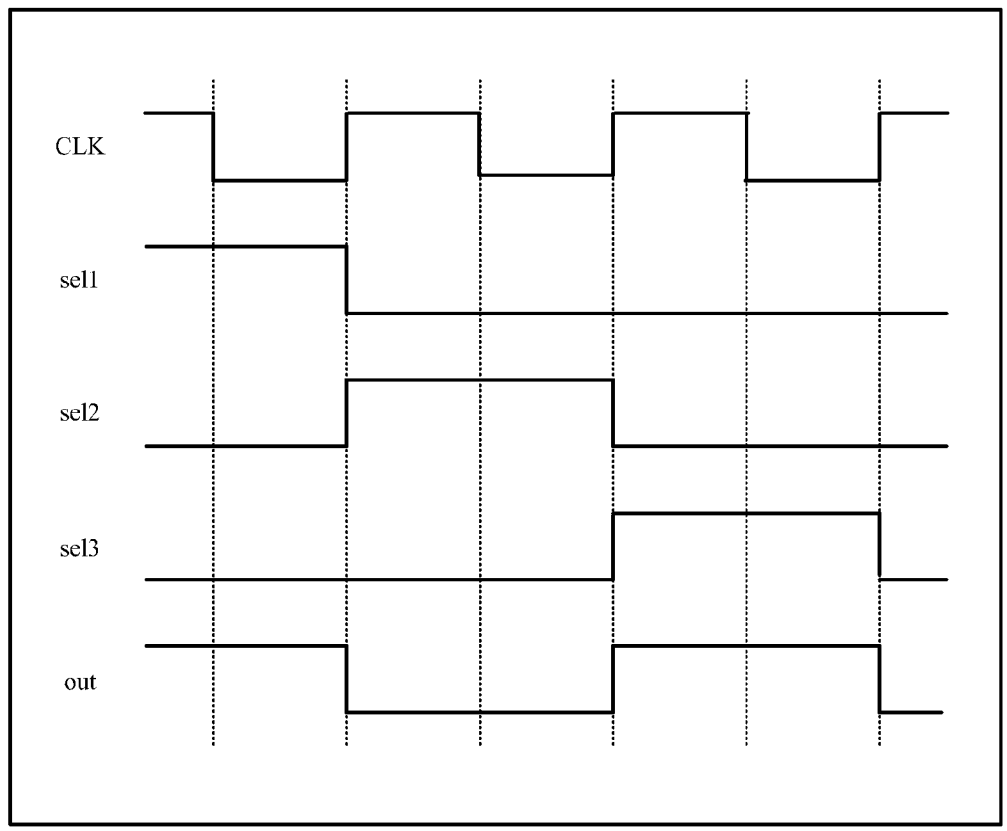
FIG. 33B illustrates a timing diagram for the circuit of FIG. 33A of some embodiments.

The operation of the complete circuit is described by the partial timing diagram of FIG. 33B. Note that the timing diagram is for illustrative purposes and is not meant to accurately reflect setup time, slew rate, or sample-and-hold times, etc. As shown in the example of diagram, the multiplexer cycles through its inputs by first activating sel1, then sel2, then sel3. When sel1 is at a logic high, in1 is selected and passed to the output of the multiplexer. When sel2 is at a logic high, in2 is selected, and so on. The output of the multiplexer is simply the selected input and its logical complement. The operation of the single-stage multiplexers during an evaluation cycle is described in detail above in reference to FIG. 23. The multiplexers pass their complementary outputs to the decoder 3330. The decoder then decodes the signals at its inputs, and provides the decoded data at its outputs to the configurable circuits 3340. In some embodiments, because of the nmos pass delay and decoder delay, the decoder 3330 passes its outputs to re-timing circuitry 3350 before it is passed to the configurable circuits.

One of ordinary skill in the art will recognize that the context switcher 3300 may be implemented using different embodiments. For example, the multiplexers 3320a and 3320b could include transmission gates instead of nmos pass transistors at its inputs.

Figure 34A:
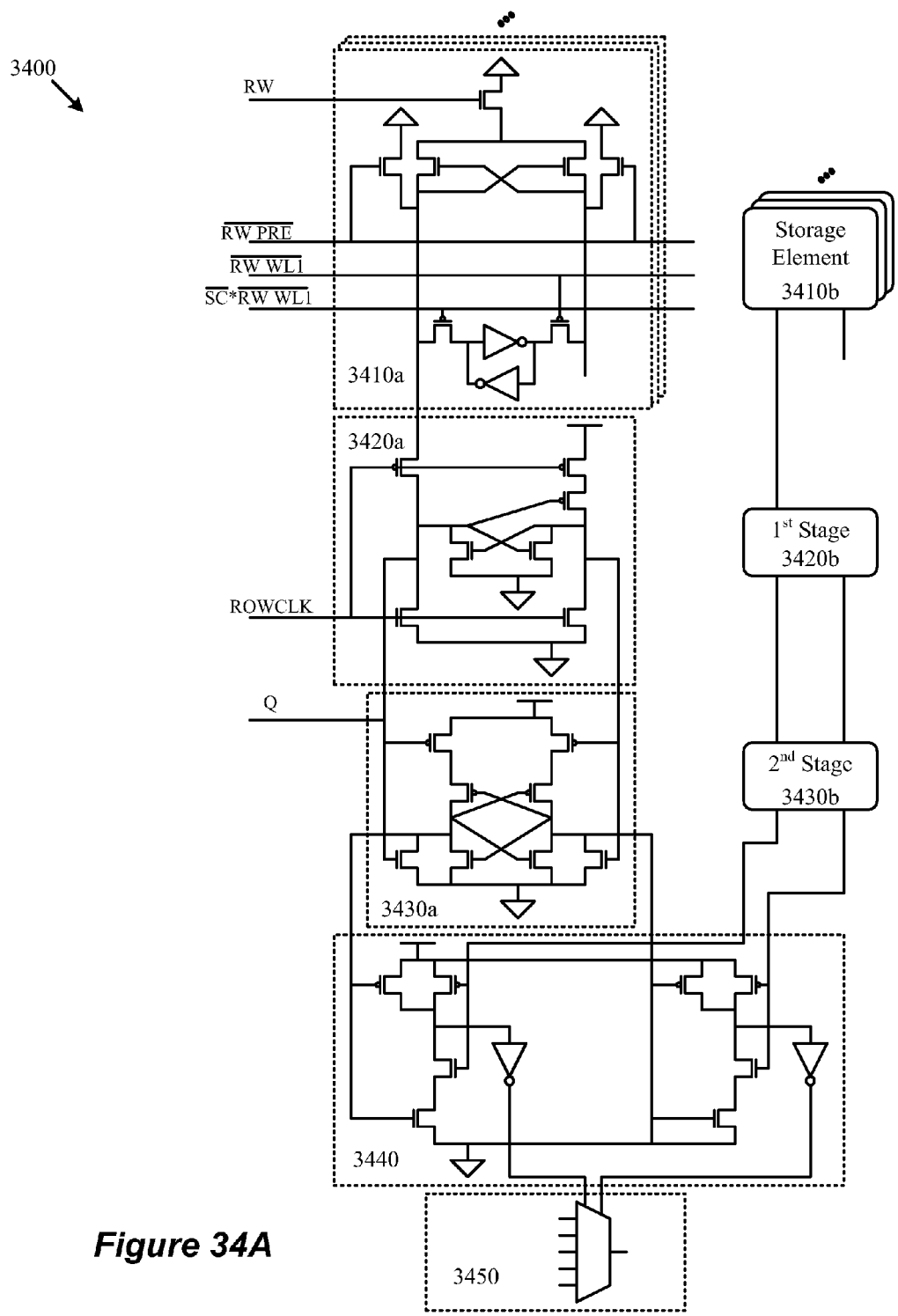
FIG. 34A illustrates a no-precharge, single-ended read storage cell, a pulsed-latch as a first stage, an SR latch as a second stage, and a decoder as the context switcher of some embodiments.

6. Single Port Storage with Single-Ended Read without Bit Line Pre-Charge, Sense Latch Followed by SR Latch Driving Decoder FIG. 34A illustrates another exemplary embodiment of a partial context switcher 3400 using several of the circuit blocks described above. As shown, the context switcher includes two columns of storage elements 3410a and 3410b, two single-ended pulse latches 3420a and 3420b, two SR latches 3430a and 3430b, a half decoder 3440 and a set of configurable circuits 3450.

As shown in the figure, the context switcher 3400 captures data from the single-port pre-charge storage elements 3410a and 3410b. The operation of the storage elements was described in detail above in reference to FIGS. 10A and 10B. The context switcher 3400 includes two pre-sense latches 3420a and 3420b that capture the data from BL after a pre-charge operation. The operation of the pre-sense latches was described in detail above in reference to FIG. 24. The complementary outputs of the pre-sense latches are passed to the SR second stages 3430a and 3430b. The operation of the SR second stages was described in detail above in reference to FIG. 24. The outputs of the SR second stages are passed to the decoder 3440. For clarity, only one-half of a full decoder is shown. The operation of the decoder is described in detail above in reference to FIG. 25A, 25B, or 25C. The outputs of the decoder drive the configurable circuits of the IC 3450.

Figure 34B:
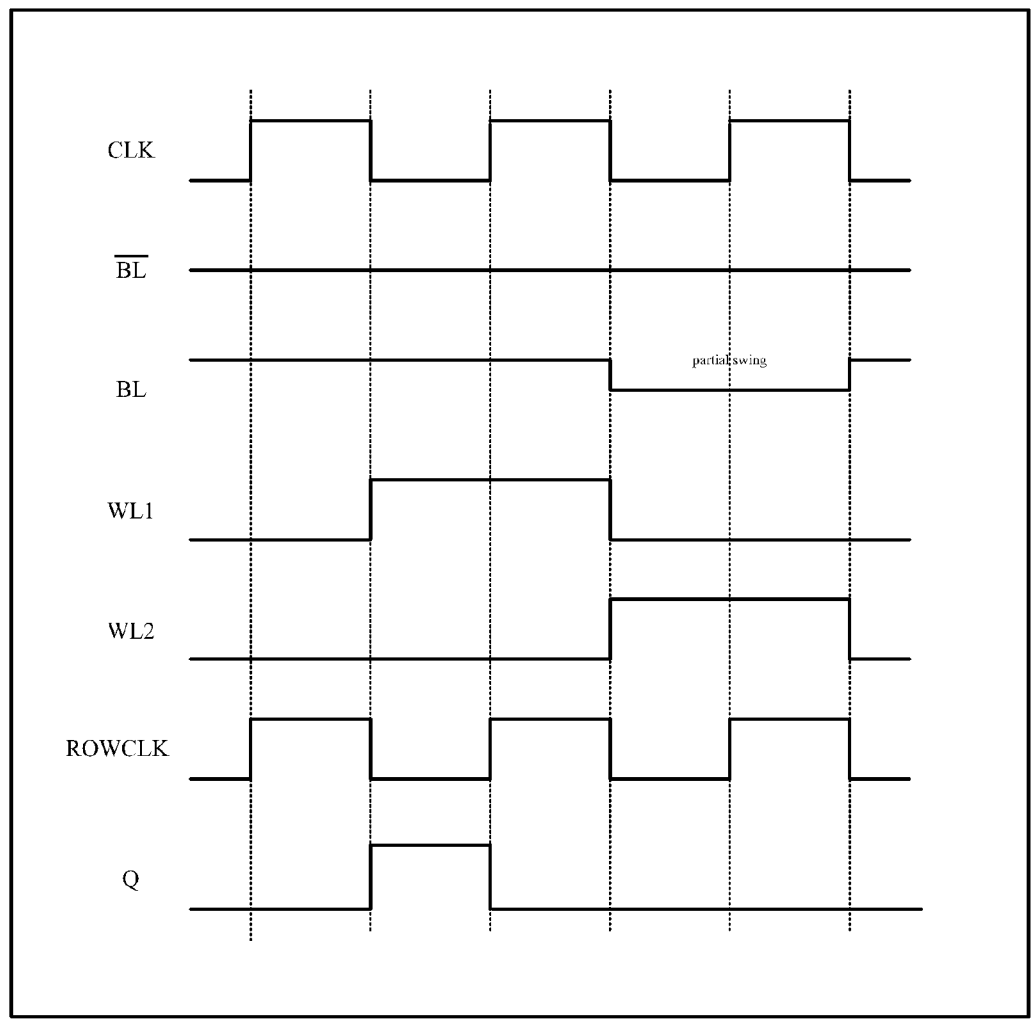
FIG. 34B illustrates a timing diagram for the circuit of FIG. 34A of some embodiments.

The operation of the complete circuit is described by the partial timing diagram of FIG. 34B. Note that the timing diagram is for illustrative purposes and is not meant to accurately reflect setup time, slew rates, or sample-and-hold times, etc. As shown in the diagram, the single-ended first stage embodiment of 3400 does not use BL's complement, so that signal is at the pre-charge voltage during the operation of this circuit. As shown in the diagram, when WL1 is driven to logic high, the nmos pass transistors of the storage element 3410a are turned on, and the bit lines from storage element 3410a may be evaluated (i.e. read) by the subsequent circuitry (in this example, WL1 is used for simplicity, whereas the actual signal is SC*RW WL). In the example shown, BL is high during the WL1 evaluation, so there is no change to the value held in latch 3430a at node Q. When WL2 is activated (reading the data held in storage element 3410b), the BL signal goes to logic low in this example, where it is read by the first stage 3420b and subsequently passed to the second stage 3430b. The second stage then latches the value while it is read by the decoder 3440. The decoder in turn decodes the data placed at its inputs and provides its decoded outputs to the configurable circuits 3450.

One of ordinary skill in the art will recognize that the context switcher 3400 may be implemented using different embodiments. For example, the second stages 3430a and 3430b could be NAND-based SR latches instead of NOR-gate based.

Figure 35A:
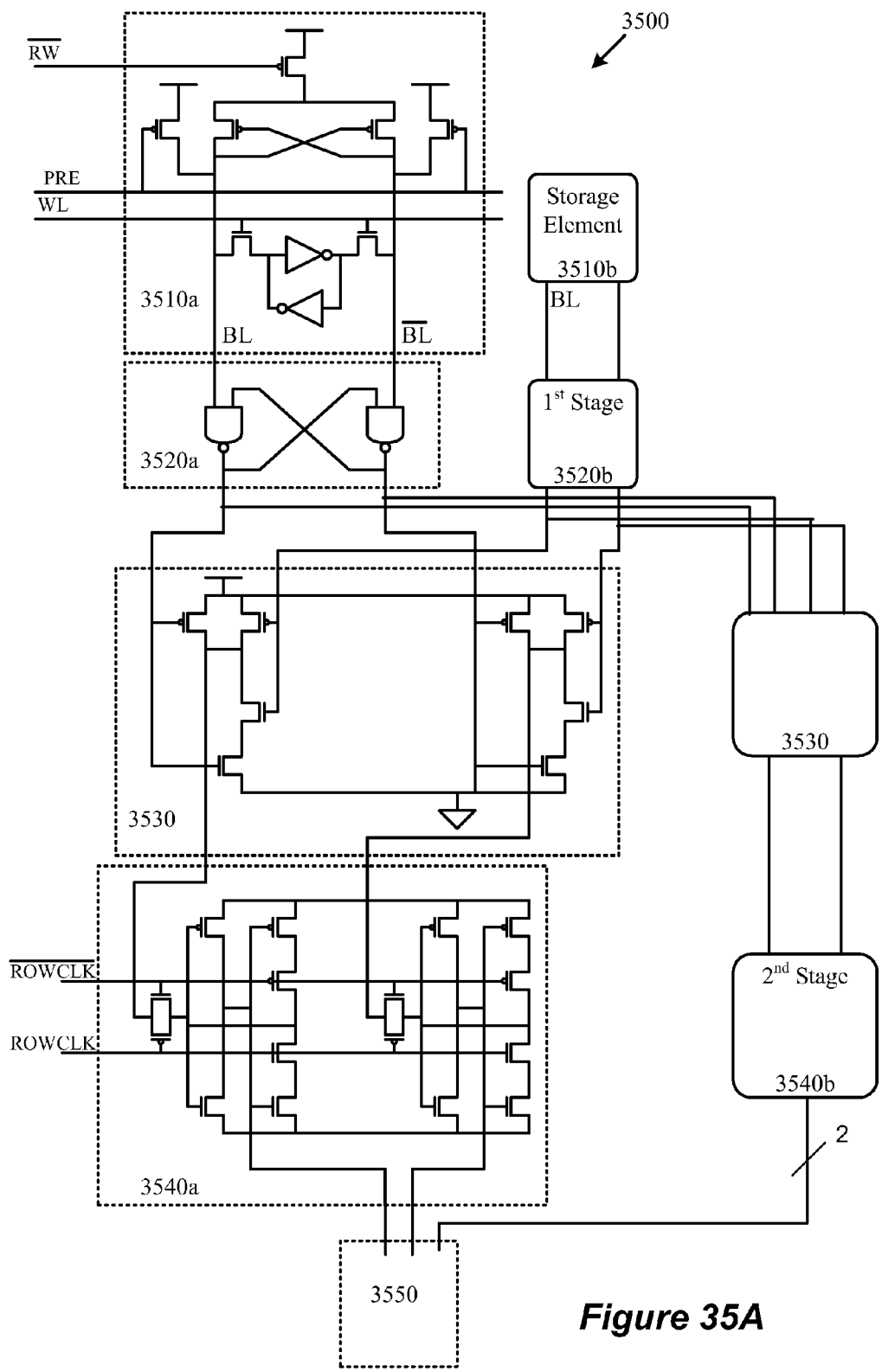
FIG. 35A illustrates a pre-charged storage cell, an SR latch as a first stage, a decoder, and two second stages as the context switcher of some embodiments.

7. Single Port Storage with Differential Read with Bit Line Pre-Charge, SR Latch First Stage Followed by Decoder Driving Transparent Latch Second Stage FIG. 35A illustrates another exemplary embodiment of a partial context switcher 3500 using several of the circuit blocks described above. As shown in the figure, this embodiment includes two storage elements 3510a and 3510b, two SR latches, 3520a and 3520b, a decoder 3530, two transparent latches as the second stages 3540a and 3540b, and a set of configurable circuits 3550.

The components and operation of this embodiment of the storage elements 3510a and 3510b are described above in reference to FIGS. 7A and 7B. The components and operation of this embodiment of the SR latches 3520a and 3520b are described above in reference to FIG. 11. The components and operation of this embodiment of the transparent latches 3540a and 3540b are described above in reference to FIGS. 16A and 16B, while the components and operation of this embodiment of the decoder 3530 are described in reference to FIG. 25A, 25B, or 25C.

As shown in FIG. 35A, the storage elements 3510a and 3510b provide differential bit lines signals (BL and its complement) to the pair of SR latches 3520a and 3520b acting as the first stage of the context switcher, where they are latched and held for the decoder 3530. The decoder is a 2:4 decoder as described above in reference to FIG. 25A, so the decoder 3530 operates on a pair of complementary input bits at a time (i.e. the decoder processes signals from both 3520a and 3520b at the same time. The decoder 3530 provides its decoded outputs to the transparent latches 3540a and 3540b, which form the second stage of the context switcher in this example. The transparent latches 3540a and 3540b then provide their outputs to the configurable circuits of the IC 3550.

One of ordinary skill in the art will recognize that the context switcher 3500 may be implemented using different embodiments. For example, the second stages 3540a and 3540b could receive their inputs from the first stages 3510a and 3510b and provide their outputs to the decoder 3530.

Figure 35B:
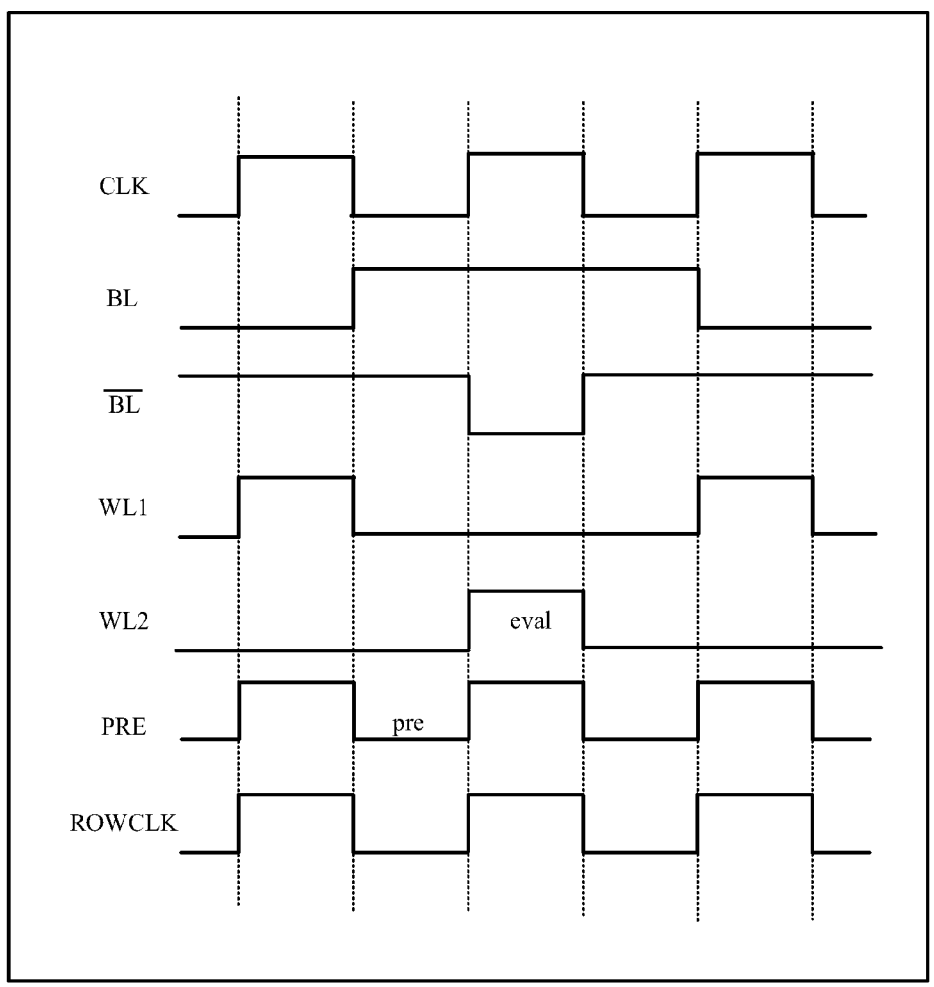
FIG. 35B illustrates a timing diagram for the circuit of FIG. 35A of some embodiments.

FIG. 35B illustrates a partial timing diagram for the partial context switcher 3500. As shown, the diagram includes the CLK, BL, BL's complement, WL1, WL2, PRECHARGE, and ROWCLK signals. The timing diagram shows the operation of the context switcher 3500 as described above in reference to FIG. 35A.

IV. Architecture of IC with Configurable Circuits

Figure 36:
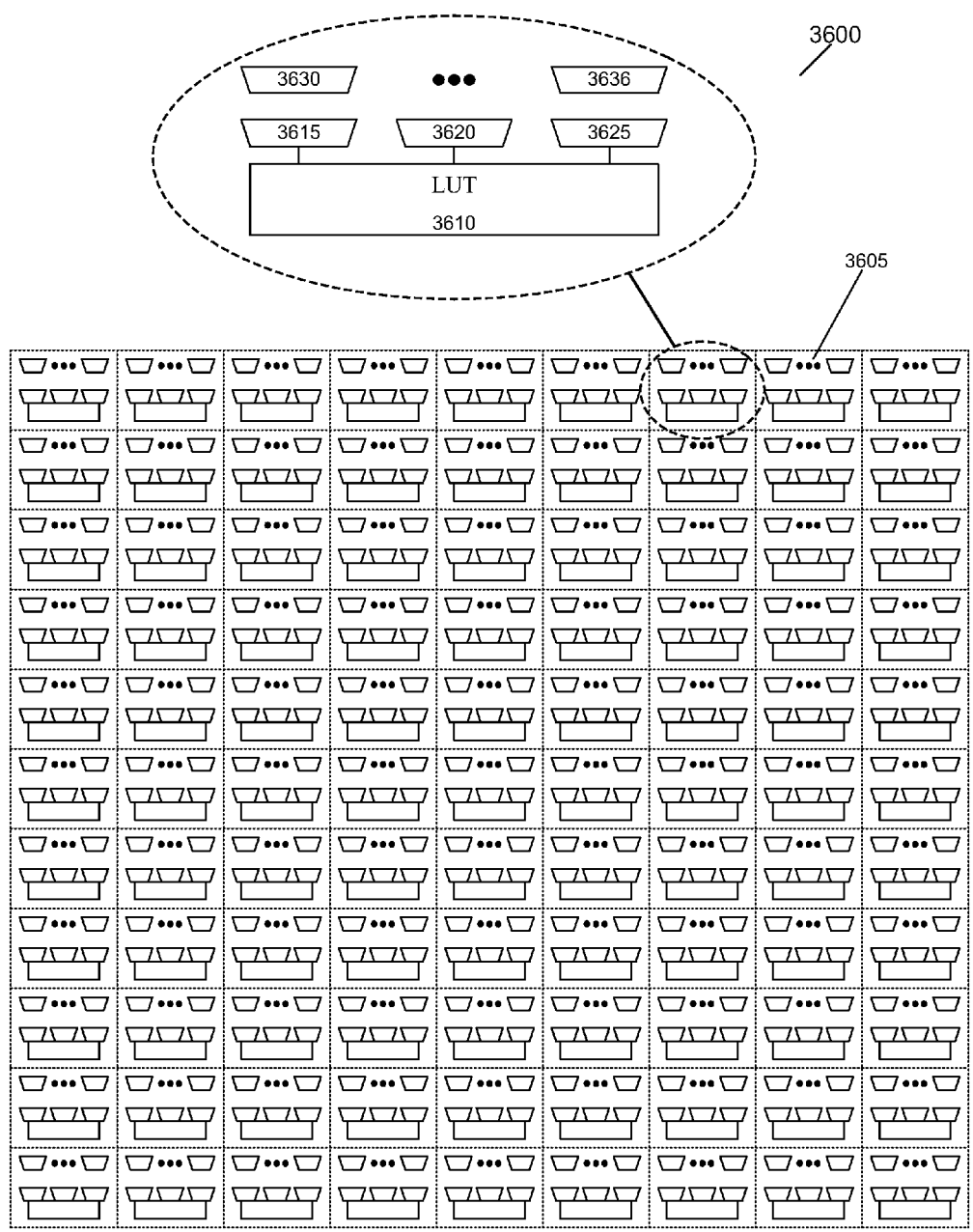
FIG. 36 illustrates a tile structure alignment of configurable circuits of some embodiments.
Figure 37:
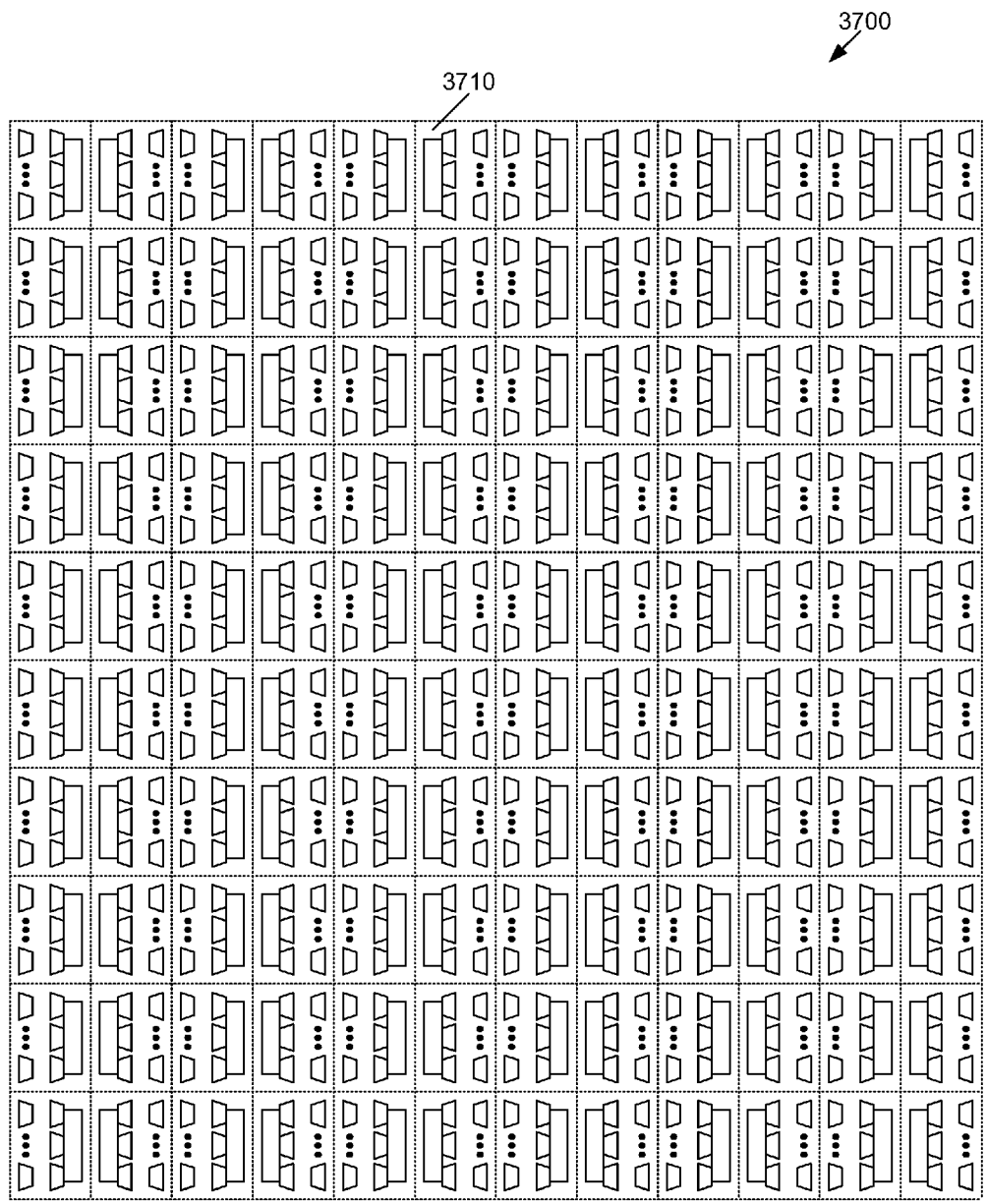
FIG. 37 illustrates an alternately arranged tile structure alignment of configurable circuits of some embodiments.
Figure 38:
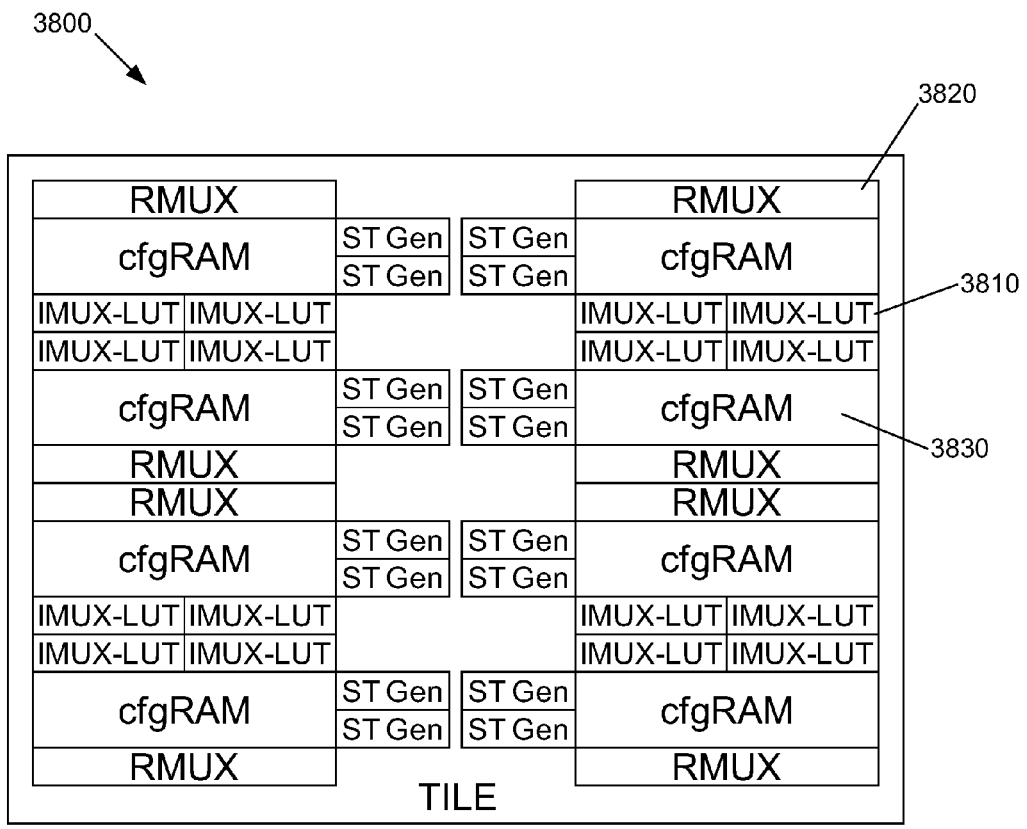
FIG. 38 illustrates an alternative tile structure of some embodiments.

In some embodiments, the configurable circuits of the IC might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 36-38 illustrate several configurable circuit arrangements/architectures that include the invention's circuits. One such architecture is illustrated in FIG. 36.

The architecture of FIG. 36 is formed by numerous configurable tiles 3605 that are arranged in an array with multiple rows and columns. In the example of FIG. 36, each configurable tile includes a configurable three-input LUT 3610, three configurable input-select multiplexers 3615, 3620, and 3625, and two configurable routing multiplexers 3630 and 3635. Different embodiments have different numbers of configurable interconnect circuits 3630. For instance, some embodiments may have eight configurable interconnect circuits while others may have more or less such circuits. For each configurable circuit, the configurable IC 3600 includes a set of storage elements (e.g., a set of SRAM cells) for storing a set of configuration data bits.

In some embodiments, the logic circuits are look-up tables (LUTs) while the interconnect circuits are multiplexers. Also, in some embodiments, the LUTs and the multiplexers are sub-cycle reconfigurable circuits. In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In FIG. 36, an input-select multiplexer (also referred to as an IMUX) 3615 is an interconnect circuit associated with the LUT 3610 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as HMUXs) capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 36, a routing multiplexer (also referred to as an RMUX) 3630 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 36 form the routing fabric along with the wire-segments that connect to the RMUXs, and the vias that connect to these wire segments and/or to the RMUXs. In some embodiments, the routing fabric further includes buffers for achieving one or more objectives (e.g., maintain the signal strength, reduce noise, alter signal delay, etc.) with respect to the signals passing along the wire segments.

Various wiring architectures can be used to connect the RMUXs, IMUXs, and LUTs. Several examples of the wire connection scheme are described in the above mentioned U.S. patent application Ser. No. 11/082,193.

Several embodiments are described above by reference to a "direct connection." In some embodiments, a direct connection is established through a combination of one or more wire segments, and potentially one or more vias, but no intervening circuit. In some embodiments, a direct connection might however include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion above, two circuits might be described as directly connected. This means that the circuits are connected through a direction connection. Also, some connections are referred to above as configurable connections and some circuits are described as configurably connected. Such references signifies that the circuits are connected through a configurable interconnect circuit (such as a configurable routing circuit).

In some embodiments, the examples illustrated in FIG. 36 represent the actual physical architecture of a configurable IC. However, in other embodiments, the examples illustrated in FIG. 36 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the ICs physical architecture appears quite different from its topological architecture. For example, FIG. 37 provides one possible physical architecture of the configurable IC 3600 illustrated in FIG. 36.

Having the aligned tile layout with the same circuit elements of FIG. 37 simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such layout further simplifies the design and fabrication processes as it further simplifies the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 38 illustrates an alternative tile structure that is used in some embodiments. This tile 3800 has four sets 3810 of 4-aligned LUTs along with their associated IMUXs. It also includes six sets 3820 of RMUXs and five banks 3830 of configuration RAM storage. Each 4-aligned LUT tile shares one carry chain. One example of which is described in the above mentioned U.S. patent application Ser. No. 11/082,193. One of ordinary skill in the art would appreciate that other organizations of LUT tiles may also be used in conjunction with the invention and that these organizations might have fewer or additional tiles.

Figure 39:
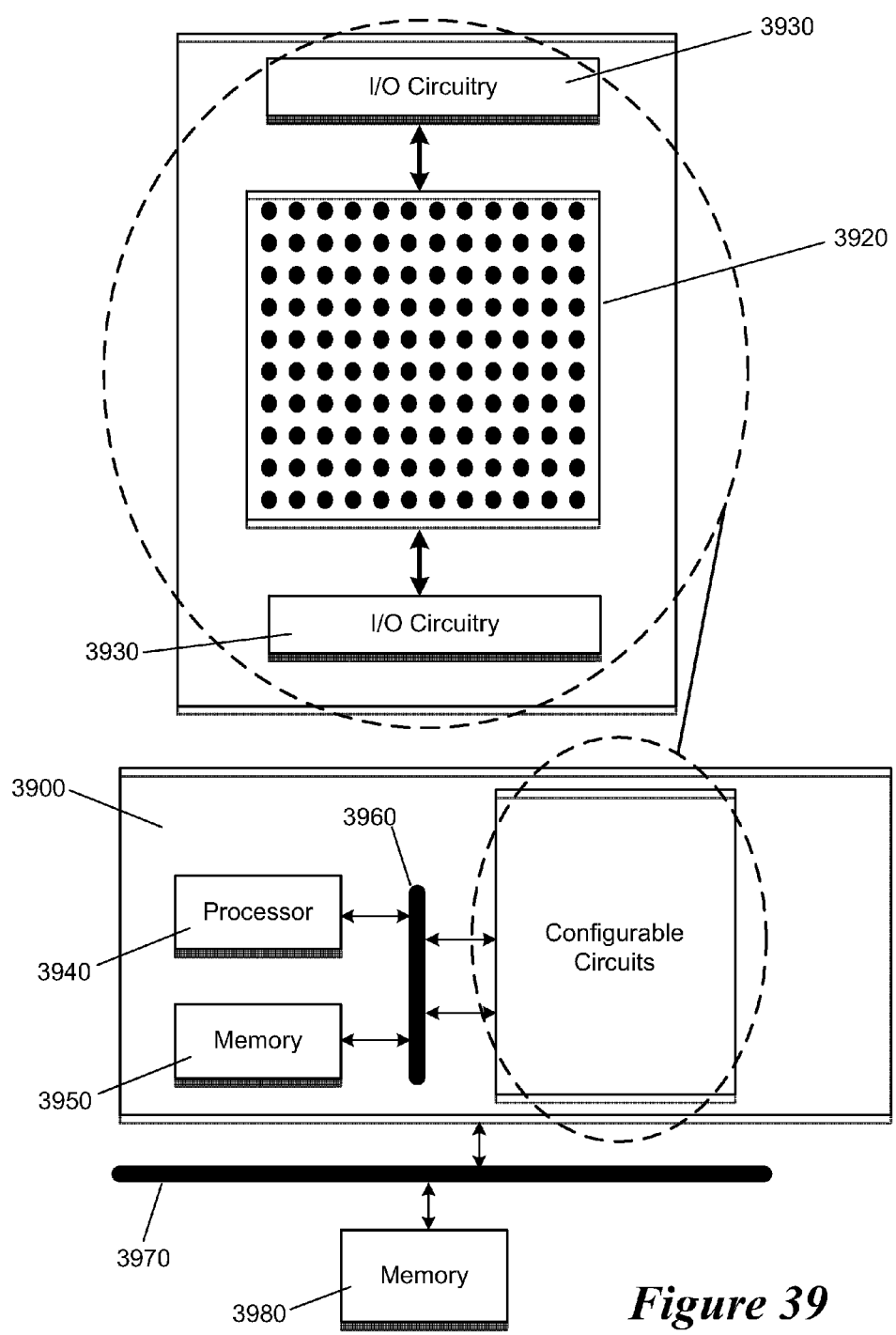
FIG. 39 illustrates a system on a chip IC of some embodiments.

A configurable IC of the invention can also include circuits other than a configurable circuit arrangement and I/O circuitry. For instance, FIG. 39 illustrates a system on chip (SOC) embodiment of a configurable IC 3900. This IC has a configurable block 3910, which includes a configurable circuit arrangement 3920 and I/O circuitry 3930 for this arrangement. It also includes a processor 3940 outside of the configurable circuit arrangement, a memory 3950, and a bus 3960, which conceptually represents all conductive paths between the processor 3940, memory 3950, and the configurable block 3910. As shown in FIG. 39, the IC 3900 couples to a bus 3970, which communicatively couples the IC to other circuits, such as an off-chip memory 3980. Bus 3970 conceptually represents all conductive paths between the system components.

This processor 3940 can read and write instructions and/or data from an on-chip memory 3950 or an offchip memory 3980. The offchip memory 3980 can be non-volatile (e.g., flash memory) that stores the configuration data, which is then loaded onto the IC at power up. The on-chip memory 3950 can also be non-volatile to store the configuration data to load onto the IC at power up. The processor 3940 can also communicate with the configurable block 3910 through memory 3950 and/or 3970 through buses 3910 and/or 3930. Similarly, the configurable block can retrieve data from and supply data to memories 3920 and 3925 through buses 3910 and 3970.

Figure 40:
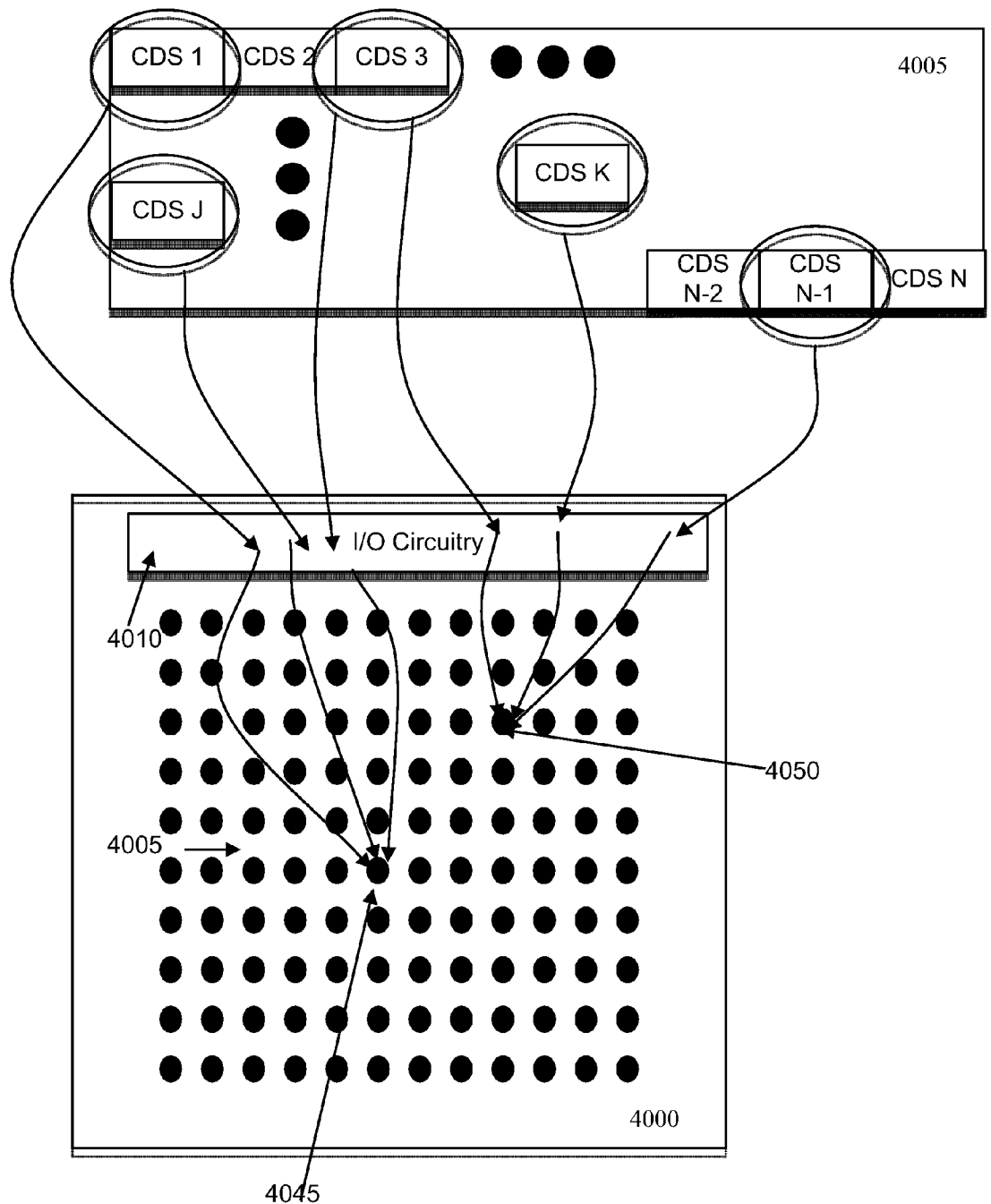
FIG. 40 illustrates the transfer of configuration data from the data pool to the configurable circuits of the IC of some embodiments.

The data also includes in some embodiments configuration data that configure the nodes to perform particular operations. FIG. 40 illustrates a more detailed example of this. Specifically, this figure illustrates a configuration data pool 4005 for the configurable IC 3900. This pool includes N configuration data sets (CDS). As shown in FIG. 40, the input/output circuitry 3910 of the configurable IC 3900 routes different configuration data sets to different configurable nodes of the IC 3900. For instance, FIG. 40 illustrates configurable node 4045 receiving configuration data sets 1, 3, and J through the I/O circuitry, while configurable node 4050 receives configuration data sets 3, K, and N−1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 41:
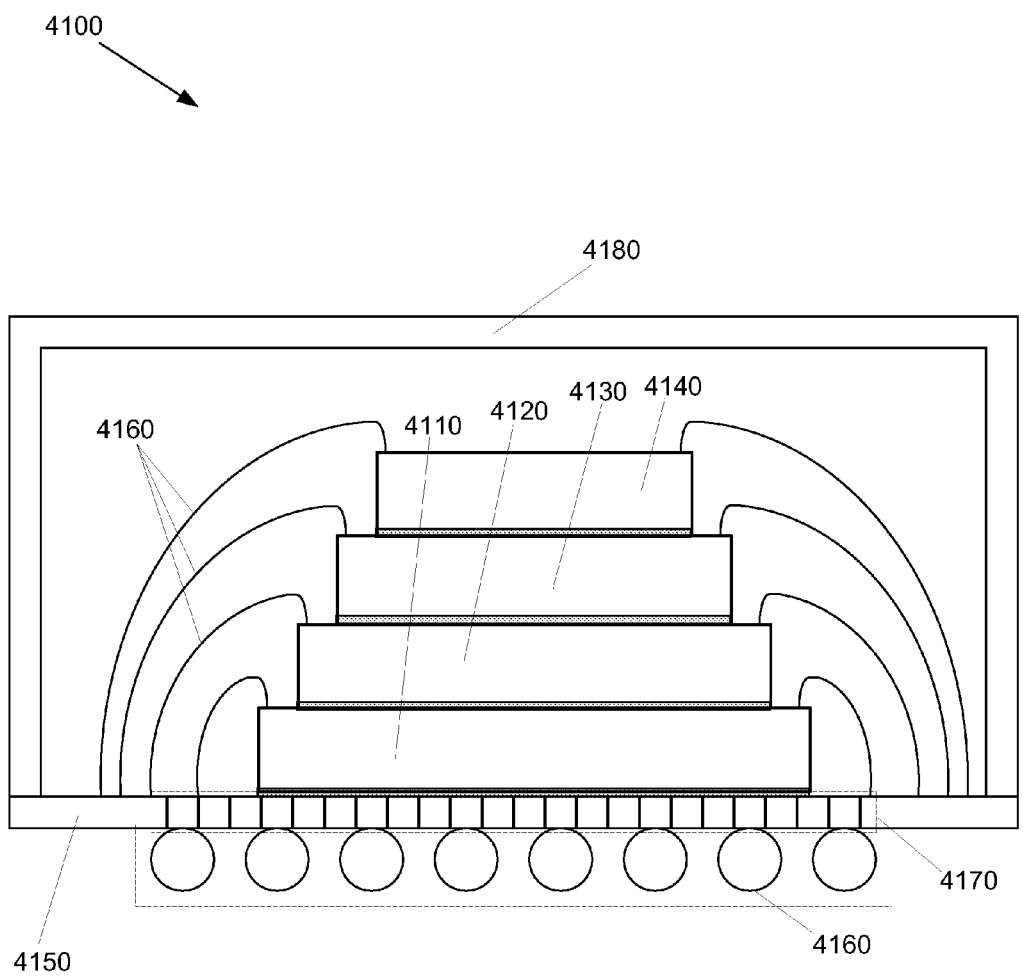
FIG. 41 illustrates a system in a package IC of some embodiments.

Instead of, or in conjunction with, the SOC embodiment for a configurable IC, some embodiments might employ a system in package (SIP) embodiment for a configurable IC. FIG. 41 illustrates one such SIP 4100. As shown in this figure, SIP 4100 includes four ICs 4110, 4120, 4130, and 4140 that are stacked on top of each other on a substrate 4150. At least one of these ICs is a configurable IC that includes a configurable block, such as the configurable block 4010 of FIG. 40. Other ICs might be other circuits, such as processors, memory, etc.

As shown in FIG. 41, the IC communicatively connects to the substrate 4150 (e.g., through wire bondings 4160). These wire bondings allow the ICs 4110-4140 to communicate with each other without having to go outside of the SIP 4100. In some embodiments, the ICs 4110-4140 might be directly wire-bonded to each other in order to facilitate communication between these ICs. Instead of, or in conjunction with the wire bondings, some embodiments might use other mechanisms to communicatively couple the ICs 4110-4140 to each other.

As further shown in FIG. 41, the SIP includes a ball grid array ("BGA") 4160 and a set of vias 4170. The BGA 4160 is a set of solder balls that allows the SIP 4100 to be attached to a printed circuit board ("PCB"). Each via connects a solder ball in the BGA 4160 on the bottom of the substrate 4150, to a conductor on the top of the substrate.

The conductors on the top of the substrate 4150 are electrically coupled to the ICs 4110-4140 through the wire bondings. Accordingly, the ICs 4110-4140 can send and receive signals to and from circuits outside of the SIP 4100 through the wire bondings, the conductors on the top of the substrate 4150, the set of vias 4170, and the BGA 4160. Instead of a BGA, other embodiments might employ other structures (e.g., a pin grid array) to connect a SIP to circuits outside of the SIP. As shown in FIG. 41, a housing 4180 encapsulates the substrate 4150, the BGA 4160, the set of vias 4170, the ICs 4110-4140, the wire bondings to form the SIP 4100. This and other SIP structures are further described in U.S. patent application Ser. No. 11/081,820 entitled "Programmable System In Package".

Many of the above-described components implement some or all the above described functionality through software processes that are specified as a set of instructions recorded on a machine readable medium (also referred to as computer readable medium). When these instructions are executed by one or more computational element(s) (such as processors or other computational elements like application specific ICs (ASICs) and field programmable gate arrays (FPGAs)), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 42:
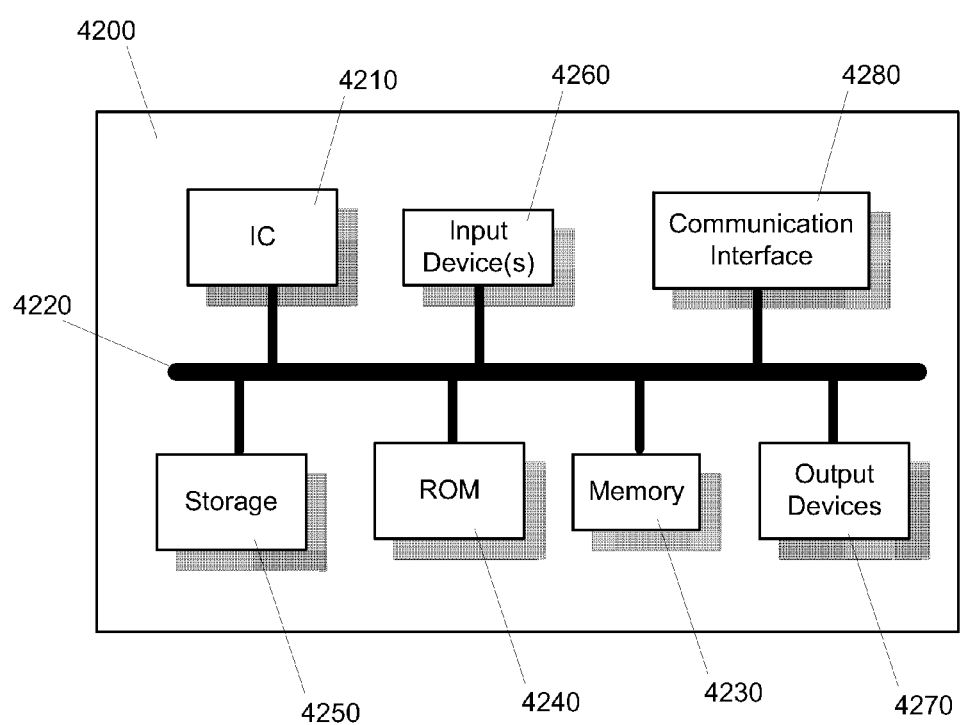
FIG. 42 illustrates a computer system of some embodiments.

FIG. 42 illustrates a computer system with which some embodiments of the invention are implemented. Such a computer system includes various types of computer readable mediums and interfaces for various other types of computer readable mediums. Computer system 4200 includes a bus 4205, a processor 4210, a system memory 4215, a read-only memory 4220, a permanent storage device 4225, input devices 4230, and output devices 4235.

The bus 4205 collectively represents all system, peripheral, and chipset buses that communicatively connect the numerous internal devices of the computer system 4200. For instance, the bus 4205 communicatively connects the processor 4210 with the read-only memory 4220, the system memory 4215, and the permanent storage device 4225. From these various memory units, the processor 4210 retrieves instructions to execute and data to process in order to execute the processes of the invention.

The read-only-memory (ROM) 4220 stores static data and instructions that are needed by the processor 4210 and other modules of the computer system. The permanent storage device 4225, on the other hand, is a read-and-write memory device. This device is a non-volatile memory unit that stores instructions and data even when the computer system 4200 is off. Some embodiments of the invention use a mass-storage device (such as a magnetic or optical disk and its corresponding disk drive) as the permanent storage device 4225.

Other embodiments use a removable storage device (such as a floppy disk, flash drive, or ZIP® disk, and its corresponding disk drive) as the permanent storage device. Like the permanent storage device 4225, the system memory 4215 is a read-and-write memory device. However, unlike storage device 4225, the system memory is a volatile read-and-write memory, such a random access memory (RAM). The system memory stores some of the instructions and data that the processor needs at runtime. In some embodiments, the invention's processes are stored in the system memory 4215, the permanent storage device 4225, and/or the read-only memory 4220.

The bus 4205 also connects to the input and output devices 4230 and 4235. The input devices enable the user to communicate information and select commands to the computer system. The input devices 4230 include alphanumeric keyboards and pointing devices (also called "cursor control devices"). The input devices 4230 also include audio input devices (e.g., microphones, MIDI musical instruments, etc.). The output devices 4235 display images generated by the computer system. For instance, these devices display a GUI. The output devices include printers and display devices, such as cathode ray tubes (CRT) or liquid crystal displays (LCD).

Finally, as shown in FIG. 42, bus 4205 also couples computer 4200 to a network 4265 through a network adapter (not shown). In this manner, the computer can be a part of a network of computers (such as a local area network ("LAN"), a wide area network ("WAN"), or an Intranet, or a network of networks, such as the internet. For example, the computer 4200 may be coupled to a web server (network 4265) so that a web browser executing on the computer 4200 can interact with the web server as a user interacts with a GUI that operates in the web browser.

As mentioned above, the computer system 4200 may include one or more of a variety of different computer-readable media. Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ZIP® disks, read-only and recordable blu-ray discs, any other optical or magnetic media, and floppy disks.

It should be recognized by one of ordinary skill in the art that any or all of the components of computer system 4200 may be used in conjunction with the invention. Moreover, one of ordinary skill in the art will appreciate that any other system configuration may also be used in conjunction with the invention or components of the invention.

V. Encoding Configuration Data

Figure 43:
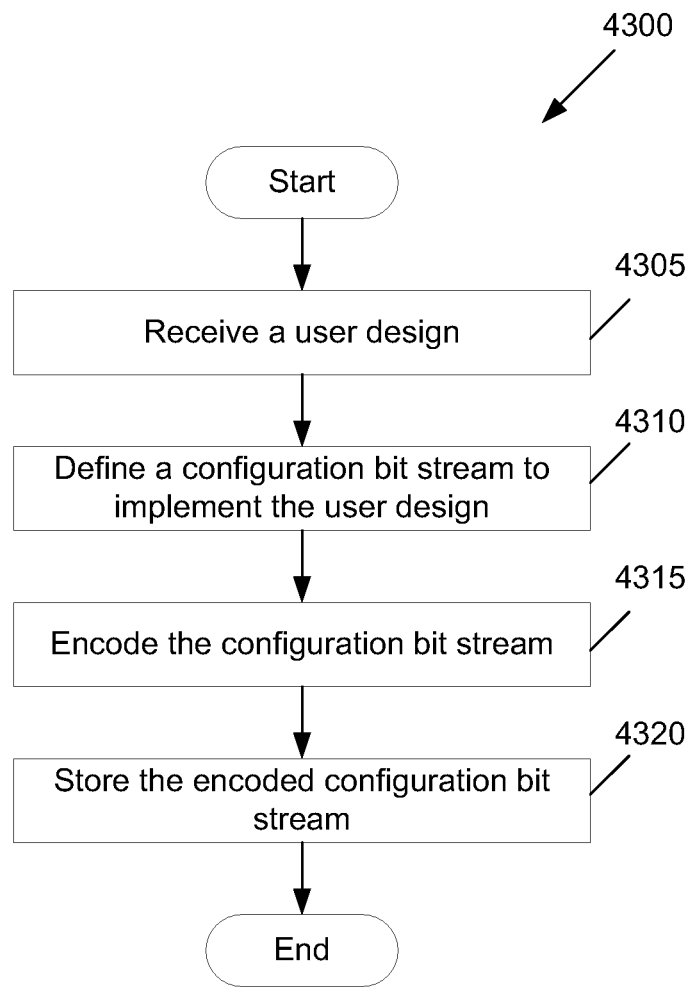
FIG. 43 conceptually illustrates a process that generates configuration data for an IC that includes configurable circuits in some embodiments.

FIG. 43 conceptually illustrates a process 4300 that in some embodiments generates configuration data for an IC that includes configurable circuits. As shown, the process receives (at 4305) a user design. The process defines (at 4310) a configuration bit stream to implement the user design at least partially with the configurable circuits of the IC. In some embodiments, the configuration bit stream is defined (at 4310) by performing several types of design automation processes. Examples of such processes include synthesis, placement, and routing, etc.

Next, at 4315, the process encodes (i.e., compresses) the configuration bit stream. Different embodiments encode configuration bit stream differently. Some embodiments encode configuration bit stream as configuration data is generated for each configurable circuit and each configuration cycle. Finally, at 4320, the process stores the encoded configuration bit stream in a data storage. This configuration bit stream can then be stored in a memory that is within the same IC, on the same board as the IC, or in the same device as the IC. In some embodiments, the memory is a non-volatile memory (e.g., flash memory) from which the configuration data is later on loaded at power up within the configuration storage elements of the configurable circuits of the IC.

Although one example of the encoding process 4300 is described above, one of ordinary skill will realize that the encoding process might be implemented differently in other embodiments. For instance, different embodiments encode configuration bit stream differently. In the example illustrated in FIG. 43, the configuration bit stream is encoded after all configuration bit stream is defined for the entire design. Other embodiments, however, might encode the configuration data while the configuration bit stream is being defined for different parts of the design. For example, some embodiments encode the configuration bit stream by performing an encoding operation after defining each configuration data set for each configurable circuit. Other embodiments perform the encoding operation after each design automation operation is performed (e.g., encode the bit stream once after placement, once after routing, etc.). Yet other embodiments specify encoded configuration values (e.g., encoded 2 bit values instead of non-encoded 4 bit values) from the start as part of identifying configuration data, without first generating unencoded configuration data values.

Some embodiments implement process 4300 using electronic components such as microprocessor and memory that store computer program instructions in a machine-readable or computer-readable medium. Examples of machine-readable media or computer-readable media include, but are not limited to magnetic media such as hard disks, memory modules, magnetic tape, optical media such as CD-ROMs and holographic devices, magneto-optical media such as optical disks, hardware devices such as application specific integrated circuits (ASICS) that are specially configured to store and execute program code, programmable logic devices (PLD), ROM, and RAM devices. Examples of computer program or computer code include machine code, such as code produced by a compiler, and files including higher-level code that are executed by a computer, an electronic component, or a microprocessor using an interpreter.

Figure 44:
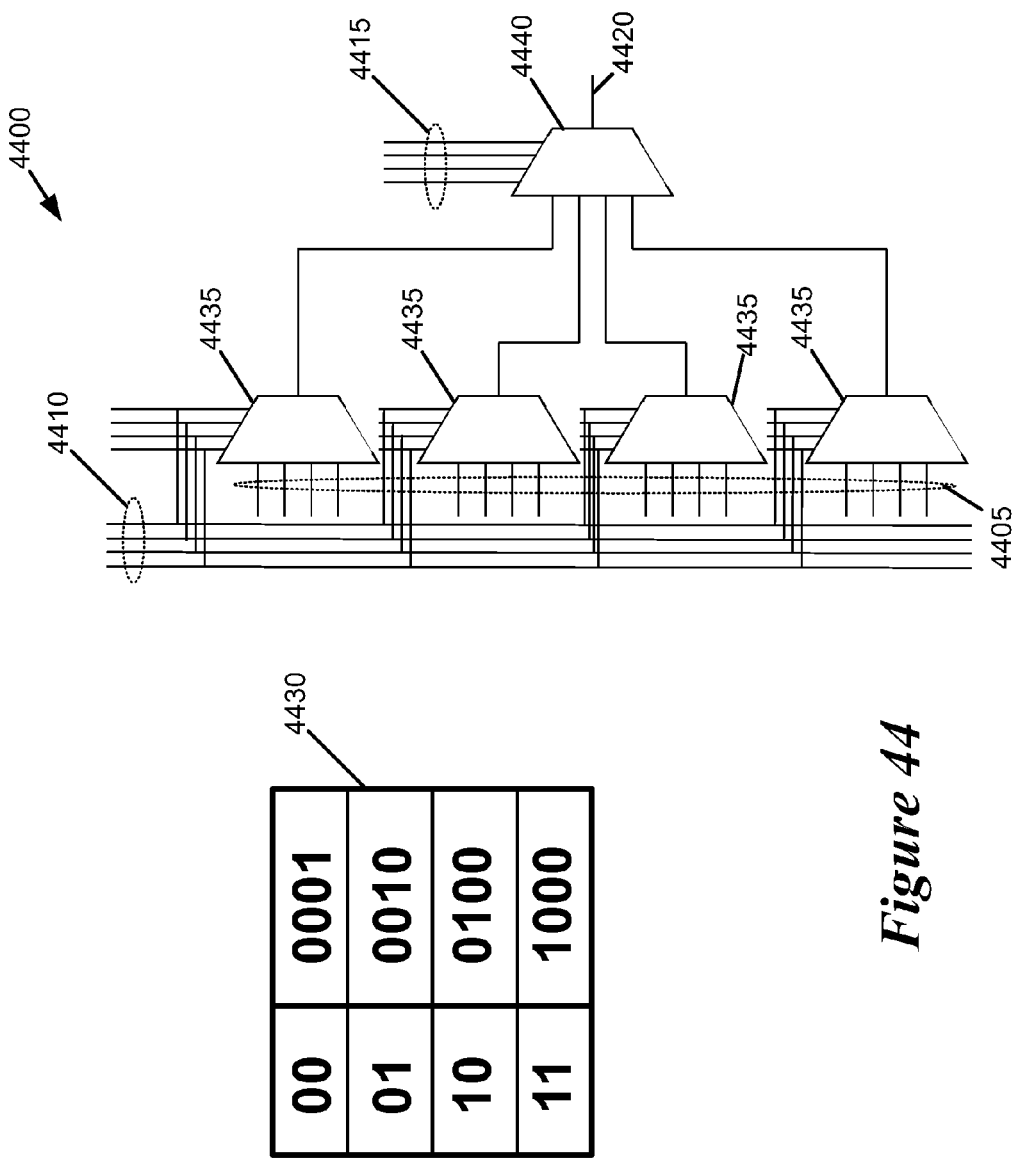
FIG. 44 illustrates an example of a circuit used to select one bit of configuration data for a configurable circuit during runtime of an IC in some embodiments.

FIG. 44 illustrates an example of a configurable circuit 4400 of some embodiments. As shown, the configurable circuit is implemented as a 16 to 1 multiplexer. As shown, the 16 to 1 multiplexer is implemented using two stages of 4 to 1 multiplexers. The 16 to 1 multiplexer 4400 receives 16 input values 4405, two sets 4410-4415 of select lines, and generates one output 4420. There are four multiplexers 4435 in stage one and one multiplexer 4440 in stage two of the 16 to 1 multiplexer 4400. The configurable circuit 4400 is configured by supplying different sets of configuration data at the select lines 4410-4415 during each configuration cycle.

Some embodiments use one hot values for driving the select lines. As shown, the select lines of each 4 to 1 multiplexer 4425 use four bits instead of two bits that is typically needed for a 4 to 1 multiplexer. Table 4430 shows one implementation of a logic table that uses one hot values for the select lines. A value of logic one on each select line selects a corresponding input line to connect to the output of the multiplexer.

Figure 45:
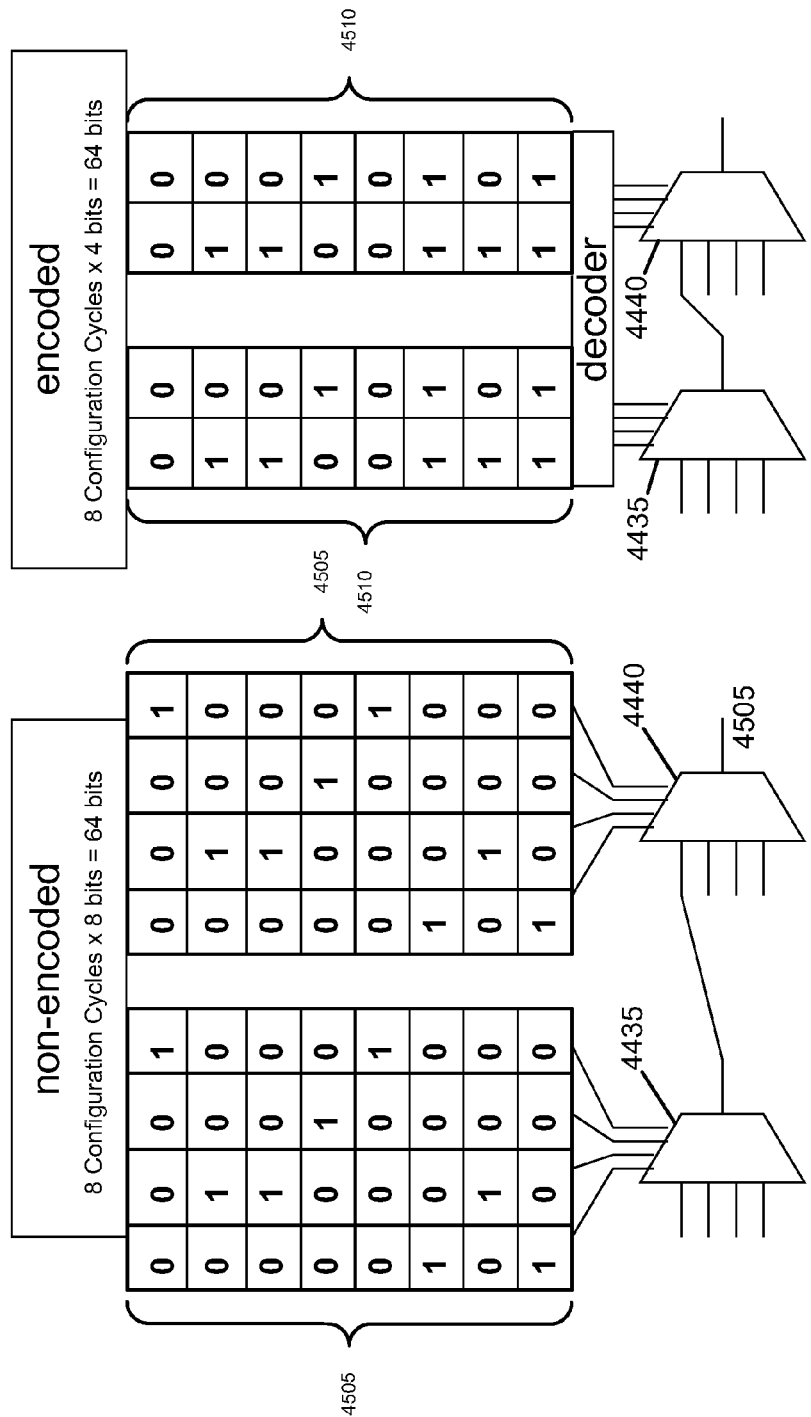
FIG. 45 conceptually illustrates how the configuration bit stream is encoded for an IC design that has eight reconfiguration cycles in some embodiments.

FIG. 45 conceptually illustrates how the configuration bit stream is encoded for the configurable circuit 4400 in an IC design that has eight configuration cycles. As shown, the input select lines of each stage one multiplexer 4435 and the stage two multiplexer 4440 require four non-encoded bits to select one of the 16 input values 4405 to be connected to the output 4505 of the 16 to 1 multiplexer. Therefore, when the configuration bit stream is not encoded, 64 bits of data (i.e., 8 bits for each one of the eight configuration cycles) have to be stored in order to configure the configurable circuit during eight configuration cycles.

On the other hand, when the configuration bit stream is encoded, only 32 bits (4 bits for each one of the eight configuration cycles) is stored to configure the configurable circuit during eight configuration cycles. The encoded bit stream 4510 is decoded by a decoder 4515 to generate the configuration data required to configure the configurable circuit during each configuration cycle. An example of decoder 4515 is described in relation with FIG. 25, above. Encoding configuration bit stream save the amount of storage required to store the configuration data at a slight overhead of decoding the encoded values during runtime of the IC.

Although several examples of the encoding operation were described above, one of ordinary skill will realize that the encoding operations might be implemented differently in other embodiments. For instance, in the embodiments described above, each configuration data set is encoded based on its own value. Other embodiments, however, might encode configuration bit stream across multiple configurable circuits and/or multiple configuration cycles. Also, although several examples were given for encoding configuration bit stream, there is no need to do any encoding of the configuration bit stream. Therefore, some embodiments are implemented without encoding (and subsequent runtime decoding) of configuration data.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. An integrated circuit ("IC") comprising:
    a configurable circuit for configurably performing one of a plurality of operations based on configuration data;
    a plurality of storage circuits for storing a plurality of configuration data sets for the configurable circuit; and
    an interconnect circuit for switchably connecting the configurable circuit to different subsets of the plurality of storage circuits to receive different subsets of the plurality of configuration data sets, said interconnect circuit comprising a set of latches for temporarily storing configuration data sets.

2. The integrated circuit of claim 1, wherein the set of latches is further for receiving a given subset of configuration data sets of the plurality of configuration data sets from a given subset of storage circuits of the plurality of storage circuits and temporarily storing the received given subset of configuration data sets before providing the received given subset of configuration data sets to the configurable circuit.

3. The integrated circuit of claim 1, wherein the set of latches is further (i) for receiving the different configuration data subsets from the different subsets of storage circuits at different instances in time and (ii) for temporarily storing each of the received subsets of the plurality of configuration data sets before providing the received subsets of the plurality of configuration data sets to the configurable circuit.

4. The integrated circuit of claim 3, wherein the set of latches comprises:
    a first set of master latches and a second set of slave latches,
        said first set of master latches for receiving the different subsets of the plurality of configuration data sets from the different subsets of the plurality of storage circuits at different instances in time, and for temporarily storing the received subsets of the plurality of configuration data sets before providing the received subsets of the plurality of configuration data sets to the second set of slave latches;
    said second set of slave latches for receiving different configuration data sets from the first set of master latches at different instances in time, and for providing each received particular configuration data set to the configurable circuit.

5. The integrated circuit of claim 1, wherein each configuration data set includes only one logical bit.

6. The integrated circuit of claim 5, wherein the interconnect circuit supplies each configuration data bit as a single physical bit to the configurable circuit.

7. The integrated circuit of claim 5, wherein the interconnect circuit supplies each configuration data bit as two complementary physical bits to the configurable circuit.

8. The integrated circuit of claim 1, wherein each configuration data set includes more than one logical bit.

9. The integrated circuit of claim 1, wherein the interconnect circuit switchably connects the configurable circuit to different sets of storage circuits to receive different sets of configuration data sets, in order to allow the configurable circuit to reconfigure while the IC is operating.

10. The integrated circuit of claim 1, wherein each set of storage circuit includes only one storage circuit.

11. The integrated circuit of claim 1, wherein each set of storage circuits includes more than one storage circuits.

12. The integrated circuit of claim 1, wherein the set of latches are not clocked latches.

13. The integrated circuit of claim 1, wherein the storage operation of the set of latches is controlled by the configuration data received and stored by the set of latches.

14. The integrated circuit of claim 13, wherein the set of latches comprises a set of toggle circuits for
toggling the latches storage operation based on the configuration data received by the set of latches.

15. The integrated circuit of claim 14, wherein the set of toggle circuits are active only one changing edge of the configuration data.

16. An electronic device comprising:
an integrated circuit ("IC") comprising:
a configurable circuit for configurably performing one of a plurality of operations based on configuration data;
a plurality of storage circuits for storing a plurality of configuration data sets for the configurable circuit;
an interconnect circuit for switchably connecting the configurable circuit to different portions of the plurality of storage circuits to receive different portions of the plurality of configuration data sets, said interconnect circuit comprising a set of latches for temporarily storing configuration data sets.

17. The electronic device of claim 16, wherein the set of latches is further for receiving a configuration data set from a set of storage circuits and temporarily storing the received configuration data set before providing the received configuration data set to the configurable circuit.

18. The electronic device of claim 16, wherein the set of latches is further (i) for receiving different configuration data sets from different sets of storage circuits at different instances in time and (ii) for temporarily storing each received particular configuration data set before providing the received particular configuration data set to the configurable circuit.

19. The electronic device of claim 16, wherein each configuration data set includes only one logical bit.

* * * * *